US012660151B2

(12) United States Patent
Hsu

(10) Patent No.: US 12,660,151 B2
(45) Date of Patent: *Jun. 16, 2026

(54) 3D MEMORY CELL STRUCTURES WITH FLOATING BODIES

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 159 days.

This patent is subject to a terminal disclaimer.

(21) Appl. No.: 18/311,167

(22) Filed: May 2, 2023

(65) Prior Publication Data

US 2023/0269926 A1 Aug. 24, 2023

Related U.S. Application Data

(63) Continuation-in-part of application No. 17/937,432, filed on Sep. 30, 2022.

(Continued)

(51) Int. Cl.
*H10B 12/00* (2023.01)
*H10B 41/20* (2023.01)
(Continued)

(52) U.S. Cl.
CPC ............. *H10B 12/20* (2023.02); *H10B 12/01* (2023.02); *H10B 41/20* (2023.02); *H10B 43/10* (2023.02);
(Continued)

(58) Field of Classification Search
CPC ........ H10B 12/20; H10B 12/01; H10B 41/20; H10B 43/10; H10B 51/20; H10B 61/22;
(Continued)

(56) References Cited

U.S. PATENT DOCUMENTS 6,621,725 B2    9/2003   Ohsawa
8,513,722 B2    8/2013   Tang et al.
(Continued)

FOREIGN PATENT DOCUMENTS

CN          107017258 A   *   8/2017
JP          2013521651 A       6/2013
(Continued)

OTHER PUBLICATIONS

International Search Report, dated Dec. 9, 2024, for related International Application No. PCT/US2024/051152 (2 pages).
(Continued)

*Primary Examiner* — Duy T Nguyen
(74) *Attorney, Agent, or Firm* — INTELLECTUAL PROPERTY LAW GROUP LLP

(57) ABSTRACT

Various 3D memory cells, array architectures, and processes are disclosed. In an embodiment, a memory cell structure is provided that is formed by a process of alternately depositing multiple semiconductor layers and insulating layers to form a stack, forming vertical bit line holes through the stack using a deep trench process, and forming floating bodies in the semiconductor layers using an isotropic doping process through the bit line holes.

9 Claims, 46 Drawing Sheets

Related U.S. Application Data

(60) Provisional application No. 63/451,624, filed on Mar. 12, 2023, provisional application No. 63/444,551, filed on Feb. 9, 2023, provisional application No. 63/444,205, filed on Feb. 8, 2023, provisional application No. 63/442,528, filed on Feb. 1, 2023, provisional application No. 63/440,695, filed on Jan. 24, 2023, provisional application No. 63/418,698, filed on Oct. 24, 2022, provisional application No. 63/413,493, filed on Oct. 5, 2022, provisional application No. 63/406,255, filed on Sep. 14, 2022, provisional application No. 63/398,807, filed on Aug. 17, 2022, provisional application No. 63/295,874, filed on Jan. 1, 2022, provisional application No. 63/291,380, filed on Dec. 18, 2021, provisional application No. 63/254,841, filed on Oct. 12, 2021, provisional application No. 63/251,583, filed on Oct. 1, 2021.

(51) Int. Cl.

| | | |
|---|---|---|
| *H10B 43/10* | (2023.01) | |
| *H10B 51/20* | (2023.01) | |
| *H10B 61/00* | (2023.01) | |
| *H10B 63/10* | (2023.01) | |
| *H10N 50/85* | (2023.01) | |
| *H10N 70/00* | (2023.01) | |

(52) U.S. Cl.
CPC ............. *H10B 51/20* (2023.02); *H10B 61/22* (2023.02); *H10B 63/10* (2023.02); *H10N 50/85* (2023.02); *H10N 70/8828* (2023.02)

(58) Field of Classification Search
CPC .... H10B 63/10; H10N 50/85; H10N 70/8828; G11C 11/223; G11C 13/0004; G11C 13/0007; G11C 16/0416
USPC ........................................................ 438/151
See application file for complete search history.

(56) References Cited

U.S. PATENT DOCUMENTS

| | | | | |
|---|---|---|---|---|
| 8,902,663 | B1 | 12/2014 | Or-Bach et al. | |
| 10,418,465 | B1 | 9/2019 | Liang et al. | |
| RE48,766 | E | 10/2021 | Rhie | |
| 2008/0145994 | A1 | 6/2008 | Herner | |
| 2009/0108351 | A1 | 4/2009 | Yang et al. | |
| 2010/0019299 | A1 | 1/2010 | Bae | |
| 2010/0085813 | A1 | 4/2010 | Shino | |
| 2011/0147854 | A1* | 6/2011 | Nandakumar ....... | H10D 30/601 |
| | | | | 257/382 |
| 2012/0001249 | A1 | 1/2012 | Alsmeier et al. | |
| 2012/0217564 | A1 | 8/2012 | Tang et al. | |
| 2013/0119452 | A1 | 5/2013 | Endoh et al. | |
| 2014/0120685 | A1* | 5/2014 | Jeong ...................... | H10B 63/20 |
| | | | | 438/382 |
| 2014/0131785 | A1 | 5/2014 | Seo et al. | |
| 2015/0014760 | A1* | 1/2015 | Bateman ............ | H10D 30/0413 |
| | | | | 438/269 |
| 2015/0325695 | A1* | 11/2015 | Suh ...................... | H10D 64/018 |
| | | | | 257/329 |
| 2015/0340316 | A1 | 11/2015 | Or-Back et al. | |
| 2018/0197871 | A1* | 7/2018 | Chiu ...................... | H10D 30/68 |
| 2018/0261620 | A1 | 9/2018 | Lee | |
| 2019/0057972 | A1 | 2/2019 | Liu et al. | |
| 2019/0198569 | A1 | 6/2019 | Hsu | |
| 2019/0326307 | A1 | 10/2019 | Mushiga et al. | |
| 2020/0005854 | A1 | 1/2020 | Okhonin et al. | |
| 2020/0105773 | A1 | 4/2020 | Morris et al. | |
| 2020/0286815 | A1* | 9/2020 | Moriyama ............. | H10B 43/27 |
| 2020/0395074 | A1 | 12/2020 | Harari | |
| 2022/0005810 | A1 | 1/2022 | Kang et al. | |
| 2022/0199627 | A1 | 6/2022 | Fishburn et al. | |
| 2023/0106561 | A1 | 4/2023 | Hsu | |
| 2023/0128791 | A1 | 4/2023 | Widjaja | |
| 2023/0269927 | A1 | 8/2023 | Hsu | |
| 2023/0397396 | A1 | 12/2023 | Hsu | |

FOREIGN PATENT DOCUMENTS

| | | |
|---|---|---|
| JP | WO 2011/142458 | 7/2013 |
| JP | 2014096466 A | 5/2014 |
| TW | 200903730 A | 1/2009 |
| TW | 201904027 A | 1/2019 |

OTHER PUBLICATIONS

Written Opinion of the International Searching Authority, dated Dec. 9, 2024, for related International Application No. PCT/US2024/051152 (7 pages).
International Search Report, dated Jul. 31, 2023, for corresponding International Application No. PCT/US2023/020749, pp. 1-3.
Written Opinion of the International Searching Authority, dated Jul. 31, 2023, for corresponding International Application No. PCT/US2023/020749, pp. 1-5.
International Search Report, dated Aug. 1, 2023, for related International Application No. PCT/US2023/020750, pp. 1-2.
Written Opinion of the International Searching Authority, dated Aug. 1, 2023, for related International Application No. PCT/US2023/020750, pp. 1-7.
International Search Report, dated Jan. 23, 2024, for related International Application No. PCT/US2023/071795 (2 pages).
Written Opinion of the International Searching Authority, dated Jan. 23, 2024, for related International Application No. PCT/US2023/071795 (6 pages).
International Search Report, dated Jul. 8, 2024, for related International Application No. PCT/US2024/025067 (4 pages).
Written Opinion of the International Searching Authority, dated Jul. 8, 2024, for related International Application No. PCT/US2024/025067 (8 pages).
Ranica et al., "A capacitor-less DRAM cell on 75nm gate length, 16nm thin Fully Depleted SOI device for high density embedded memories" IEDM Technical Digest. IEEE International Electron Devices Meeting, 2004 (4 pages).
International Search Report, dated Sep. 9, 2024, for related International Application No. PCT/US2024/026890 (3 pages).
Written Opinion of the International Searching Authority, dated Sep. 9, 2024, for related International Application No. PCT/US2024/026890 (6 pages).
International Search Report, dated Feb. 7, 2023, for related International Application No. PCT/US2022/077444, pp. 1-4.
Written Opinion of the International Searching Authority, dated Feb. 7, 2023, for related International Application No. PCT/US2022/077444, pp. 1-5.
Taiwan Office Action, dated Sep. 9, 2025, for corresponding Taiwan Application No. 113148631 with English translation (14 pages).
Extended European Search Report, dated Nov. 4, 2025, for corresponding European Application No. 22877648.0 (9 pages).
Korean Office Action, dated Oct. 29, 2025, for corresponding Korean Application No. 10-2025-7008630 with English translation (16 pages).
Japan Patent Office (JPO) Office Action dated Mar. 30, 2026, for Japanese Patent Application No. 2025-508496 with English translation (13 pages total).

* cited by examiner

FRONT GATE
104a

FIRST DIELECTRIC
LAYER
105a

SOURCE LINE
103

105b
SECOND
DIELECTRIC LAYER

104b
BACK GATE

101
BIT LINE

102
FLOATING BODY

SOURCE LINE
103

105b
SECOND
DIELECTRIC LAYER

104b
BACK GATE

101
BIT LINE

102
FLOATING BODY

FRONT GATE
104a

FIRST DIELECTRIC
LAYER
105a

SOURCE LINE
103

105b
SECOND
DIELECTRIC LAYER

104b
BACK GATE

109
SEMICONDUCTOR
LAYER

101
METAL
BIT LINE

102
FLOATING BODY

SOURCE LINE
103

105b
SECOND
DIELECTRIC LAYER

104b
BACK GATE

109
SEMICONDUCTOR
LAYER

101
METAL
BIT LINE

102
FLOATING BODY

FRONT GATE
104a

FIRST DIELECTRIC
LAYER
105a

SOURCE LINE
103

105b
SECOND
DIELECTRIC LAYER

104b
BACK GATE

102
FLOATING BODY

107
DRAIN
REGION

101
METAL
BIT LINE

SOURCE LINE
103

105b
SECOND
DIELECTRIC LAYER

104b
BACK GATE

107
DRAIN
REGION

101
METAL
BIT LINE

101

102
FLOATING BODY

FRONT GATE
104a

FIRST DIELECTRIC
LAYER
105a

SOURCE LINE
103

105b
SECOND
DIELECTRIC LAYER

104b
BACK GATE

109
SEMICONDUCTOR
LAYER

101
METAL
BIT LINE

102
FLOATING
BODY

114
SOURCE REGION

SOURCE LINE
103

105b
SECOND
DIELECTRIC LAYER

104b
BACK GATE

109
SEMICONDUCTOR
LAYER

101
METAL
BIT LINE

102
FLOATING
BODY

114
SOURCE REGION

FRONT GATE
104a

FIRST DIELECTRIC
LAYER
105a

SOURCE
LINE
103

A —— —— A'

105b
SECOND
DIELECTRIC
LAYER

104b
BACK GATE    115    101    116
SEMICONDUCTOR    BIT LINE    INSULATOR
LAYER

SEMICONDUCTOR
LAYER
115

INSULATOR
116

SOURCE LINE
103

105b
SECOND
DIELECTRIC
LAYER

104b
BACK GATE    101
BIT LINE

Figures 1M, 1N, 1O:
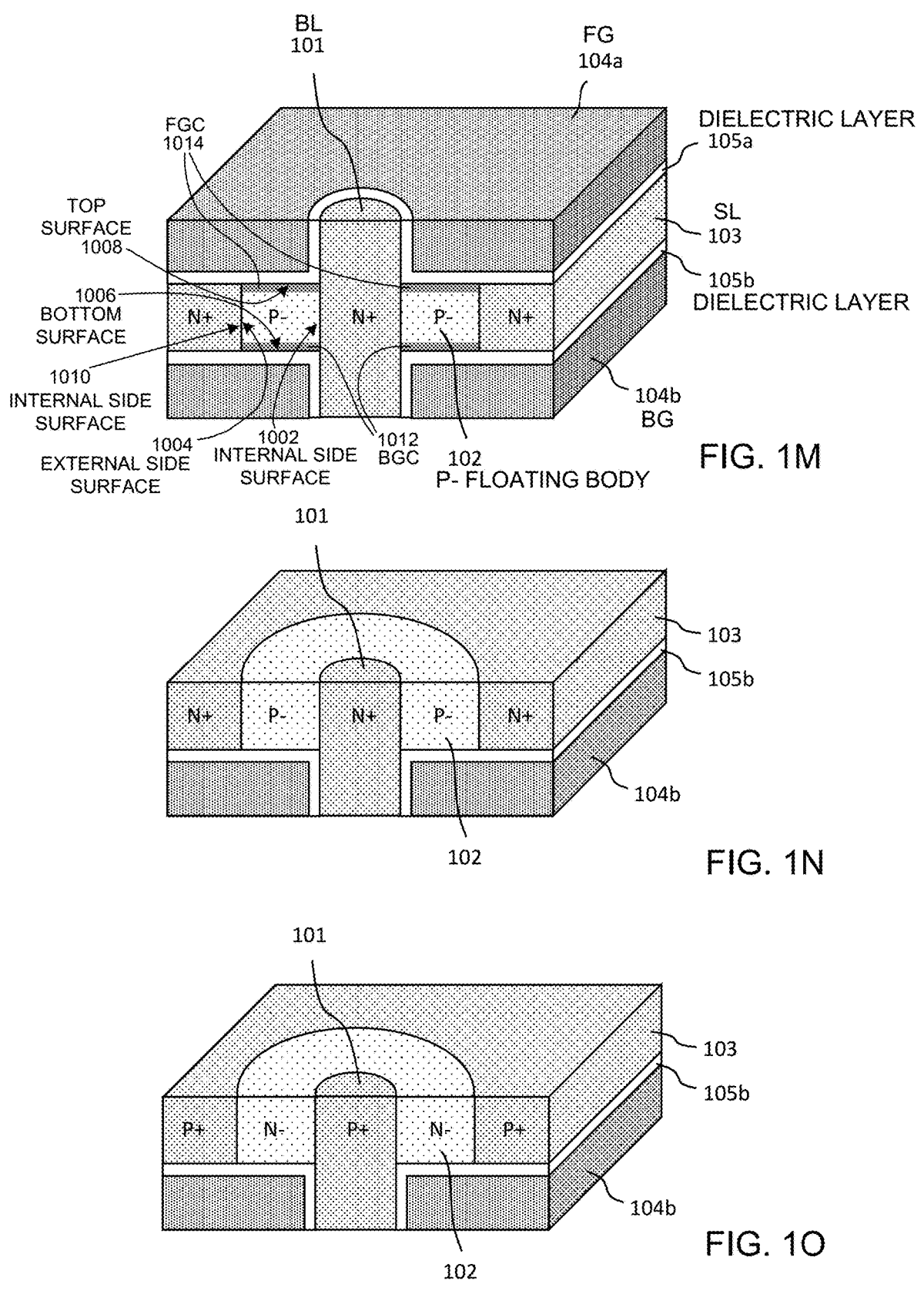

BL
101

FG
104a

FGC
1014

DIELECTRIC LAYER
105a

TOP
SURFACE
1008

SL
103

1006

105b
DIELECTRIC LAYER

BOTTOM
SURFACE

N+          P-          N+          P-          N+

1010
INTERNAL SIDE
SURFACE

104b
BG 1004          1002          1012
EXTERNAL SIDE    INTERNAL SIDE    BGC
SURFACE          SURFACE

102
P- FLOATING BODY

NON VOLATILE MEMORY GATE DIELECTRIC LAYER 170a
171a
171b

FRONT GATE 104a

SOURCE LINE 103

171b
171a
170b NON VOLATILE MEMORY GATE DIELECTRIC LAYER

104b BACK GATE

102 FLOATING BODY

101 BIT LINE

SOURCE LINE 103

171b
171a
170b NON VOLATILE MEMORY GATE DIELECTRIC LAYER

104b BACK GATE

102 FLOATING BODY

101 BIT LINE

SEMICONDUCTOR
LAYER
201

202
SACRIFICIAL
LAYER

203
VERTICAL BIT LINE
HOLE (OPENING)

FLOATING
BODY
204

SEMICONDUCTOR
LAYER
201

202
SACRIFICIAL
LAYER

203
VERTICAL BIT LINE
HOLE (OPENING)

FLOATING
BODY
204

SEMICONDUCTOR
LAYER
201

202
SACRIFICIAL
LAYER

205
VERTICAL BIT LINE

FLOATING
BODY
204

SEMICONDUCTOR
LAYER
201

SACRIFICIAL
LAYER
REMOVED

205
VERTICAL BIT LINE

FLOATING
BODY
204

SEMICONDUCTOR
LAYER
201

206
GATE
DIELECTRIC
LAYER

205
VERTICAL BIT LINE

FLOATING
BODY
204

SEMICONDUCTOR
LAYER
201

GATE
DIELECTRIC
LAYER
206

207
GATE

203
VERTICAL BIT LINE

FLOATING
BODY
204

SEMICONDUCTOR
LAYER
201

209a
209b
208  209c
CHARGE
TRAPPING
LAYER

205
VERTICAL BIT LINE

FLOATING
BODY
204

SEMICONDUCTOR
LAYER
201

CHARGE
TRAPPING 208
LAYER

207
GATE

203
VERTICAL BIT LINE

SEMICONDUCTOR
LAYER
201

202
SACRIFICIAL
LAYER

203
VERTICAL BIT LINE
HOLE (OPENING)

FLOATING
BODY
204

SEMICONDUCTOR
LAYER
201

202
SACRIFICIAL
LAYER

203
VERTICAL BIT LINE
HOLE (OPENING)

SEMICONDUCTOR
LAYER
210

FLOATING
BODY
204

SEMICONDUCTOR
LAYER
201

202
SACRIFICIAL
LAYER

211
GLUE
LAYER

212
VERTICAL BIT LINE

SEMICONDUCTOR LAYER
210

FLOATING
BODY
204

SEMICONDUCTOR
LAYER
201

SACRIFICIAL
LAYER
REMOVED

211
GLUE
LAYER

212
VERTICAL BIT LINE

SEMICONDUCTOR LAYER 210
FLOATING BODY 204
SEMICONDUCTOR LAYER 201
206 GATE DIELECTRIC LAYER
211 GLUE LAYER
212 VERTICAL BIT LINE

SEMICONDUCTOR LAYER 210
FLOATING BODY 204
SEMICONDUCTOR LAYER 201
GATE DIELECTRIC LAYER 206
207 GATE
211 GLUE LAYER
212 VERTICAL BIT LINE

FIRST
SACRIFICIAL
LAYER
213

214
SECOND
SACRIFICIAL
LAYER

215
VERTICAL BIT LINE
HOLES
(OR OPENINGS)

RECESS
216

FIRST
SACRIFICIAL
LAYER
213

214
SECOND
SACRIFICIAL
LAYER

215
VERTICAL BIT LINE
HOLES
(OR OPENINGS)

SEMICONDUCTOR
217

FIRST
SACRIFICIAL
LAYER
213

214
SECOND
SACRIFICIAL
LAYER

SEMICONDUCTOR
217

FIRST
SACRIFICIAL
LAYER
213

214
SECOND
SACRIFICIAL
LAYER

215
VERTICAL BIT LINE
HOLES
(OR OPENINGS)

SEMICONDUCTOR 217

FIRST SACRIFICIAL LAYER 213

214 SECOND SACRIFICIAL LAYER

218 VERTICAL BIT LINE

SEMICONDUCTOR 217

FIRST SACRIFICIAL LAYER REMOVED

214 SECOND SACRIFICIAL LAYER

218 VERTICAL BIT LINE

SEMICONDUCTOR
217

219
SOURCE
LINE

214
SECOND
SACRIFICIAL
LAYER

218
VERTICAL BIT LINE

SEMICONDUCTOR
217

219
SOURCE
LINE

SECOND
SACRIFICIAL
LAYER
REMOVED

218
VERTICAL BIT LINE

SEMICONDUCTOR 217

SOURCE LINE 219

206 GATE DIELECTRIC LAYER

207 GATE

218 VERTICAL BIT LINE

SEMICONDUCTOR 217

SOURCE LINE 219

208 CHARGE TRAPPING LAYER

207 GATE

218 VERTICAL BIT LINE

FIRST
SACRIFICIAL
LAYER
213

214
SECOND
SACRIFICIAL
LAYER

215
VERTICAL BIT LINE
HOLES
(OR OPENINGS)

RECESS
216

FIRST
SACRIFICIAL
LAYER
213

214
SECOND
SACRIFICIAL
LAYER

215
VERTICAL BIT LINE
HOLES
(OR OPENINGS)

SEMICONDUCTOR
217

FIRST
SACRIFICIAL
LAYER
213

214
SECOND
SACRIFICIAL
LAYER

SEMICONDUCTOR
217

FIRST
SACRIFICIAL
LAYER
213

214
SECOND
SACRIFICIAL
LAYER

215
VERTICAL BIT LINE
HOLES
(OR OPENINGS)

SEMICONDUCTOR
LAYER
210

SEMICONDUCTOR
217

FIRST
SACRIFICIAL
LAYER
213

214
SECOND
SACRIFICIAL
LAYER

215
VERTICAL BIT LINE HOLE
(OR OPENING)

SEMICONDUCTOR LAYER
210

SEMICONDUCTOR
217

FIRST
SACRIFICIAL
LAYER
213

214
SECOND
SACRIFICIAL
LAYER

211
GLUE
LAYER

215
VERTICAL BIT LINE HOLE
(OR OPENING)

SEMICONDUCTOR LAYER
210

SEMICONDUCTOR
217

FIRST
SACRIFICIAL
LAYER
213

214
SECOND
SACRIFICIAL
LAYER

211
GLUE
LAYER

220
VERTICAL BIT LINE

SEMICONDUCTOR LAYER
210

SEMICONDUCTOR
217

FIRST
SACRIFICIAL
LAYER
REMOVED

214
SECOND
SACRIFICIAL
LAYER

211
GLUE
LAYER

220
VERTICAL BIT LINE

SEMICONDUCTOR LAYER
210

SEMICONDUCTOR LAYER
221

SEMICONDUCTOR
217

214
SECOND
SACRIFICIAL
LAYER

211
GLUE
LAYER

220
VERTICAL BIT LINE

SEMICONDUCTOR LAYER
210

SEMICONDUCTOR LAYER
221

SEMICONDUCTOR
217

222
SOURCE
LINE

214
SECOND
SACRIFICIAL
LAYER

211
GLUE
LAYER

220
VERTICAL BIT LINE

SEMICONDUCTOR LAYER
210

SEMICONDUCTOR LAYER
221

SEMICONDUCTOR
217

222
SOURCE
LINE

SECOND
SACRIFICIAL
LAYER
REMOVED

211
GLUE
LAYER

220
VERTICAL BIT LINE

SEMICONDUCTOR LAYER
210

SEMICONDUCTOR LAYER
221

SEMICONDUCTOR
217

222
SOURCE
LINE

206
GATE
DIELECTRIC
LAYER

211
GLUE
LAYER

220
VERTICAL BIT LINE

SEMICONDUCTOR LAYER
210

SEMICONDUCTOR LAYER
221

SEMICONDUCTOR
217

SOURCE
LINE
222

GATE
DIELECTRIC
LAYER
206

207
GATE

211
GLUE
LAYER

220
VERTICAL BIT LINE

SEMICONDUCTOR LAYER
210

SEMICONDUCTOR LAYER
221

SEMICONDUCTOR
217

SOURCE
LINE
222

CHARGE
TRAPPING
LAYER
208

207
GATE

211
GLUE
LAYER

220
VERTICAL BIT LINE

FIRST
SACRIFICIAL
LAYER
213

214
SECOND
SACRIFICIAL
LAYER

215
VERTICAL BIT LINE
HOLES
(OR OPENINGS)

RECESS
216

FIRST
SACRIFICIAL
LAYER
213

214
SECOND
SACRIFICIAL
LAYER

215
VERTICAL BIT LINE
HOLES
(OR OPENINGS)

RECESS
216

SEMICONDUCTOR LAYER
223

FIRST
SACRIFICIAL
LAYER
213

214
SECOND
SACRIFICIAL
LAYER

215
VERTICAL BIT LINE HOLE
(OR OPENING)

INSULATOR
224

SEMICONDUCTOR LAYER
223

FIRST
SACRIFICIAL
LAYER
213

214
SECOND
SACRIFICIAL
LAYER

INSULATOR
224
SEMICONDUCTOR LAYER
223
FIRST
SACRIFICIAL
LAYER
213

214
SECOND
SACRIFICIAL
LAYER

215
VERTICAL BIT LINE
HOLE (OR OPENING)

INSULATOR
224
SEMICONDUCTOR LAYER
223
FIRST
SACRIFICIAL
LAYER
213

214
SECOND
SACRIFICIAL
LAYER

225
METAL BIT LINE

INSULATOR
224
SEMICONDUCTOR LAYER
223
FIRST
SACRIFICIAL
LAYER
REMOVED

214
SECOND
SACRIFICIAL
LAYER

225
METAL BIT LINE

INSULATOR
224
SEMICONDUCTOR LAYER
223
226
SOURCE
LINE

214
SECOND
SACRIFICIAL
LAYER

225
METAL BIT LINE

INSULATOR
224

SEMICONDUCTOR LAYER
223

226
SOURCE
LINE

SECOND
SACRIFICIAL
LAYER
REMOVED

225
METAL BIT LINE

INSULATOR
224

SEMICONDUCTOR LAYER
223

226
SOURCE
LINE

206
GATE DIELECTRIC
LAYER

225
METAL BIT LINE

INSULATOR
224

SEMICONDUCTOR LAYER
223

226
SOURCE
LINE

206
GATE DIELECTRIC
LAYER

207
GATE

225
METAL BIT LINE

INSULATOR
224

SEMICONDUCTOR LAYER
223

226
SOURCE
LINE

208
CHARGE
TRAPPING
LAYER

207
GATE

225
METAL BIT LINE

SEMICONDUCTOR
LAYER
201

202
SACRIFICIAL
LAYER

203
VERTICAL BIT LINE
HOLE (OPENING)

FLOATING
BODY
204

SEMICONDUCTOR
LAYER
201

202
SACRIFICIAL
LAYER

203
VERTICAL BIT LINE
HOLE (OPENING)

FLOATING BODY 204

DRAIN REGION 227

SEMICONDUCTOR LAYER 201

202 SACRIFICIAL LAYER

211 GLUE LAYER

212 VERTICAL BIT LINE

FLOATING BODY 204

DRAIN REGION 227

SEMICONDUCTOR LAYER 201

SACRIFICIAL LAYER REMOVED

211 GLUE LAYER

212 VERTICAL BIT LINE

DRAIN REGION 227

FLOATING BODY 204

SEMICONDUCTOR LAYER 201

206 GATE DIELECTRIC LAYER

211 GLUE LAYER

212 VERTICAL BIT LINE

DRAIN REGION 227

FLOATING BODY 204

SEMICONDUCTOR LAYER 201

206 GATE DIELECTRIC LAYER

207 GATE

211 GLUE LAYER

212 VERTICAL BIT LINE

3D MEMORY CELL STRUCTURES WITH FLOATING BODIES

CLAIM TO PRIORITY

This application is a continuation-in-part (CIP) of U.S. Provisional Application having Application Ser. No. 17/937,432 filed on Sep. 30, 2022, and entitled "3D Memory Cells and Array Architectures."

This application claims the benefit of priority under 35 U.S.C. 119(e) based upon U.S. Provisional Patent Application having Application No. 63/398,807 filed on Aug. 17, 2022, and entitled "Memory Cell and Array Architectures and Operation Conditions," and U.S. Provisional Patent Application having Application No. 63/406,255 filed on Sep. 14, 2022, and entitled "3D Cell and Array Structures," and U.S. Provisional Patent Application having Application No. 63/413,493 filed on Oct. 5, 2022, and entitled "3D Cell and Array Structures," and U.S. Provisional Patent Application having Application No. 63/418,698 filed on Oct. 24, 2022, and entitled "3D Cell and Array Structures," and U.S. Provisional Patent Application having Application No. 63/440,695 filed on Jan. 24, 2023, and entitled "3D Cell and Array Structures," and U.S. Provisional Patent Application having Application No. 63/442,528 filed on Feb. 1, 2023, and entitled "3D Cell and Array Structures," and U.S. Provisional Patent Application having Application No. 63/444,205 filed on Feb. 8, 2023, and entitled "3D Cell and Array Structures," and U.S. Provisional Patent Application having Application No. 63/444,551 filed on Feb. 9, 2023, and entitled "3D Cell and Array Structures," and U.S. Provisional Patent Application having Application No. 63/451,624 filed on Mar. 12, 2023, and entitled "3D Cell and Array Structures and Processes," all of which are hereby incorporated herein by reference in their entireties.

The application Ser. No. 17/937,432 claims the benefit of priority under 35 U.S.C. 119(e) based upon U.S. Provisional Patent Application having Application No. 63/398,807 filed on Aug. 17, 2022, and entitled "Memory Cell and Array Architectures and Operation Conditions," and U.S. Provisional Patent Application having Application No. 63/295,874 filed on Jan. 1, 2022, and entitled "Alpha-RAM (a-RAM) or Alpha-DRAM (a-DRAM) Technology," and U.S. Provisional Patent Application having Application No. 63/291,380 filed on Dec. 18, 2021 and entitled "3D DRAM-replacement Technologies," and U.S. Provisional Patent Application having Application No. 63/254,841, filed on Oct. 12, 2021 and entitled "3D DRAM-replacement Technologies," and U.S. Provisional Patent Application having Application No. 63/251,583 filed on Oct. 1, 2021 and entitled "3D DRAM-replacement Technologies," all of which are hereby incorporated herein by reference in their entireties.

CROSS REFERENCE TO RELATED APPLICATIONS

This application is related to the following co-pending application having application Ser. No. 18/311,212 filed on May 2, 2023, and entitled "3D MEMORY CELLS AND ARRAY ARCHITECTURES AND PROCESSES."

FIELD OF THE INVENTION

The exemplary embodiments of the present invention relate generally to the field of memory, and more specifically to memory cells and array structures and associated processes.

BACKGROUND OF THE INVENTION

With the increasing complexity and density of electronic circuits, memory size, complexity, and cost are important considerations. One approach to increase memory capacity is to use three-dimensional (3D) array structure. The 3D array structure has been successfully used in NAND flash memory today. However, for dynamic random-access memory (DRAM), due to its special one-transistor-one-capacitor (1T1C) cell structure, a cost-effective 3D array structure has not been realized.

SUMMARY

In various exemplary embodiments, three-dimensional (3D) memory cells, array structures, and associated processes are disclosed. In one embodiment, a novel 3D array structure using floating-body cells to implement DRAM is disclosed. The array structure is formed using a deep trench process similar to 3D NAND flash memory. Therefore, ultra-high-density DRAM can be realized. In one embodiment, 3D NOR-type memory cells and array structures are provided. The disclosed memory cells and array structures are applicable to many technologies. For example, the inventive memory cells and array structures are applicable to dynamic random-access memory (DRAM), floating-body cell (FBC) memory, NOR-type flash memory, and thyristors.

In an exemplary embodiment, a memory cell structure is provided that includes a first semiconductor material, a floating body semiconductor material having an internal side surface that surrounds and connects to the first semiconductor material, and a second semiconductor material having an internal side surface that surrounds and connects to the floating body semiconductor material. The memory cell structure also includes a first dielectric layer connected to a top surface of the floating body material, a second dielectric layer connected to a bottom surface of the floating body material, a front gate connected to the first dielectric layer, and a back gate connected to the second dielectric layer.

In an exemplary embodiment, a three-dimensional (3D) memory array is provided that comprises a plurality of memory cells separated by a dielectric layer to form a stack of memory cells. Each memory cell in the stack of memory cells comprises a bit line formed from one of a first semiconductor material and a first conductor material, a floating body semiconductor material having an internal side surface that surrounds and connects to the bit line, a source line formed from one of a second semiconductor material and a second conductor material having an internal side surface that surrounds and connects to the floating body semiconductor material, and a word line formed from a third conductor material that is coupled to the floating body semiconductor through the dielectric layer to form a gate of the memory cell. Additionally, the bit lines of the stack of memory cells are connected to form a vertical bit line.

Additional features and benefits of the exemplary embodiments of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

FIG. 1M shows an exemplary embodiment of a three-dimensional (3D) NOR-type memory cell structure using a floating body cell (FBC) configuration in accordance with the invention.

FIG. 1N shows the cell structure shown in FIG. 1M with a front gate and a gate dielectric layer removed.

FIG. 1O shows a cell formed using a PMOS transistor.

DETAILED DESCRIPTION

Those of ordinary skilled in the art will realize that the following detailed description is illustrative only and is not intended to be in any way limiting. Other embodiments of the present invention will readily suggest themselves to skilled persons having the benefit of this disclosure. Reference will now be made in detail to implementations of the exemplary embodiments of the present invention as illustrated in the accompanying drawings. The same reference indicators or numbers will be used throughout the drawings and the following detailed description to refer to the same or like parts.

In various exemplary embodiments, three-dimensional (3D) memory cells, array structures, and associated processes are disclosed. For example, 3D NOR-type cells and array structures and processes are disclosed. The various embodiments of the invention can be applied to many technologies. For example, aspects of the invention can be applied to dynamic random-access memory (DRAM) using floating-body cells (FBC), NOR-type flash memory, Ferroelectric random-access memory (FRAM), resistive random-access memory (RRAM), phase change memory (PCM), magneto-resistive random-access memory (MRAM), and memory elements called 'synapses' in in-memory computing or neural network arrays for artificial intelligence (AI) applications. In addition, embodiments of the invention are applicable to other memory applications not listed.

Figure 1A:
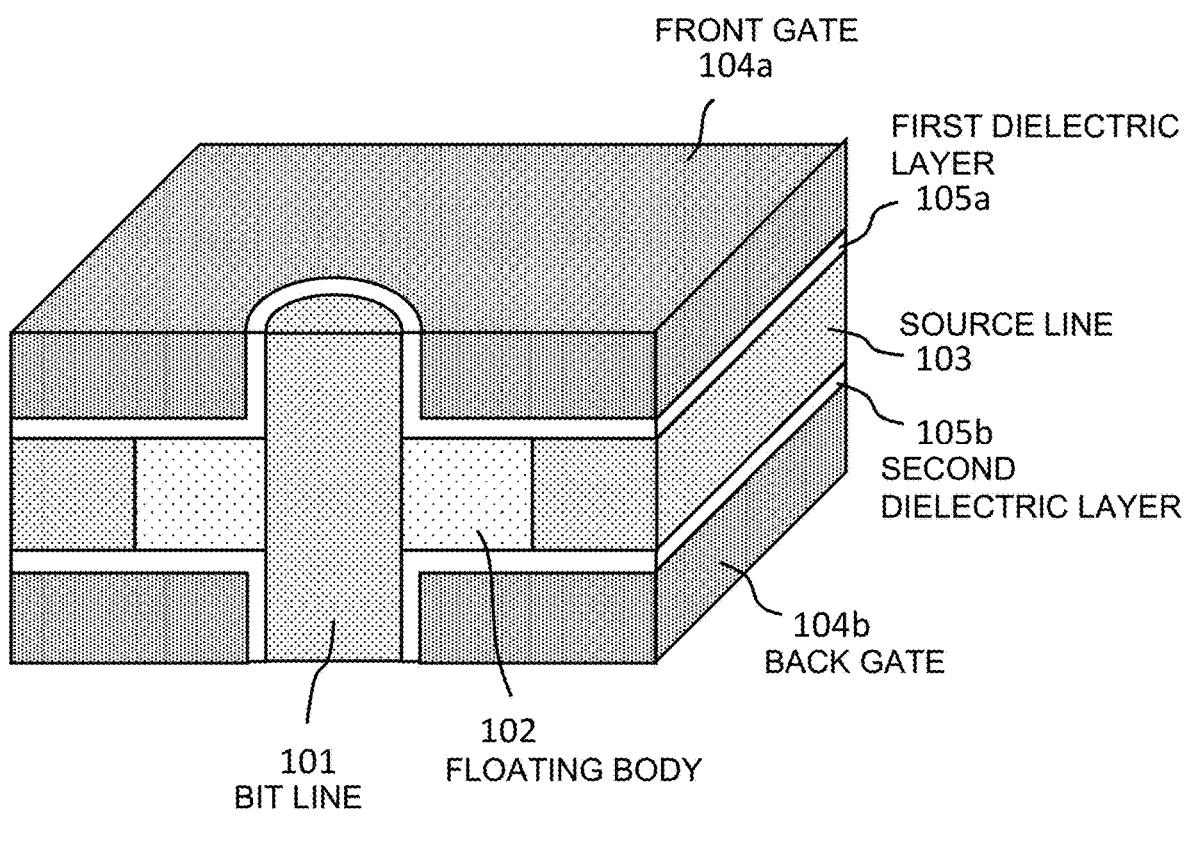
FIG. 1A show an embodiment of a cell structure for a three-dimensional (3D) NOR-type array constructed according to the invention.

FIG. 1A show an embodiment of a cell structure for a three-dimensional (3D) NOR-type array constructed according to the invention. The cell structure shown in FIG. 1A comprises a semiconductor layer that forms a vertical bit line (BL) 101 that comprises silicon or polysilicon, a floating body 102 formed of silicon or polysilicon and a horizontal source line (SL) 103 formed of silicon or polysilicon. The cell also comprises a front gate 104a, a back gate 104b, a first gate dielectric layer 105a, and a second gate dielectric layer 105b. In one embodiment, the gates 104a and 104b are formed of conductor material, such as metal or heavily doped polysilicon. The front gate 104a and back gate 104b can be connected to horizontal word lines (WL).

The cell can be formed as either an NMOS or PMOS transistor. For an NMOS cell embodiment, the bit line 101 and the source line 103 have N+ type of doping and the floating body 102 has P− type of doping. For the PMOS cell embodiment, the bit line 101 and the source line 103 have P+ type of doping and the floating body 102 has N− type of doping.

Figure 1B:
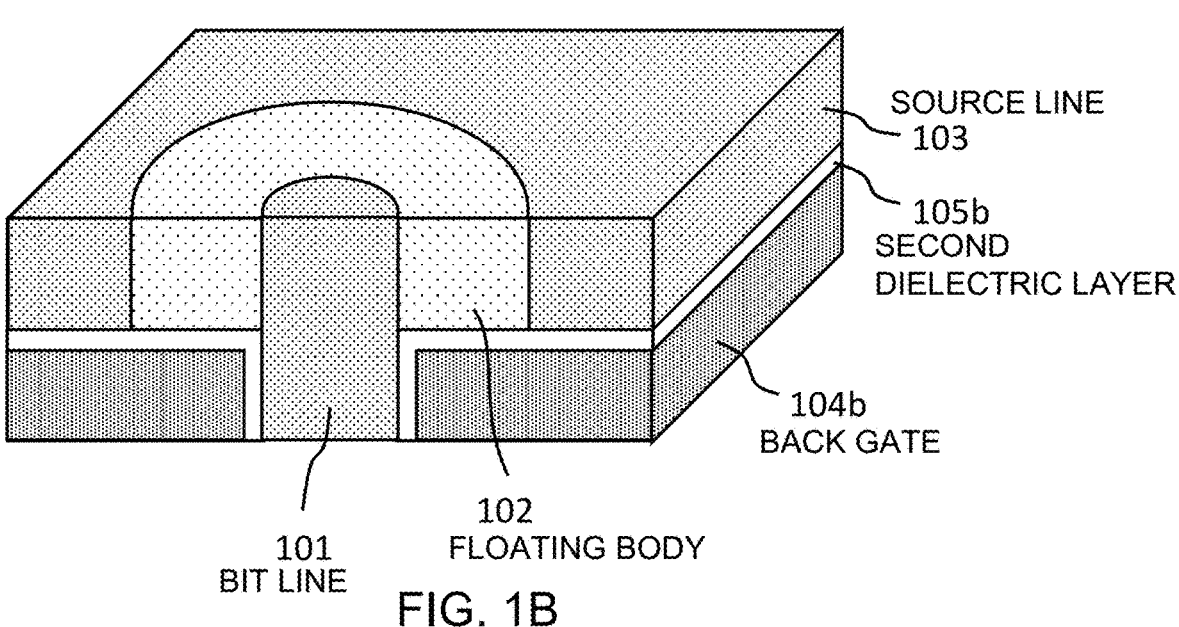
FIG. 1B shows an embodiment of an inner cell structure of the cell shown in FIG. 1A.

FIG. 1B shows an embodiment of the inner cell structure of the cell shown in FIG. 1A with the front gate 104a, the gate dielectric layer 105a, and a portion of the BL 101 removed. Although the embodiments shows that the shapes of the bit line 101 and floating body 102 are circular, in other embodiments, the bit line 101 and the floating body 102 can have any suitable shapes, such as square, rectangular, triangular, hexagon, etc. These variations are withing the scope of the embodiments.

Depending on the cell types and technologies, the gate dielectric layers 105a and 105b can be formed of a variety of different materials and structures. For example, in one embodiment, the cell may be formed as a floating-body cell for DRAM application. For this embodiment, the gate dielectric layers 105a and 105b are thin gate oxide layers or high-K material layers, such as hafnium oxide (HfO2). In another embodiment, the gate dielectric layers 105a and 105b are formed from other suitable materials to form NOR-type flash memory, ferroelectric random-access memory (FRAM), resistive random-access memory (RRAM), phase-change memory (PCM), magneto-resistive random-access memory (MRAM), and others. as shown in FIGS. 2A-D.

Figure 1C:
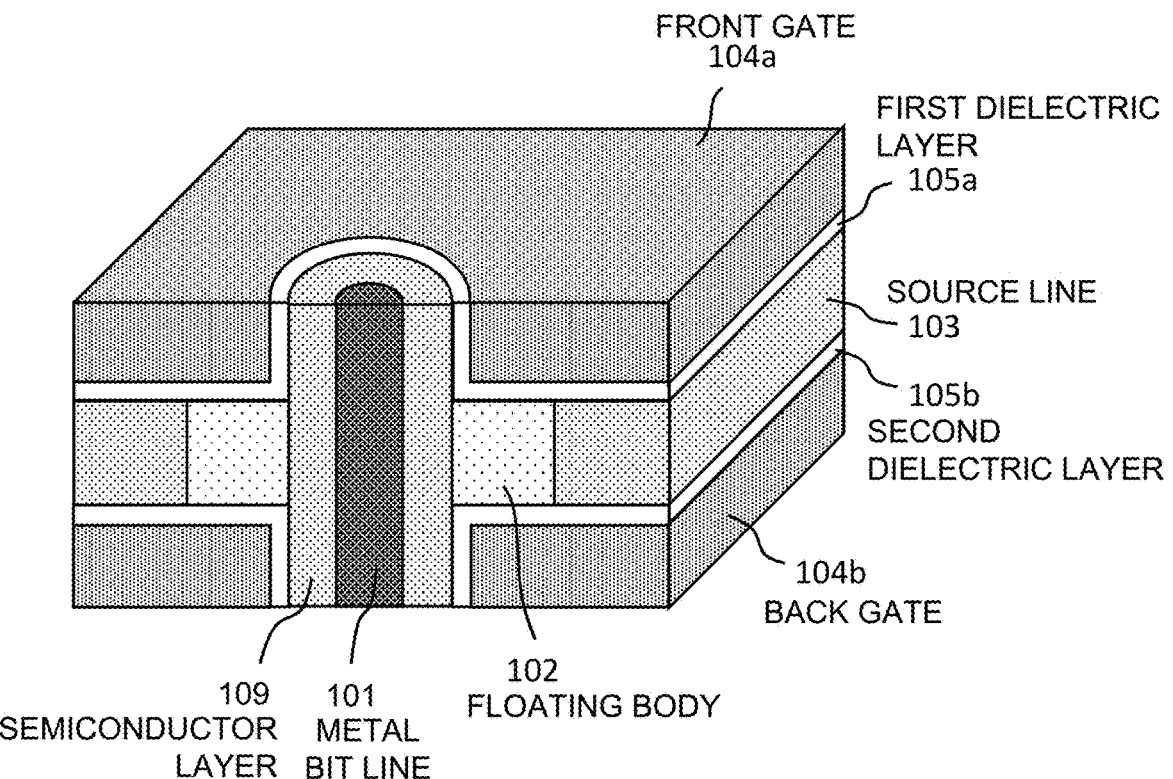
FIG. 1C shows another embodiment of a cell structure constructed according to the invention.

FIG. 1C shows another embodiment of a cell structure constructed according to the invention. This embodiment is similar to the embodiment in FIG. 1A except that a metal vertical bit line 101 is formed of a metal core in the center of the semiconductor layer 109 to reduce the bit line resistance.

Figure 1D:
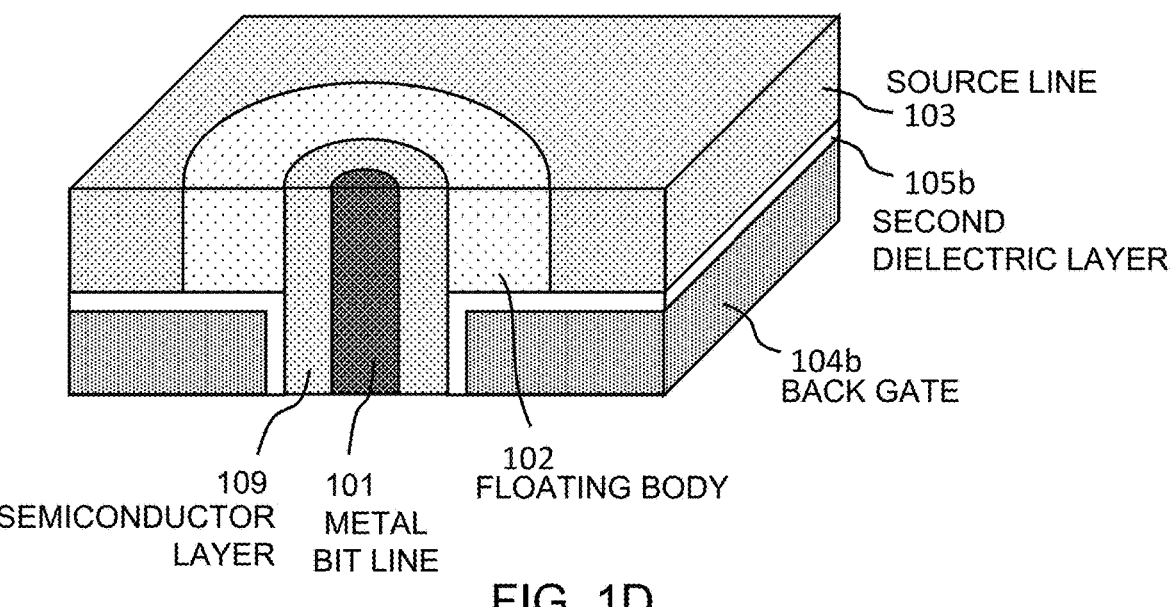
FIG. 1D shows the cell structure of FIG. 1C with selected portions removed.

FIG. 1D shows the cell structure of FIG. 1C with the front gate 104a and gate dielectric layer 105a and a portion of the metal BL 101 and the semiconductor layer 109 removed.

Figure 1E:
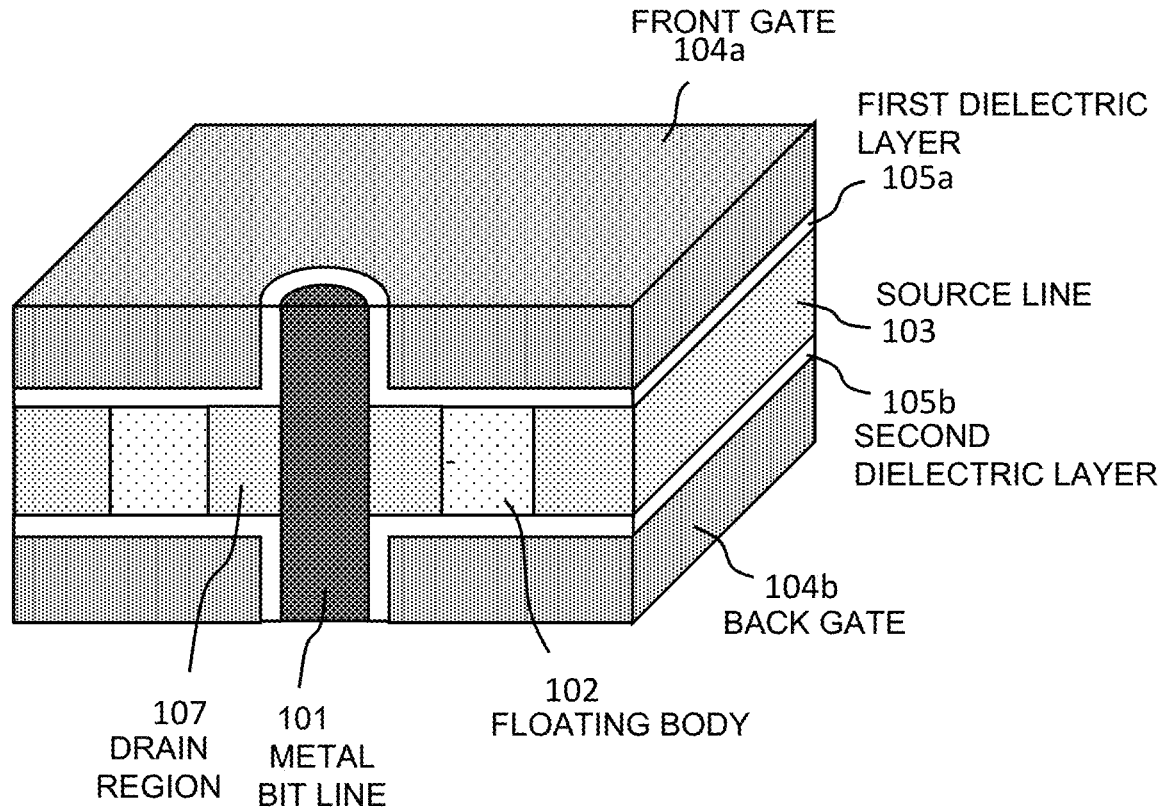
FIG. 1E shows another embodiment of a cell structure constructed according to the invention.

FIG. 1E shows another embodiment of a cell structure constructed according to the invention. This embodiment is similar to the embodiments shown in FIGS. 1C-D except that a drain region 107 is formed around the side of the metal bit line 101 as shown. In an embodiment, the drain region 107 is formed of silicon or polysilicon with the opposite type of heavy doping as the doping of the floating body 102. For example, the 'opposite type of doping' means that P− type (positive) doping is the opposite of N− type (negative) doping. For example, if the floating body 102 comprises P− type doping, the drain region 107 comprises N− type doping, which is the opposite type of doping. If the floating body 102 comprises N− type doping, the drain region 107 comprises P− type doping, which is the opposite type of doping. The terms 'heavy doping' and 'light doping' are relative terms that describe the amount of doping. When a semiconductor is doped with excess electrons or holes, it is called a heavily doped semiconductor, indicated by N+ or P+, respectively. When a semiconductor is doped with a small amount of electrons or holes, it is called a lightly doped semiconductor, indicated by N− or P−, respectively. As shown in FIG. 1E, the vertical bit line hole is filled with metal to form the metal bit line 101 to reduce the bit line resistance.

Figure 1F:
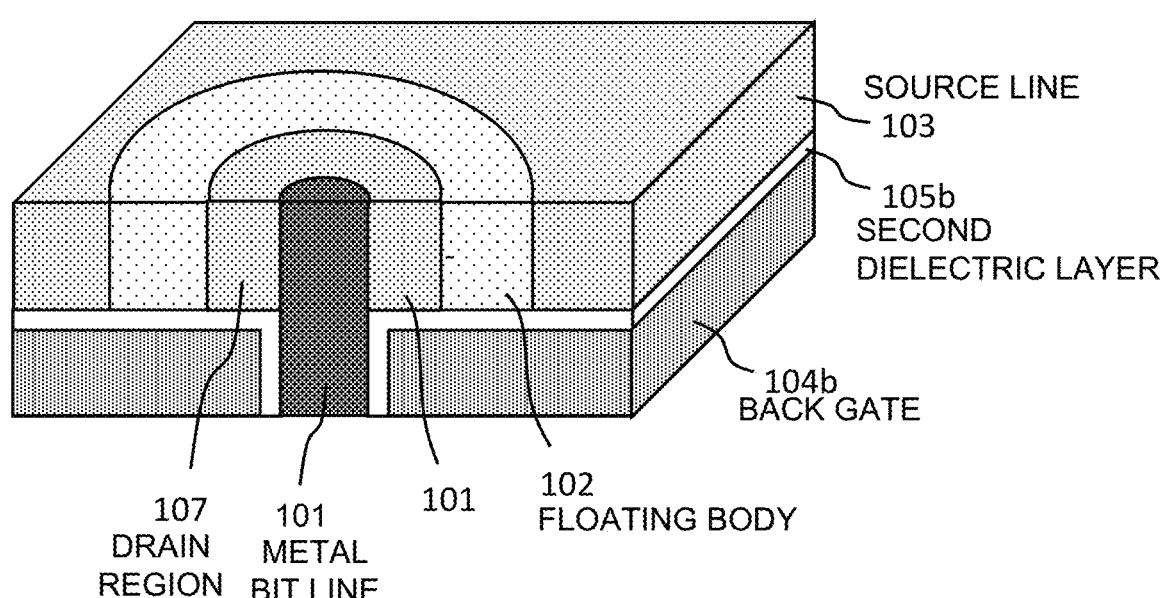
FIG. 1F shows the inner cell structure of the cell shown in FIG. 1E with selected portions removed.

FIG. 1F shows the inner cell structure of the cell shown in FIG. 1E with the front gate 104a, the gate dielectric layer 105a, and a portion of the metal bit line 101 removed.

Figure 1G:
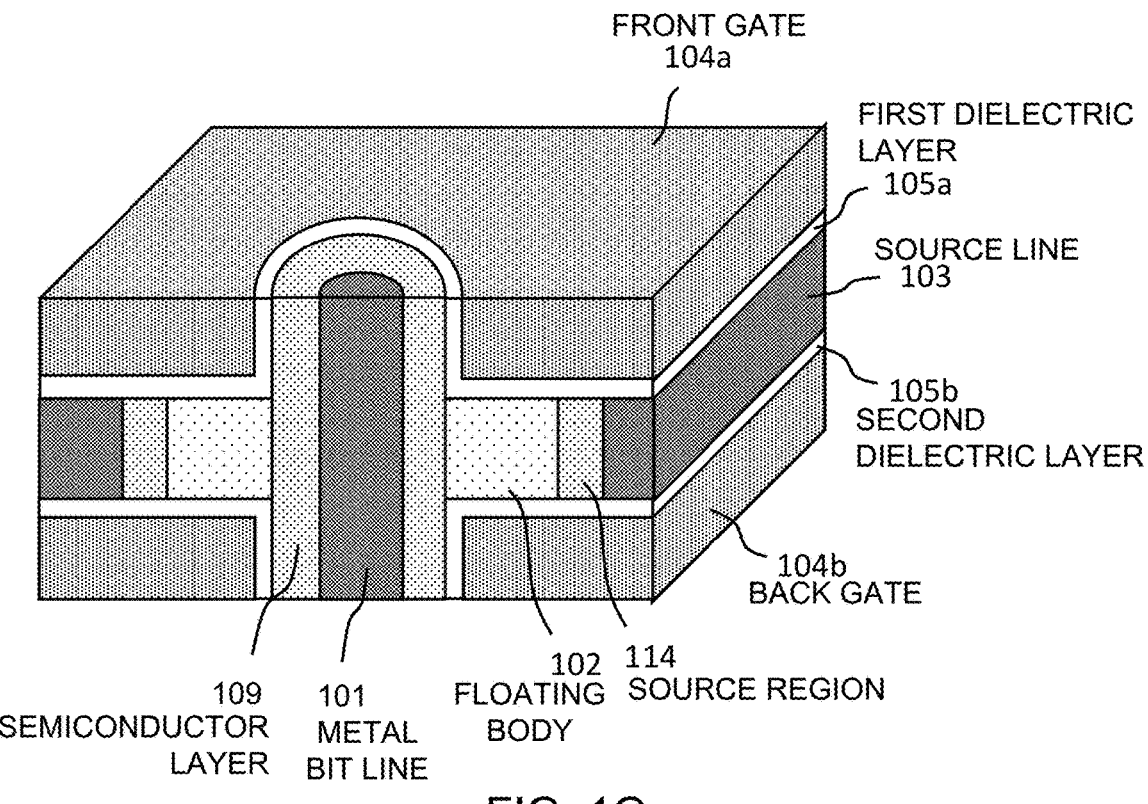
FIG. 1G shows another embodiment of a cell structure constructed according to the invention.

FIG. 1G shows another embodiment of a cell structure constructed according to the invention. This embodiment is similar to the embodiments shown in FIGS. 1C-D except that the source line 103 is formed of conductor material, such as metal to reduce the source line resistance. A source region 114 comprising semiconductor material, such as silicon or polysilicon, is formed between the metal source line 103 and the floating body 102. The source region 114 has the opposite type of heavy doping from the doping of the floating body 102.

Figure 1H:
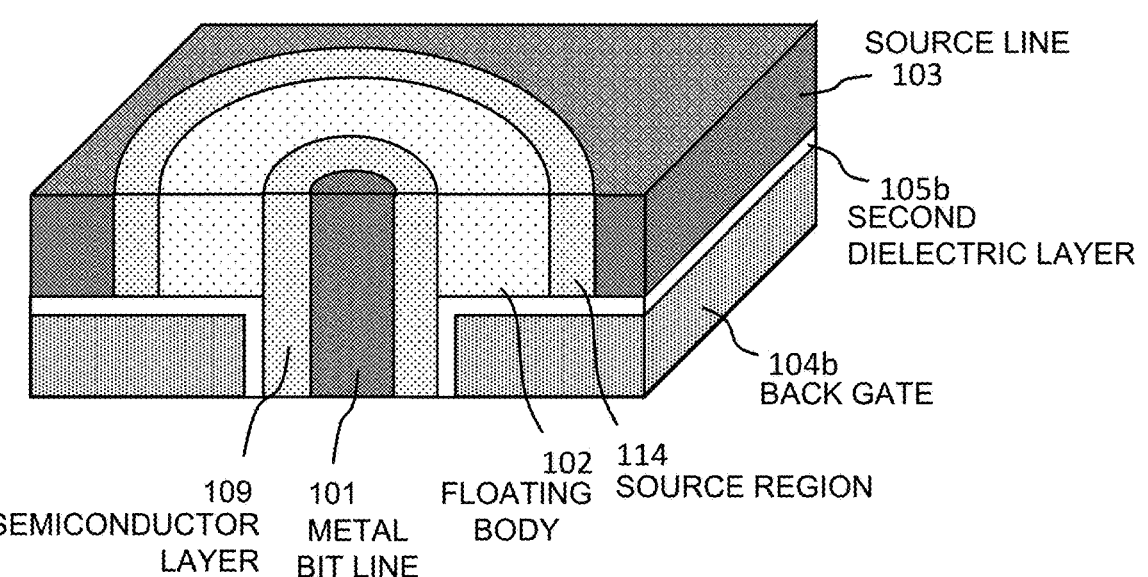
FIG. 1H shows the inner cell structure of the cell shown in FIG. 1G with selected portions removed.

FIG. 1H shows the inner cell structure of the cell shown in FIG. 1G with the front gate 104a and the gate dielectric layer 105a, and a portion of the metal BL 101 and the semiconductor layer 109 removed.

Figures 1I, 1J:
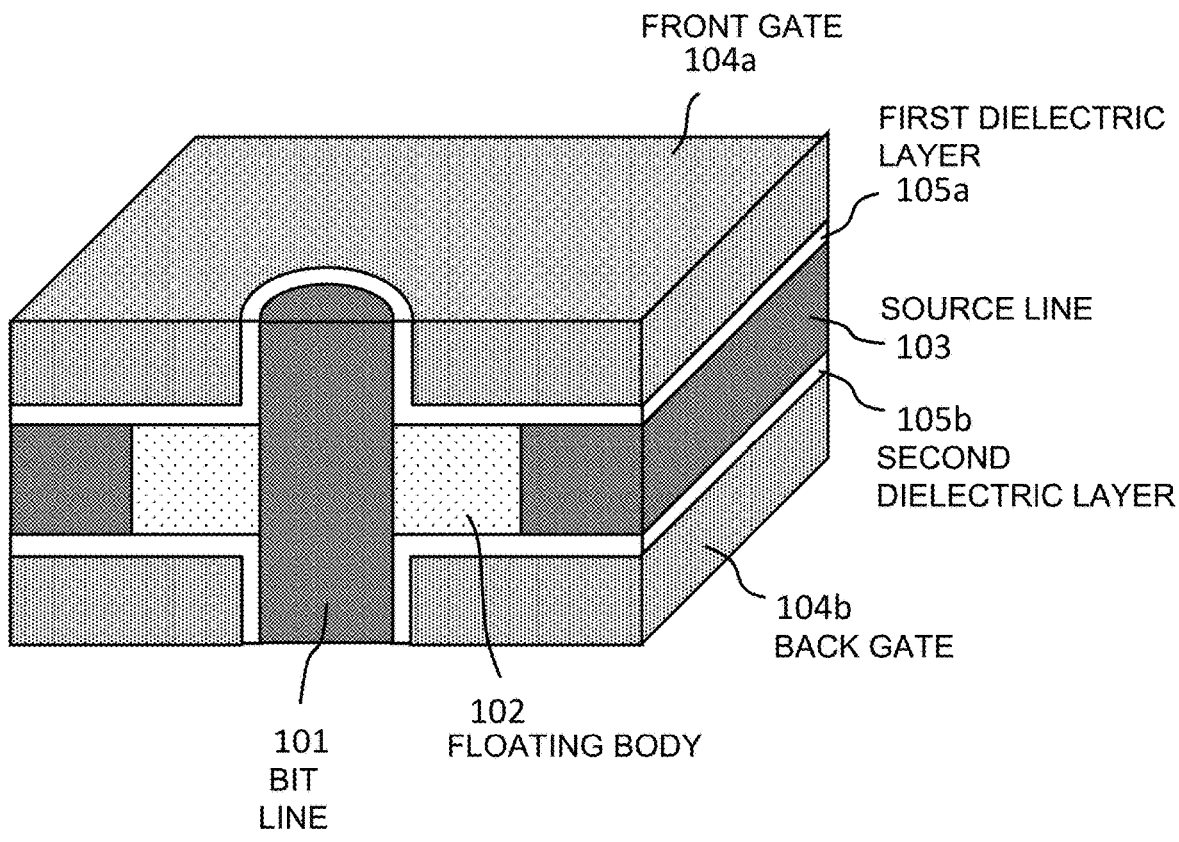
FIG. 1I shows another embodiment of a cell structure constructed according to the invention.
FIG. 1J shows the inner cell structure of the cell shown in FIG. 1I with selected portions removed.

FIG. 1I shows another embodiment of a cell structure constructed according to the invention. This embodiment is similar to FIGS. 1A-B except that the bit line 101 and the source line 103 are formed of metal. A floating body 102 is formed of semiconductor material, such as silicon or polysilicon. In one embodiment, the floating body 102 has N+ or P+ type of heavy doping. This forms a junction-less cell transistor. In another embodiment, the floating body 102 has N− or P− type of light doping. This forms a Schottky-junction cell transistor.

FIG. 1J shows the inner cell structure of the cell shown in FIG. 1I with the front gate 104a, the gate dielectric layer 105a, and a portion of the BL 101 removed.

Figure 1K:
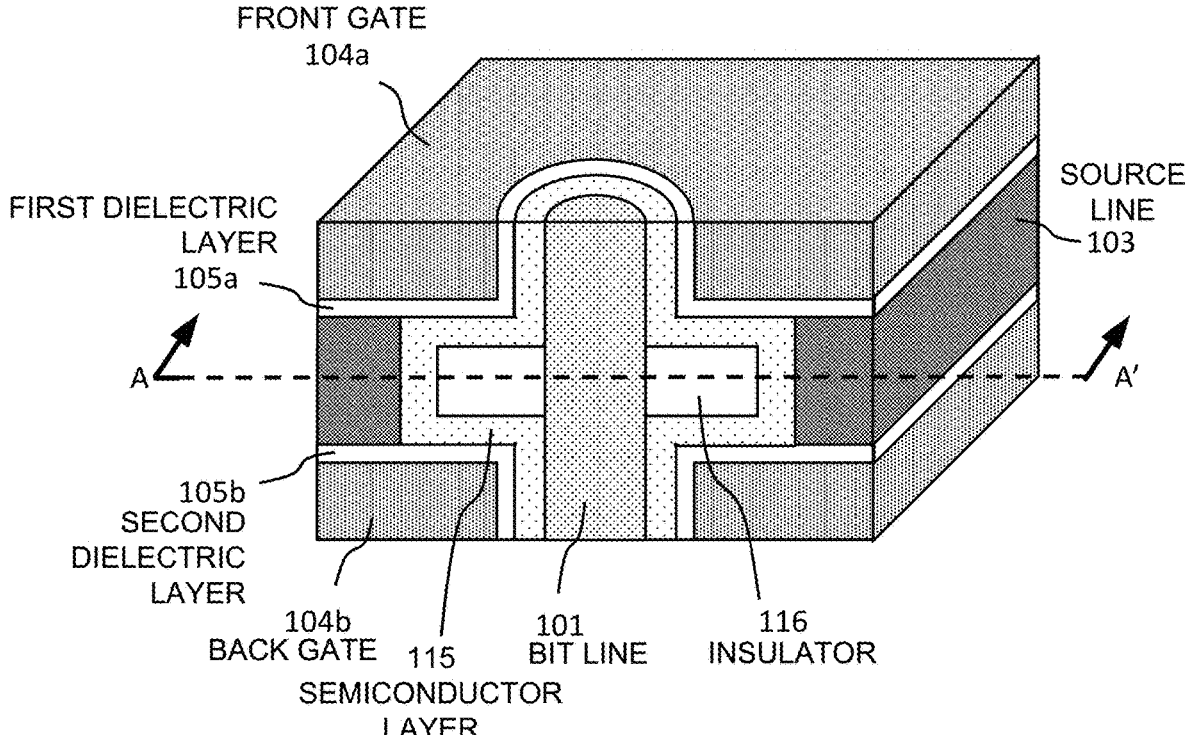
FIG. 1K shows another embodiment of a cell structure constructed using a junction-less thin-film transistor according to the invention.

FIG. 1K shows another embodiment of a cell structure constructed using a junction-less thin-film transistor according to the invention. This embodiment is similar to the embodiments shown in FIGS. 1A-B except that a semiconductor layer 115 comprising silicon, polysilicon, germanium (Ge), indium gallium zinc oxide (IGZO), tungsten-doped indium oxide semiconductor, or any other suitable semiconductor material surrounds the BL 101 and an insulator 116 that comprises oxide or nitride. In one embodiment, the semiconductor layer 115 has N− type or P− type of heavy doping to form the channel of the cell transistor. In one embodiment, the bit line 101 and the source line 103 are formed of conductor material, such as metal or heavily doped polysilicon. FIG. 1K also shows a cross-section indicator A-A'.

Figure 1L:
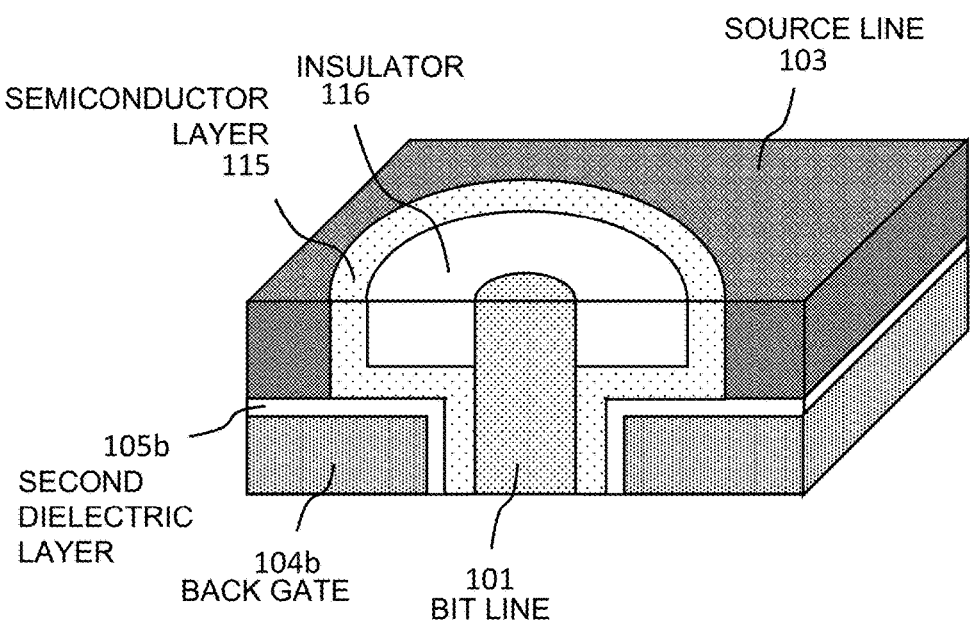
FIG. 1L shows an embodiment of a cross-section view of the cell structure shown in FIG. 1K.

FIG. 1L shows an embodiment of a cross-section view of the cell structure shown in FIG. 1K taken along the cross-section indicator A-A'.

FIG. 1M show an exemplary embodiment of a three-dimensional (3D) NOR-type memory cell structure using a floating body cell (FBC) configuration in accordance with the invention. For example, a 3D NOR-type array can comprise multiple layers of floating-body cell arrays to increase the memory capacity. A floating-body cell is basically a transistor with floating body. The floating body stores electric charges, such as electrons or holes to represent the data. The cell structure comprises a control gate, a drain, a source, and a floating body. In the 3D memory array, the control gate, drain, and source of the cells are connected to a word line (WL), bit line (BL), and source line (SL), respectively.

In the cell structure shown in FIG. 1M, an N+ silicon or polysilicon forms a bit line (BL) 101 and a P− floating body 102 is used for charge storage. An N+ silicon or polysilicon forms a source line (SL) 103. The cell may be formed as a dual-gate transistor shown in FIG. 1M or a single-gate transistor as shown in FIG. 1N. For the dual-gate transistor shown in FIG. 1M, the cell structure comprises two control gates called a front gate 104a and a back gate 104b, respectively. Both the front gate 104a and the back gate 104b are coupled to the floating body 102 through gate dielectric layers 105a and 105b, respectively. The gate dielectric layer is an insulating layer between the gate and the body of the transistor. When a proper voltage is applied to the front gate 104a or the back gate 104b, a front gate channel (FGC) 1014 or a back gate channel (BGC) 1012 are formed in the surface of the floating body 102 under the gate dielectric layer 105a and 105b to conduct current between the bit line 101 and source line 103. In an embodiment, the front gate 104a and back gate 104b are connected to different word lines (WL).

In an embodiment, the P– floating body 102 comprises multiple surfaces as shown in FIG. 1M. An internal side surface 1002 surrounds and connects to the BL 101. An external side surface 1004 connects to the source line 103. A top surface 1008 connects to the dielectric layer 105a, and a bottom surface 1006 connects to the dielectric layer 105b. Thus, in one embodiment, a memory cell structure is provided that includes a first semiconductor material BL 101, a floating body semiconductor material 102 having an internal side surface 1002 that surrounds and connects to the first semiconductor material BL 101, and a second semiconductor material SL 103 having an internal side surface 1010 that surrounds and connects to the floating body semiconductor material 102. The memory cell structure also includes a first dielectric layer 105a connected to a top surface 1008 of the floating body material 102, a second dielectric layer 105b connected to a bottom surface 1006 of the floating body material 102, a front gate 104a connected to the first dielectric layer 105a, and a back gate 104b connected to the second dielectric layer 105b. In various embodiments, minor modifications can be made to the disclosed structures, such as adding a lightly doped drain (LDD), halo implantation, pocket implantation, or channel implantation that are all included within the scope of the invention.

FIG. 1N shows the cell structure shown in FIG. 1M with the front gate 104a, the gate dielectric layer 105a, and a portion of the bit line 101 removed. The P– floating body 102 forms a donut shape as shown. Although this embodiment shows that the shapes for the bit line 101 and floating body 102 are circular, it is obvious that they have any desired shape, such as square, rectangle, triangle, hexagon, etc. These variations shall remain in the scope of the invention.

In one embodiment, the cell structure comprises only one single gate, as shown in FIG. 1N. The floating body 102 is coupled to only one gate 104b as shown. An embodiment of a 3D array structure using this cell structure embodiment is shown in FIG. 1P.

The embodiment shown in FIG. 1M uses an NMOS transistor as the cell. In another embodiment, shown in FIG. 1O, the cell is formed using a PMOS transistor. The bit line 101, floating body 102, and source line 103 are formed by P+, N–, and P+ materials, respectively.

Figure 1P:
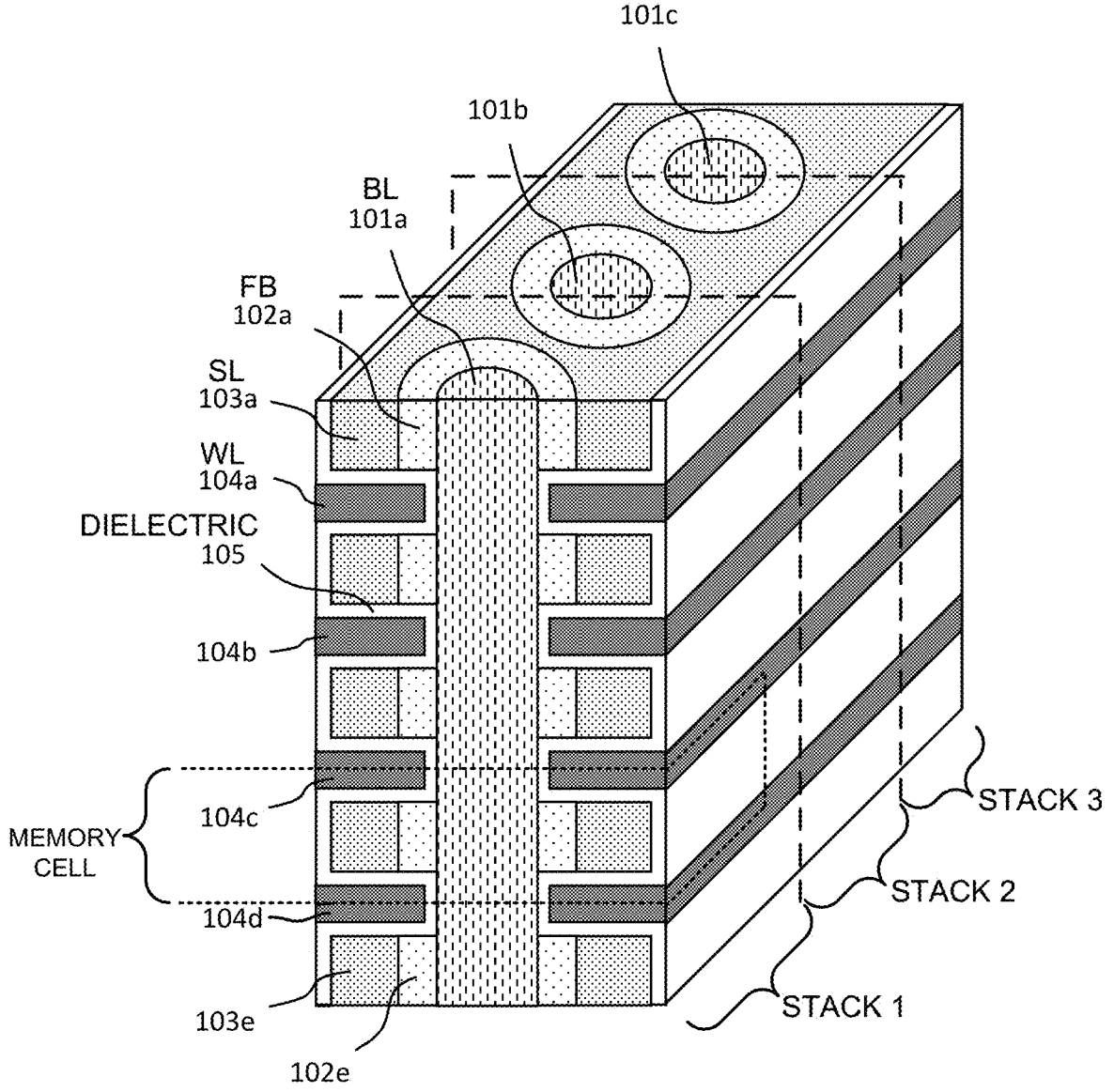
FIG. 1P shows an embodiment of an array structure based on the cell structure shown in FIG. 1M.

FIG. 1P shows an embodiment of an array structure based on the cell structure shown in FIG. 1M. The array structure comprises vertical bit lines 101a to 101c and floating bodies 102a to 102e. The array structure also comprises source lines 103a to 103e and word lines 104a to 104d. The array structure also includes dielectric layer 105 comprising a gate oxide or high-K material, such as HfOx.

In an embodiment, a three-dimensional (3D) memory array comprises a plurality of memory cells separated by a dielectric layer to form a stack of memory cells. For example, FIG. 1P shows a 3D array having three stacks of memory cells and a particular "memory cell" is identified. Each memory cell in the stack of memory cells comprises a bit line 101 formed from one of a first semiconductor material and a first conductor material, a floating body semiconductor material 102 having an internal side surface that surrounds and connects to the bit line, a source line 103 formed from one of a second semiconductor material and a second conductor material having an internal side surface that surrounds and connects to the floating body semiconductor material 102, and a word line 104 formed from a third conductor material that is coupled to the floating body semiconductor 102 through a dielectric layer 105 to form a gate of the memory cell. Additionally, the bit lines of the stack of memory cells are connected to form a vertical bit line (e.g., 101a).

Figure 1Q:
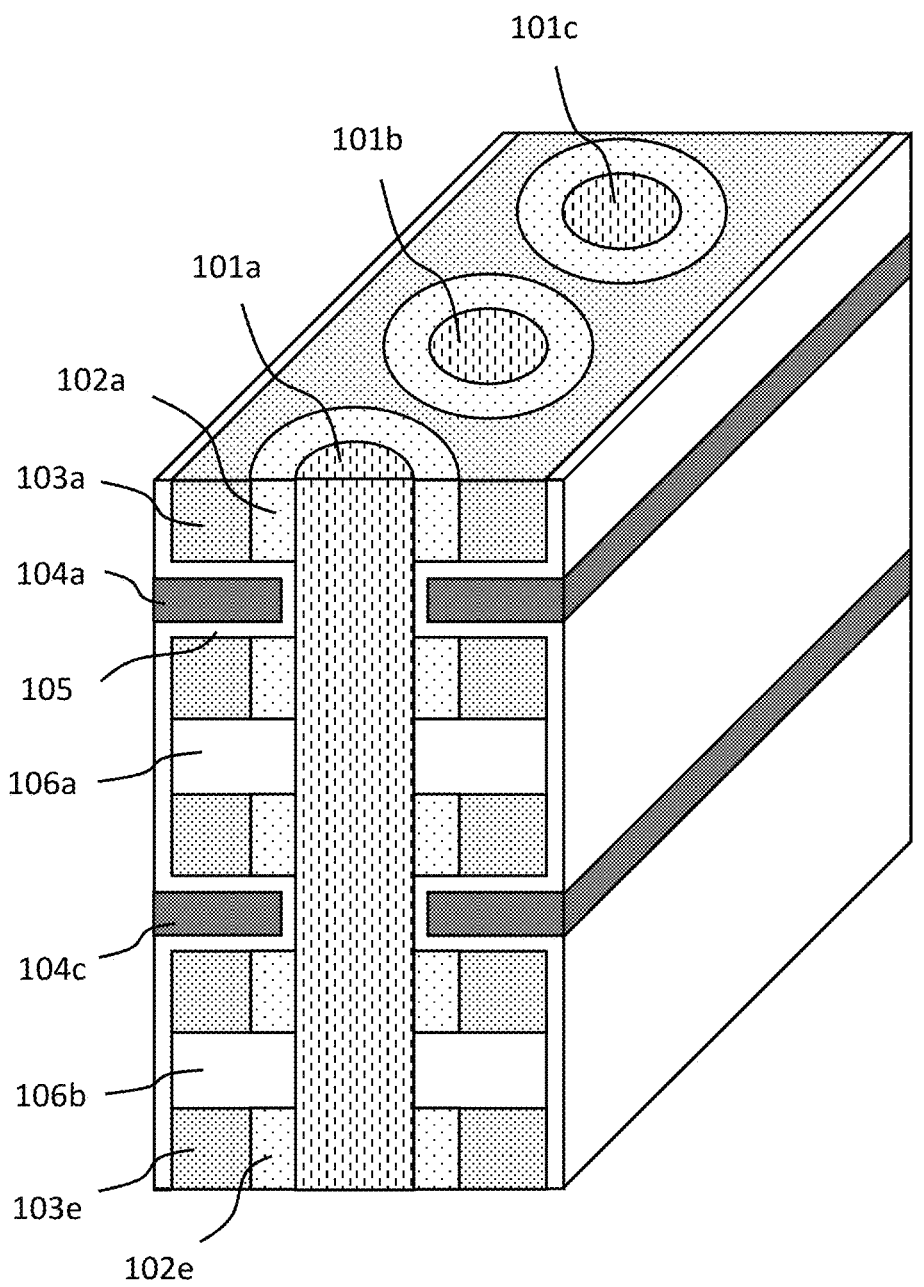
FIG. 1Q shows another embodiment of an array structure according to the invention.

FIG. 1Q shows another embodiment of an array structure according to the invention. This embodiment is similar to the embodiment shown in FIG. 1P except that the cells are single-gate transistors. Also shown in FIG. 1Q are insulating layers 106a and 106b that are formed from material, such as oxide.

Figures 1R, 1S:
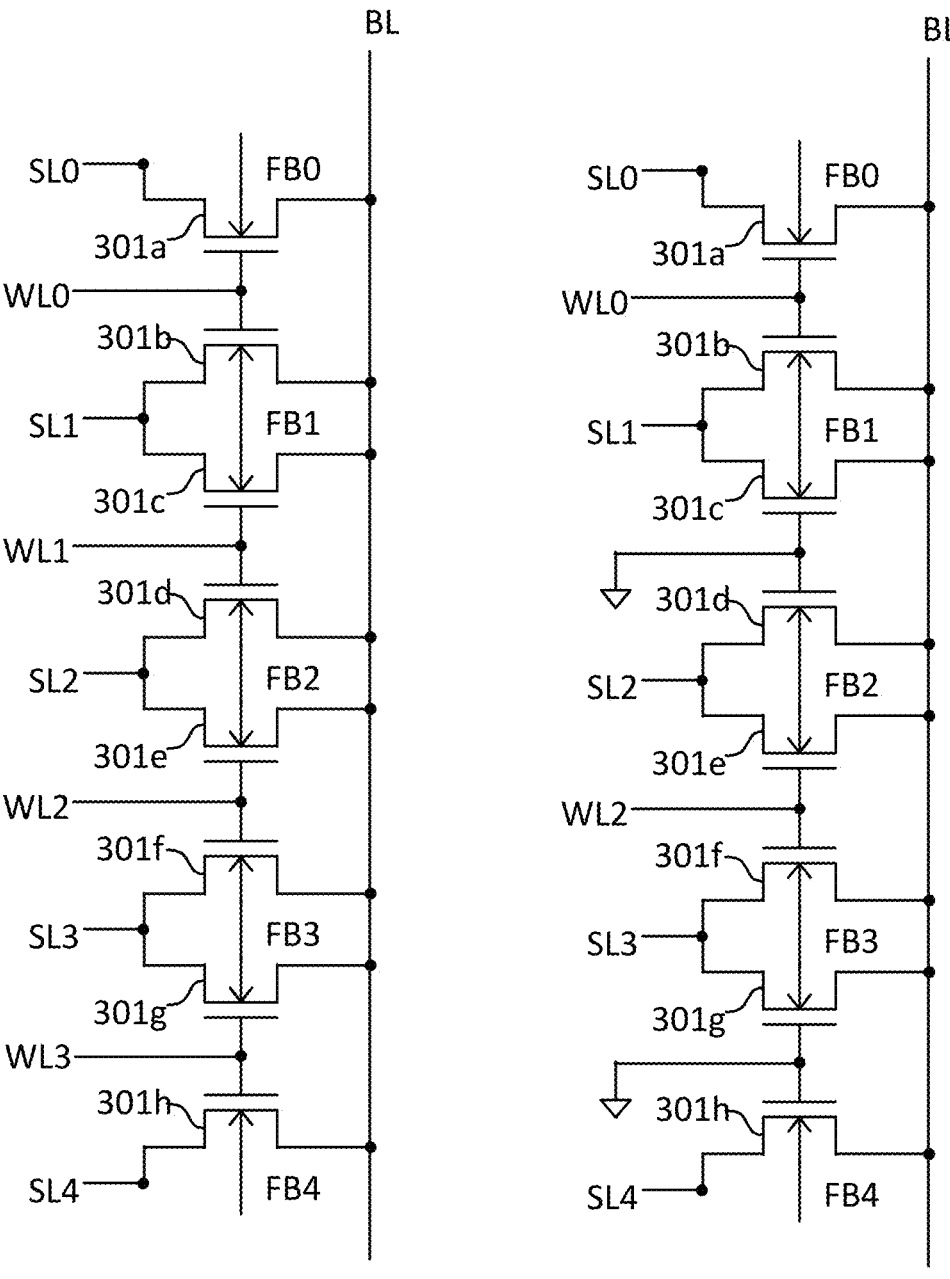
FIG. 1R shows an equivalent circuit diagram for the array structure shown in FIG. 1P.
FIG. 1S shows another embodiment of an equivalent circuit diagram of the array structure shown in FIG. 1P.

FIG. 1R shows an equivalent circuit diagram for the array structure shown in FIG. 1P. For example, the equivalent circuit shows transistors 301a-h that are formed by the array structure shown in FIG. 1P. Referring again to the array structure in FIG. 1P, the word line structures 104a to 104d are connected to word lines WL0-WL3. The floating bodies structures 102a to 102e are the floating bodies FB0-FB4. The source line structures 103a to 103e are connected to the source lines SL0-SL4, and the bit line structure 101a is a vertical bit line (BL). In this embodiment, each floating body (e.g., FB0-FB4) is coupled to two word lines. This array requires special bias conditions for read and write operations to avoid two cells being selected at the same time.

FIG. 1S shows another embodiment of an equivalent circuit diagram of the array structure shown in FIG. 1P. This embodiment is similar to the embodiment shown in FIG. 1R except that the odd word lines, WL1, WL3, and so on, are connected to ground. This turns off the transistors 301c, 301d, 301g, and 301h. In this embodiment, each floating body is coupled to one word line only. However, the storage capacity of this embodiment is reduced to one half when compared with the embodiment shown in FIG. 1R.

Figures 2A, 2B:
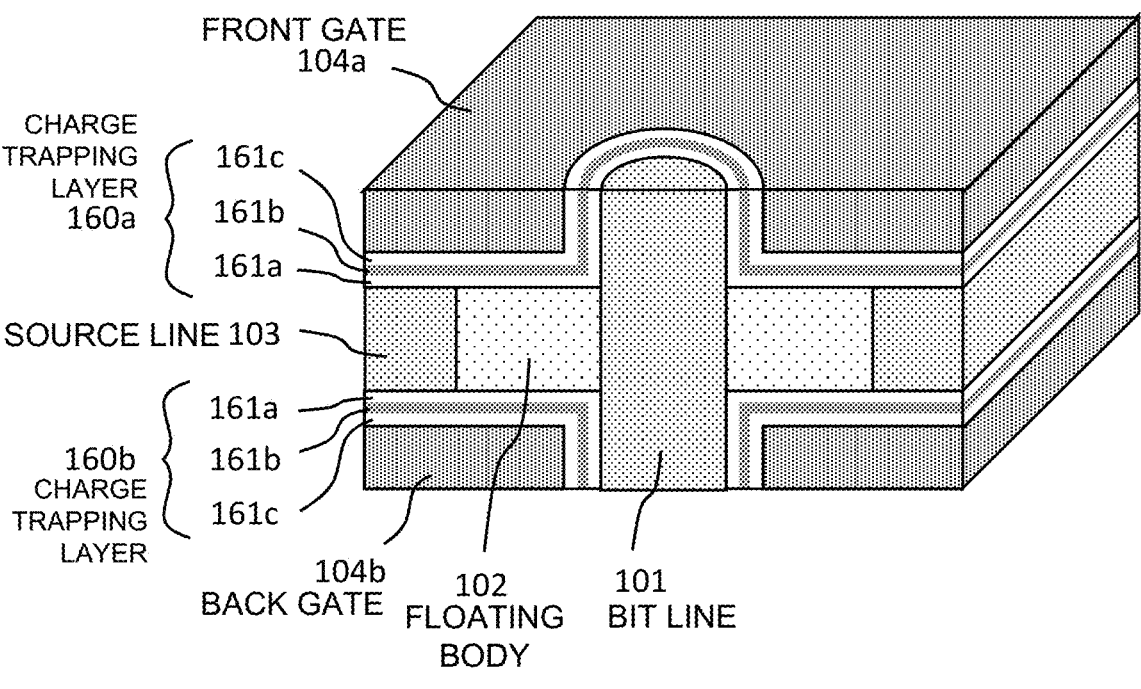
FIG. 2A show another embodiment of a cell structure for 3D NOR-type flash memory constructed according to the invention.
FIG. 2B shows an inner cell structure of the cell shown in FIG. 2A with selected portions removed.

FIG. 2A show another embodiment of a cell structure for a 3D NOR-type flash memory constructed according to the invention. This embodiment is similar to the embodiments shown in FIGS. 1A-B except that the gate dielectric layers 105a and 105b are replaced with charge trapping layers 160a and 160b that comprise oxide-nitride-oxide (ONO) layers. In one embodiment, the charge trapping layer 160b comprises a tunnel oxide layer 161a that is thin enough to allow electrons to tunnel through when a high electric field is applied. This changes the threshold voltage of the cells to represent the stored data. A nitride layer 161b traps electrons for data storage. A blocking oxide 161c is thick enough to prevent electrons from tunneling through to the gates 104a and 104b. In another embodiment, the blocking oxide 161c comprises a tunnel oxide layer and the tunnel oxide layer 161a comprises a blocking oxide layer. In this embodiment, during programming, electrons are injected from a selected one of the gates 104a or 104b to the nitride layer 161b.

FIG. 2B shows the inner cell structure of the cell shown in FIG. 2A with the front gate 104a, the charge trapping layer 160a, and a portion of the BL 101 removed.

Although ONO layers 161a-c shown in FIG. 2B are used as an example for the charge-trapping layers 160a and 160b, in other embodiments, the charge-trapping layers 160a and 160b comprise any suitable number of oxide layers and nitride layers. For example, in another embodiment, the charge-trapping layers 160a and 160b comprise oxide-nitride-oxide-nitride-oxide (ONONO) layers. In another embodiment, the charge-trapping layers 160a and 160b comprise only one oxide and one nitride (ON) layers. These variations are within the scope of the embodiments.

In various embodiments, the charge-trapping layers 160a and 160b are also utilized in the other cell embodiments shown in FIGS. 1A-L to replace the gate dielectric layers 105a and 105b to form different types of NOR flash memory cells.

Figures 2C, 2D:
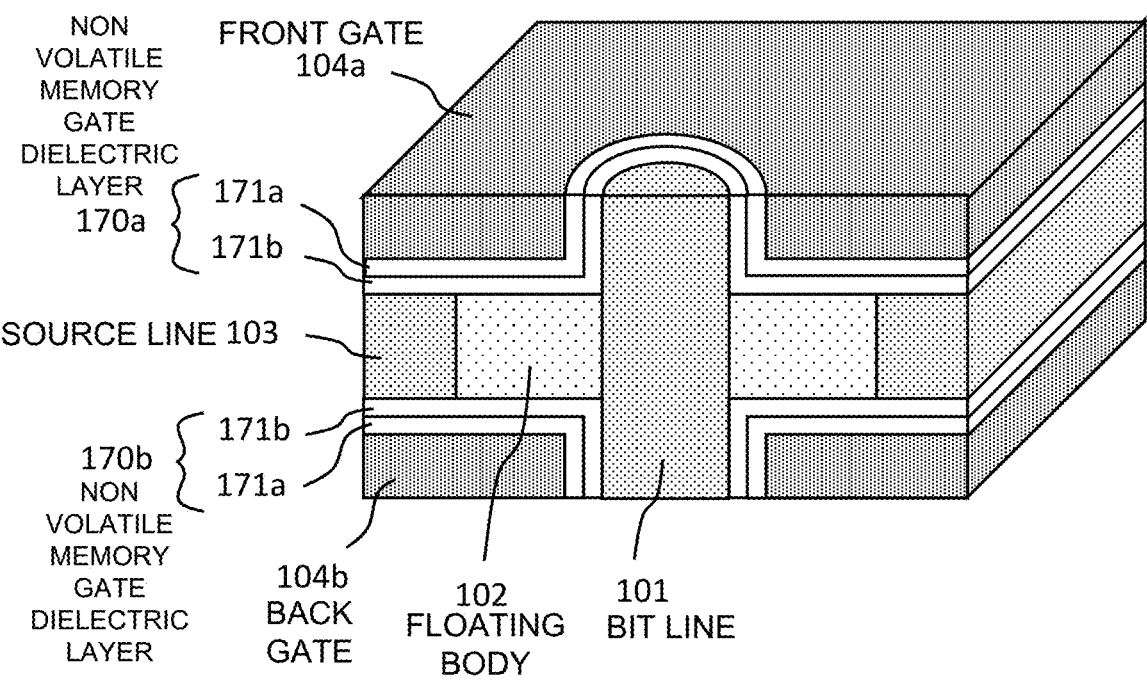
FIG. 2C show another embodiment of a cell structure for 3D non-volatile random-access memory constructed according to the invention.
FIG. 2D shows an inner cell structure of the embodiment shown in FIG. 2C with selected portions removed.

FIG. 2C show another embodiment of a cell structure for 3D non-volatile random-access memory constructed according to the invention. This embodiment is similar to the embodiments shown in FIGS. 1A-B except that the gate dielectric layers 105a and 105b are replaced with non-volatile memory gate dielectric layers 170a and 170b. In one embodiment, the non-volatile memory gate dielectric layers 170a and 170b comprise multiple layers, such as 171a and 171b.

FIG. 2D shows the inner cell structure of the embodiment shown in FIG. 2C with the front gate 104a, the non-volatile memory gate dielectric layer 170a, and a portion of the BL 101 removed.

In one embodiment that forms a ferroelectric random-access memory (FRAM), the non-volatile memory gate dielectric layer 170b comprises a ferroelectric layer 171a, such as lead zirconate titanate (PZT) or hafnium oxide (HfO2) in orthorhombic crystal phase, or hafnium zirconium oxide (HfZrO2). The layer 171b comprises a dielectric layer, such as hafnium oxide (HfO2). When high voltages are applied to the gates 104a and 104b, the generated electric field alters the pole of the ferroelectric materials in the ferroelectric layer 171a to change the threshold voltage of the cells to represent the stored data.

In another embodiment that forms a resistive random-access memory (RRAM), the non-volatile memory gate dielectric layers 170a and 170b comprise an adjustable resistive layer 171a, such as hafnium oxide (HfOx), titanium oxide (TiOx), or tantalum oxide (TaOx), and a dielectric layer 171b, such as silicon oxide (SiO₂). In another embodiment that forms a phase-change memory (PCM), the non-volatile memory gate dielectric layers 170a and 170b are formed of multiple layers comprising at least one phase-change layer 171a, such as Germanium Antimony Tellurium alloy or chalcogenide glass, Ge2Sb2Te5 (GST), and a heater layer 171b, such as tungsten (W), titanium (Ti), or polysilicon.

In another embodiment, that forms a magneto-resistive random-access memory (MRAM), the non-volatile memory gate dielectric layers 170a and 170 comprise multiple layers including ferromagnetic material 171a and 171b, such as iron-nickle (NiFe) or iron-cobalt (CoFe) alloys, and a tunnel-barrier layer formed such as hafnium oxide (HfO2) between the layers 171a and 171b. The materials of the non-volatile memory gate dielectric layers 170a and 170b described above are just some examples and any other suitable materials can be used for the non-volatile memory gate dielectric layers 170a and 170b within the scope of the embodiments.

The non-volatile memory gate dielectric layers 170a and 170b shown in this embodiment can be also utilized with all the other cell embodiments shown in FIG. 1A-L to replace the gate dielectric layers 105a and 105b to form various types of non-volatile random-access memory cells.

Figure 3A:
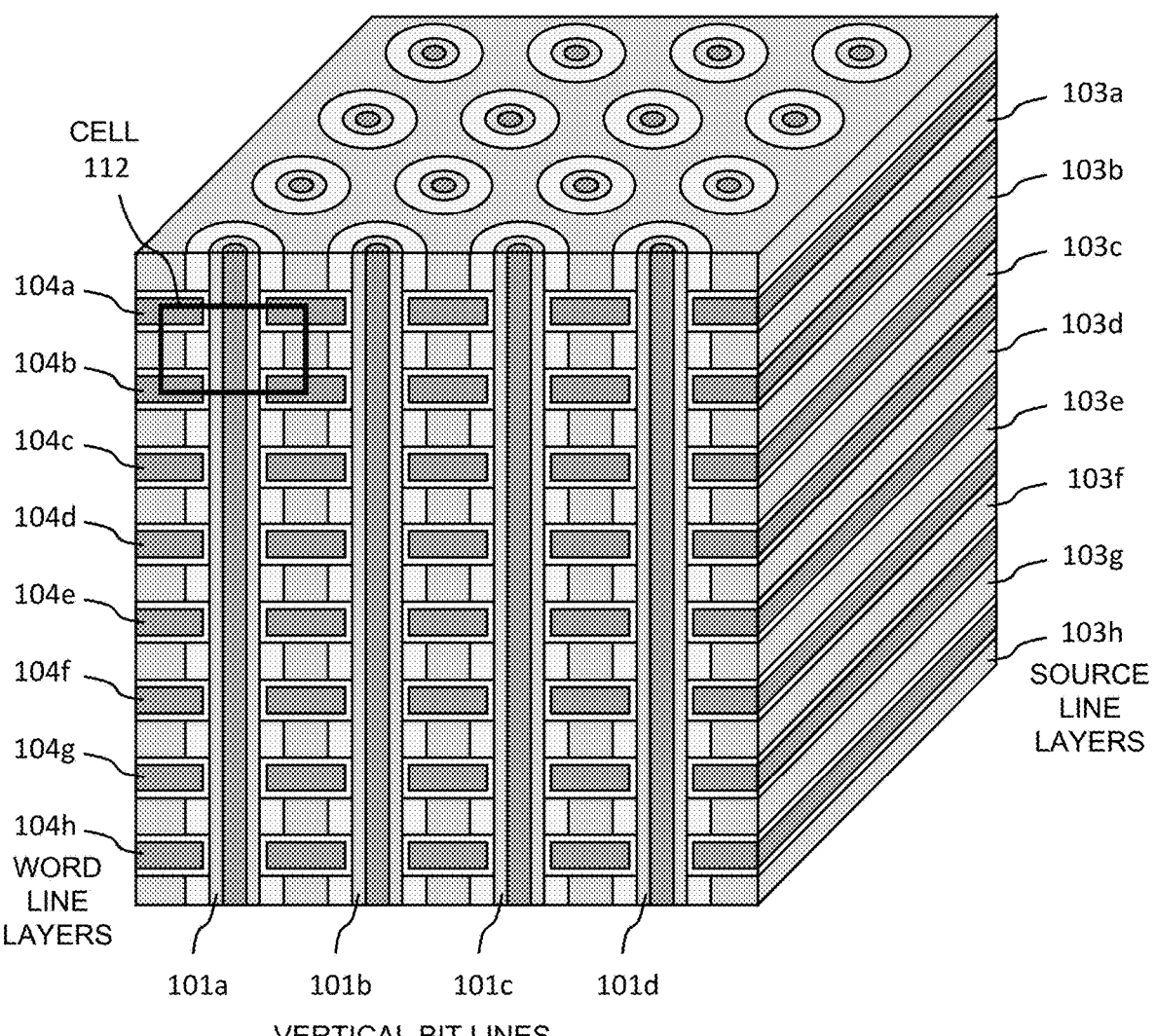
FIGS. 3A-B show embodiments of a 3D array structure constructed according to the invention.
Figure 3B:
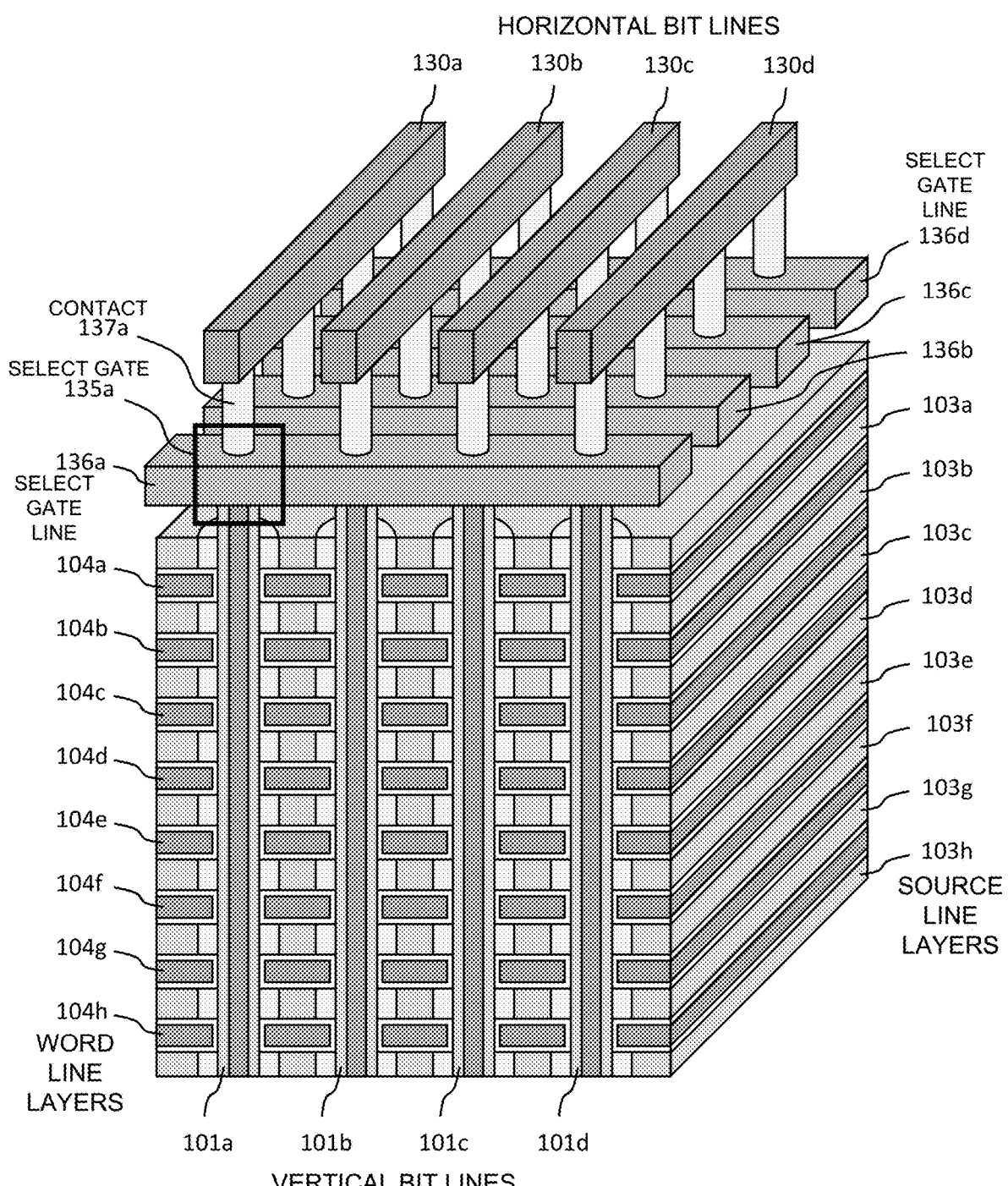

FIGS. 3A-B show embodiments of a 3D array structure constructed according to the invention. FIG. 3A shows a 3D array formed using the cell structures shown in FIGS. 1C-D. However, in other embodiments, the 3D array structure is formed utilizing any other cell structures shown in FIGS. 1A-2D. The 3D array comprises multiple layers of cells stacked vertically. The cells are connected to vertical bit lines, such as vertical bit lines 101a to 101d. The 3D array comprises multiple word line layers 104a to 104h that are connected to the gates of the cells. The 3D array also comprises multiple source line layers 103a to 103h. Each intersection of one of the vertical bit lines 101a to 101d and one of the source lines 103a to 103h form a cell, such as the cell 112.

FIG. 3B shows an embodiment of a bit line connections to the 3D array structure shown in FIG. 3A that are constructed according to the invention. The vertical bit lines 101a to 101d are connected to horizontal bit lines 130a to 130d through select gates, such as select gate 135a and contacts, such as contact 137a. The horizontal bit lines 130a to 130d are formed of conductor material, such as metal or heavily doped polysilicon. The select gates, such as select gate 135a, are formed of vertical-channel transistors. Select gate lines 136a to 136d are connected to control gates of the vertical channel select gates, such as select gate 135a.

The word line layers 104a to 104h and source line layers 103a to 103h are connected to the word line decoders (not shown) and source line voltage generators (not shown), respectively, by forming staircase structures for the word lines and the source lines at the edge of the array as structured in a conventional 3D NAND flash memory.

The 3D array structure can be utilized in various 3D NOR-type memory applications, such as dynamic random-access memory (DRAM) using floating-body cell (FBC), NOR-type flash memory, ferroelectric random-access memory (FRAM), resistive random-access memory (RRAM), phase change memory (PCM), and magneto-resistive random-access memory (MRAM).

Moreover, the 3D array structure can be applied to in-memory computing and 3D neural network arrays for artificial intelligence (AI) applications. For these applications, the vertical bit line 101a to 101d, word line layers 104a to 104h, and the source line layers 103a to 103h are connected to input neuron circuits and output neuron circuits. Besides these applications, the novel 3D cell and array structures constructed according to the invention are suitable for use in any other applications.

FIGS. 4A-F show embodiments of brief process steps used to form the floating-body cell structure shown in FIGS. 1A-B according to the invention.

Figures 4A, 4B:
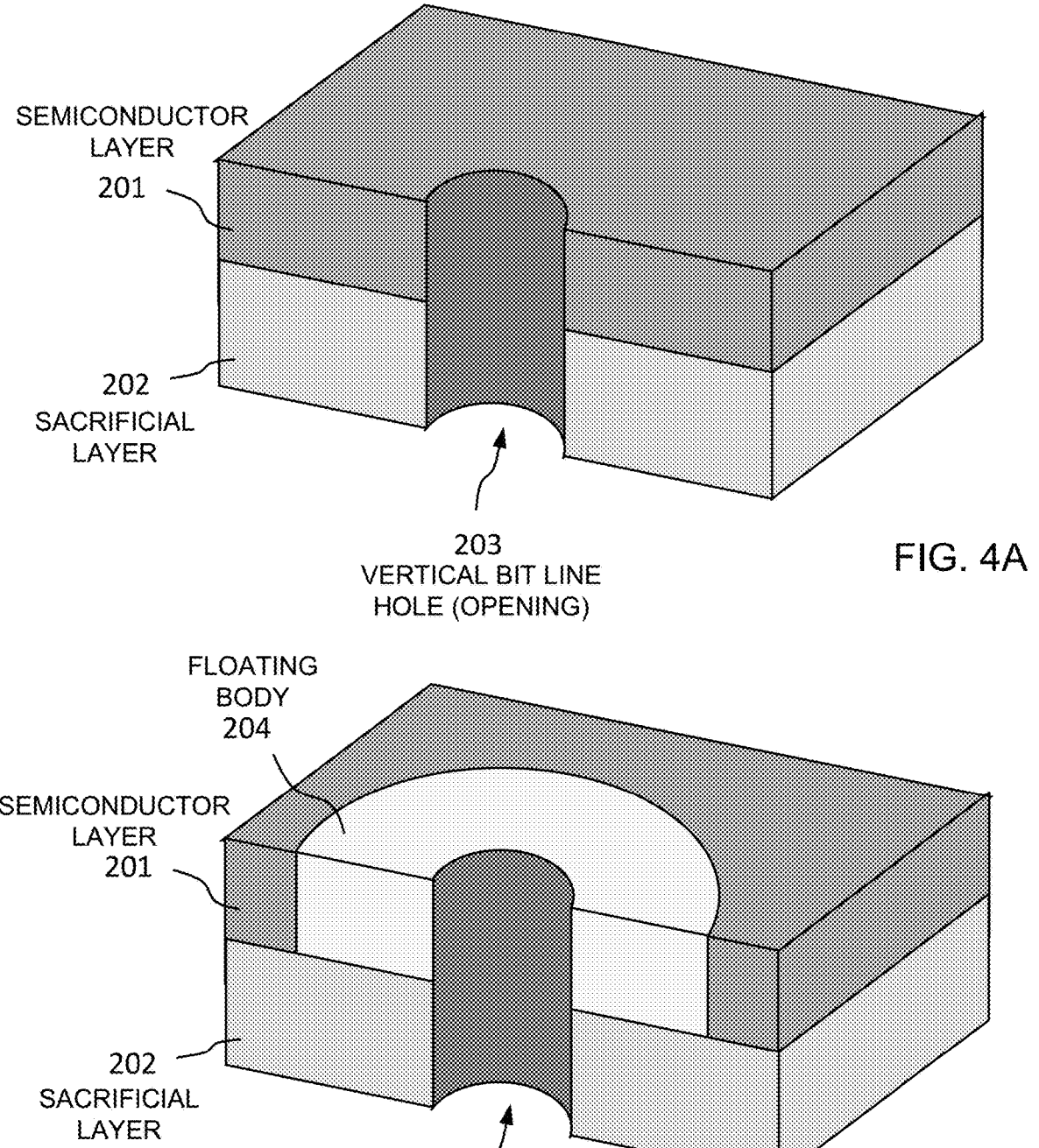
FIGS. 4A-F show embodiments of brief process steps used to form the floating-body cell structure shown in FIGS. 1A-B according to the invention.

FIG. 4A shows how multiple semiconductor layers 201, such as polysilicon or silicon and multiple sacrificial (or insulating) layers 202, such as oxide or nitride are alternately deposited to form a stack. For illustration, FIG. 4A only shows one semiconductor layer 201 and one sacrificial layer 202 but any number of semiconductor layers 201 and sacrificial layers 202 can be alternately deposited to form the stack.

In one embodiment, the semiconductor layers 201 are formed of amorphous silicon by using atomic layer deposition (ALD), plasma-enhanced atomic layer deposition (PE-ALD), or any other suitable deposition processes, such as chemical vapor deposition (CVD), physical vapor deposition (PVD), low pressure chemical vapor deposition (LPCVD), plasma-enhanced chemical vapor deposition (PECVD), or any other suitable process.

After deposition, an annealing process is applied to transfer the amorphous silicon into polycrystalline silicon (polysilicon). In one embodiment, the annealing process uses low-temperature rapid thermal annealing, such as 4 minutes at 700 degrees Celsius. It should be noted that any other suitable annealing process can be utilized.

The semiconductor layers 201 are doped by using an in-situ doping process during the deposition. For NMOS cells, N– type dopants, such as phosphine (PH3) or arsine (AsH3), are added during the deposition. For PMOS cells, P– type dopants, such as diborane (B2H6) are added during the deposition.

In another embodiment, the semiconductor layers 201 are formed by using a polysilicon deposition processes, such as high thermal decomposition of silane (SiH4) at 580 to 650 degrees Celsius. This process forms the polysilicon layers on the surface of the insulating layers 202 and releases hydrogen (H2).

In another embodiment, the semiconductor layers 201 are formed by using a silicon epitaxial growth process to form single-crystalline silicon (mono-silicon) on the surface of the sacrificial layers 202. However, this process may take a longer process time because the silicon layers need to be grown layer by layer.

The sacrificial layers 202 are formed by using deposition processes, such as atomic layer deposition (ALD), plasma-enhanced atomic layer deposition (PE-ALD), or any other suitable deposition processes, such as chemical vapor deposition (CVD), physical vapor deposition (PVD), low pressure chemical vapor deposition (LPCVD), plasma-enhanced chemical vapor deposition (PECVD), or any other suitable process.

After the multiple-layer stack is formed, multiple vertical bit line holes (or opening) 203 are formed by using photolithography steps to define a pattern, and then using anisotropic etching processes, such as deep trench process or dry etch process to etch through the multiple semiconductor layers 201 and the sacrificial layers 202 of the stack to form the vertical bit line hole 203.

FIG. 4B shows how a floating body 204 is formed in the semiconductor layer 201 by using gas-phase doping or collisional plasma doping (PLAD) or plasma immersion ion implantation (PIII), or any other suitable doping processes. For NMOS cells, diborane and hydrogen (B2H6/H2) plasma are used to implant boron ions through the vertical bit line holes 203 into the N– type semiconductor layers 201 to reverse the doping to form a P– floating body 204. For PMOS cells, phosphine (PH3) or Arsine (AsH3) plasma is used to implant phosphorus or Arsenic ions into the P– type semiconductor layers 201 to reverse the doping to form a N– floating body 204.

Figure 4C:
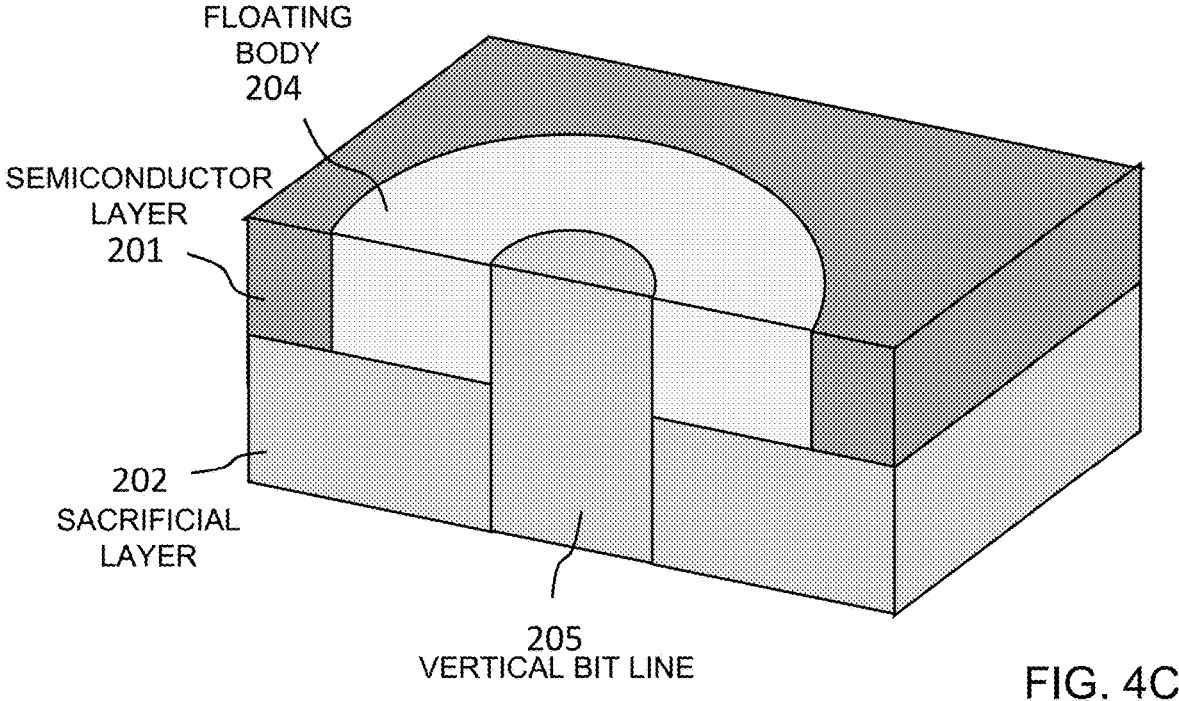

FIG. 4C shows how the vertical bit line holes 203 (e.g., shown in FIG. 4B) are filled with semiconductor material, such as heavily doped polysilicon to form a vertical bit lines 205. The semiconductor may be deposited by using any suitable deposition processes, such as atomic layer deposition (ALD), plasma-enhanced atomic layer deposition (PE-ALD), chemical vapor deposition (CVD), physical vapor deposition (PVD), low pressure chemical vapor deposition (LPCVD), plasma-enhanced chemical vapor deposition (PECVD), or any other suitable process. The semiconductor of the bit lines 205 is doped with the same type of heavy doping used for the semiconductor layers 201 by using an in-situ doping process. For NMOS cells, N– type dopants, such as phosphine (PH3) or arsine (AsH3) are added during the deposition of the vertical bit line 205. For PMOS cells, P– type dopants, such as diborane (B2H6) are added during the deposition of the vertical bit line 205.

Figure 4D:
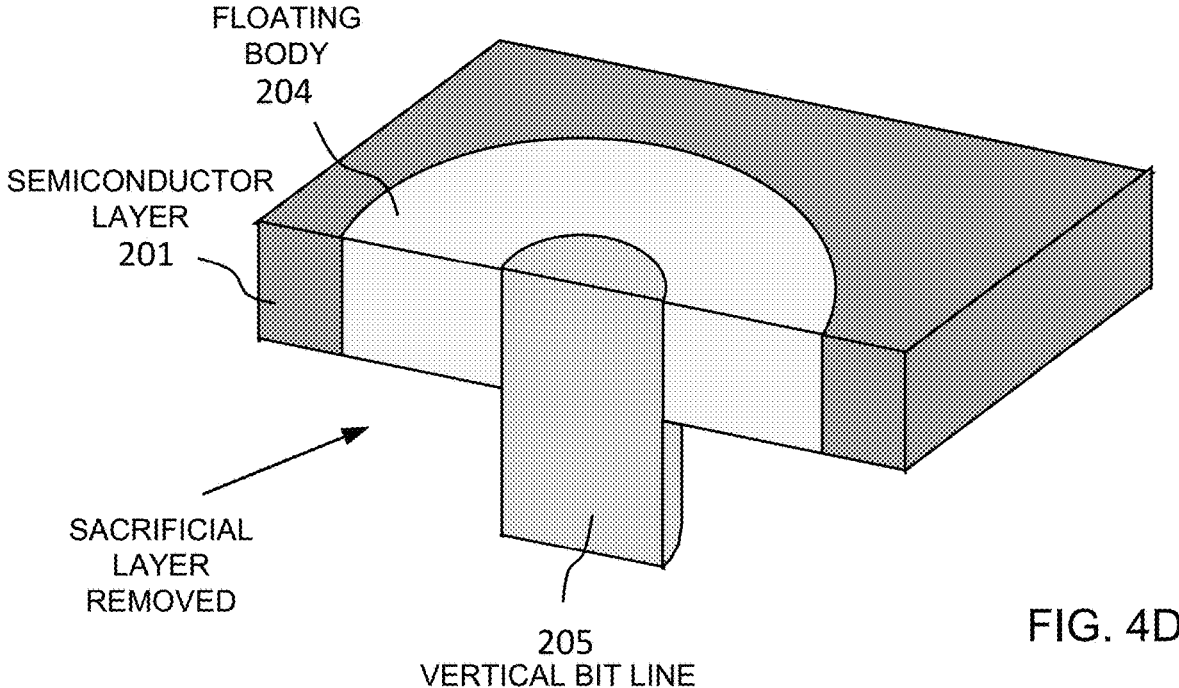

FIG. 4D shows how the sacrificial layers 202 are selectively removed by using an isotropic etching process, such as wet etching. If the sacrificial layers 202 are oxide layers (SiO2), they can be etched by using buffered hydrofluoric acid (HF), ammonium acid (NH4F) or a mixture of hydrofluoric acid (HF) and nitric acid (HNO3). If the sacrificial layers 202 are nitride layers (Si3N4), they can be etched by using concentrated hot orthophosphoric acid (H3PO4) at a temperature of 150 to 180 degrees Celsius.

Figure 4E:
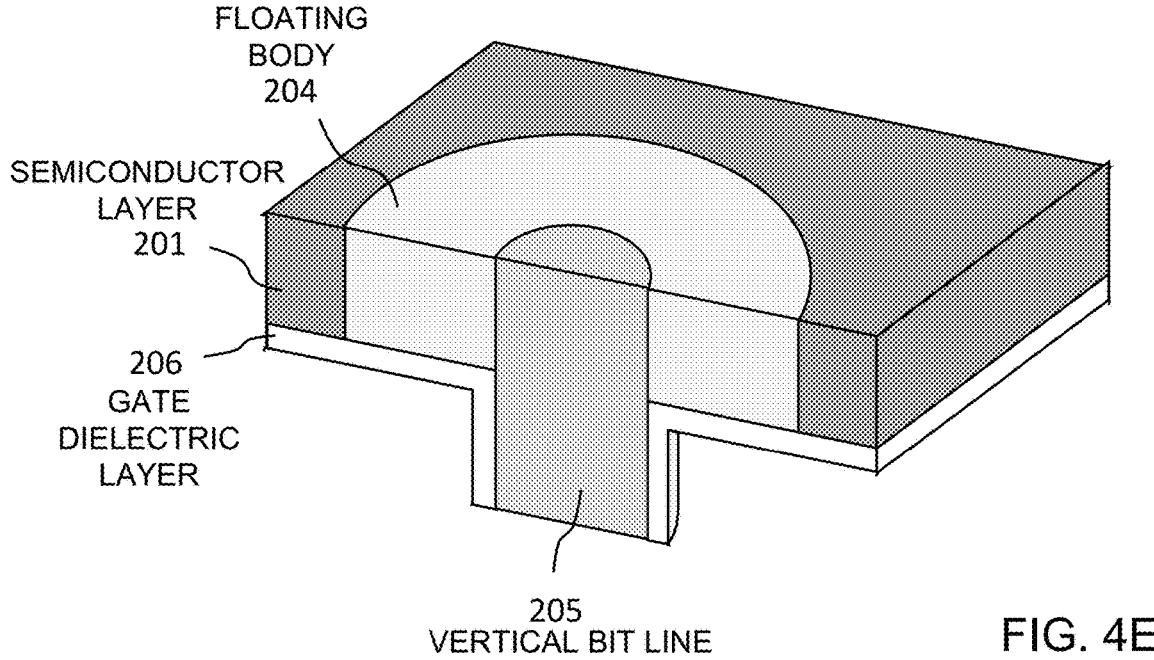

FIG. 4E shows how a gate dielectric layer 206, comprising a gate oxide (SiO2) layer or a high-K material layer, such as hafnium oxide (HfO2), zirconium oxide (ZrO2), or titanium oxide (TiO2) is formed on the exposed surfaces of the semiconductor layer 201, floating body 204, and around the vertical bit line 205 that were previously covered by the sacrificial layer 202. The gate dielectric layer 206 is formed by using thermal oxidation or dry oxidation to grow a silicon oxide (SiO2) layer on the exposed surfaces of the semiconductor layers 201, the floating body 204, and around the vertical bit lines 205, or by using atomic layer deposition (ALD), plasma-enhanced atomic layer deposition (PE-ALD), or any other suitable deposition processes to deposit a thin layer of the gate dielectric material on the exposed surfaces of the semiconductor layers 201, the floating body 204, and around the vertical bit lines 205.

Figure 4F:
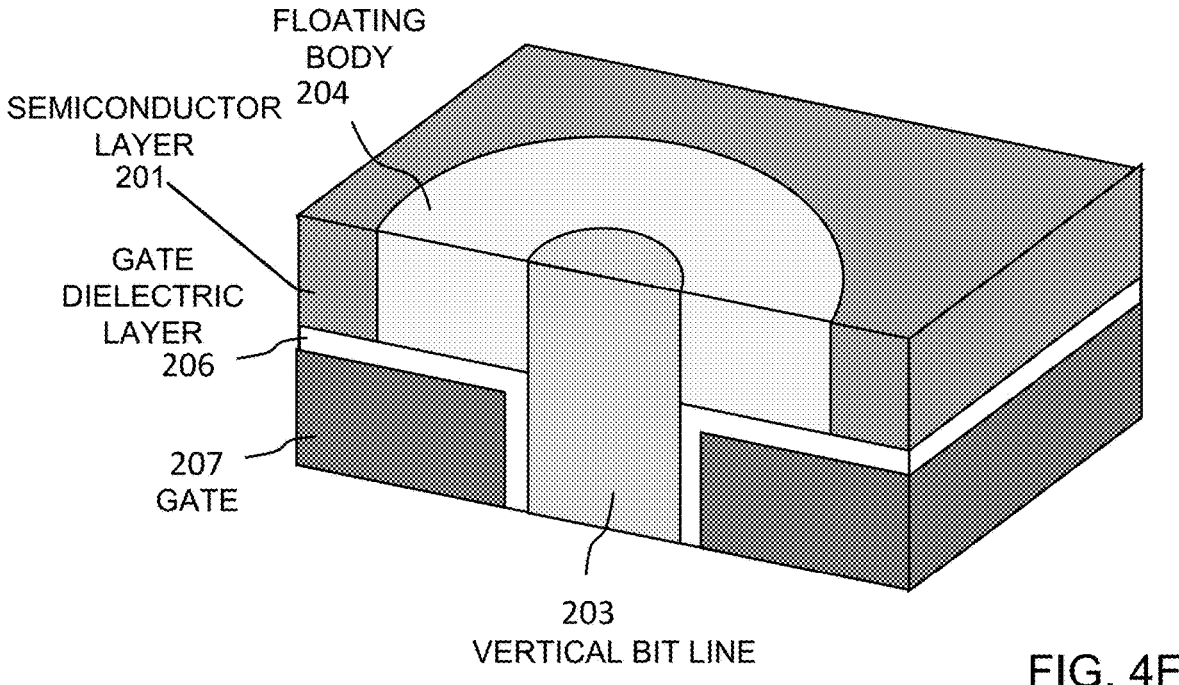

FIG. 4F shows how the spaces (or regions) that were previously occupied by the sacrificial layers 202 are filled with metal, such as tungsten (W), tantalum (Ta), titanium (Ti), niobium (Nb) for NMOS cells, or ruthenium (Ru) for PMOS cells, or the composite of metal nitride such as WN, TaN, and TiN, or heavily doped polysilicon to form gates 207 of the cell transistors. The gates 207 are formed by using deposition processes, such as atomic layer deposition (ALD), plasma-enhanced atomic layer deposition (PE-ALD), chemical vapor deposition (CVD), physical vapor deposition (PVD), low pressure chemical vapor deposition (LPCVD), plasma-enhanced chemical vapor deposition (PECVD), or any other suitable processes. As a result of the above operations, the floating-body cell structure shown in FIGS. 1A-B is formed.

Figure 4G:
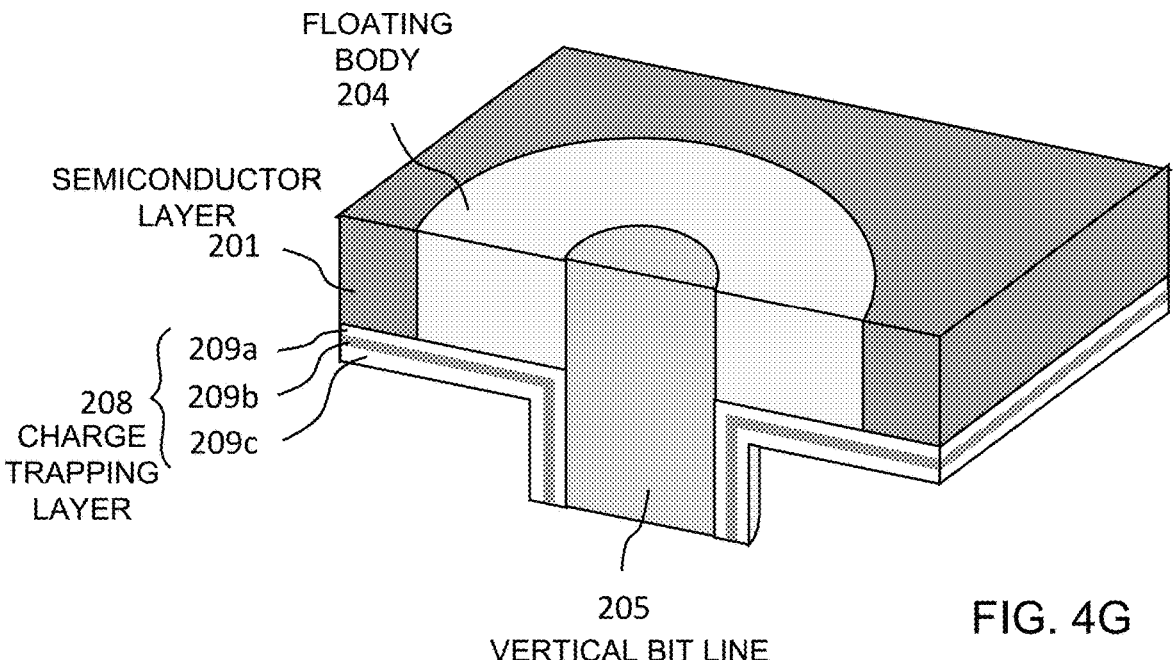
FIGS. 4G-H show another embodiment of brief process steps used to form the cell structure of the 3D NOR-type flash memory shown in FIGS. 2A-B.
Figure 4H:
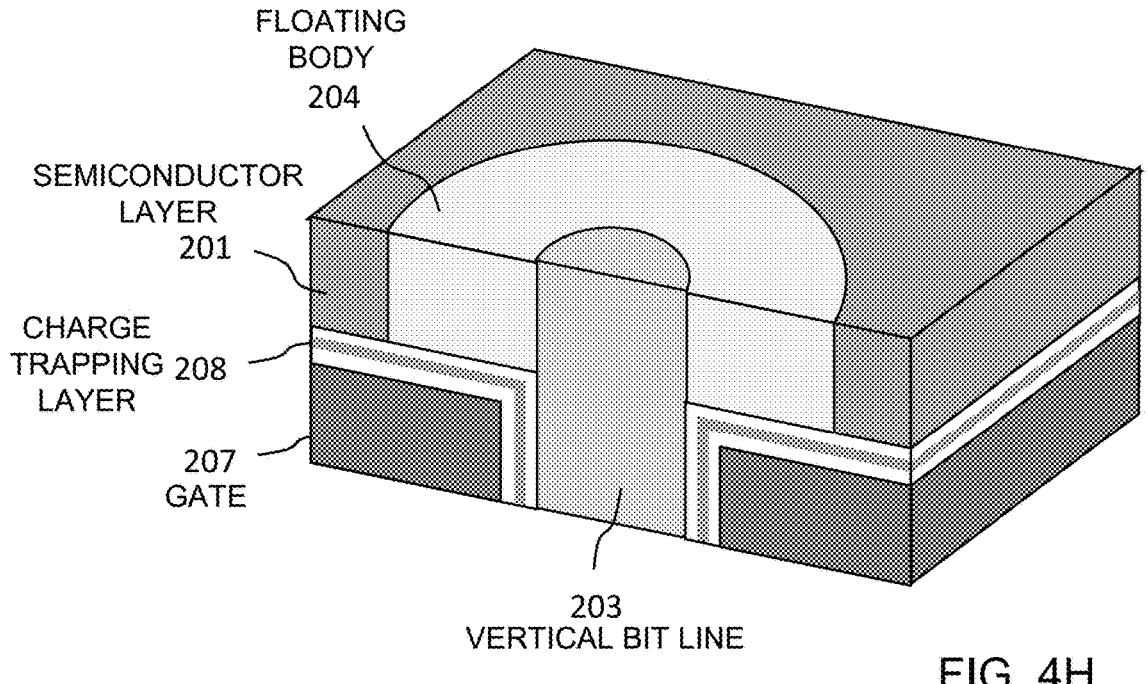

FIGS. 4G-H show another embodiment of brief process steps used to form the cell structure of the 3D NOR-type flash memory shown in FIGS. 2A-B. In this embodiment, FIG. 4G shows a process step that is performed after the process step shown in FIG. 4D. In FIG. 4G, a charge-trapping layer 208, such as oxide-nitride-oxide (ONO) layer, which comprises a tunnel oxide layer 209a, a nitride layer 209b, and a blocking oxide layer 209c is formed in the region previously occupied by the sacrificial layers 202 on the exposed surfaces of the semiconductor layers 201, the floating body 204, and around the vertical bit lines 205. The charge-trapping layer 208 is formed by using atomic layer deposition (ALD), plasma-enhanced atomic layer deposition (PE-ALD), or any other suitable deposition processes to deposit the ONO layers one by one.

FIG. 4H shows how the spaces (or regions) that were previously occupied by the sacrificial layers 202 are filled with the gate materials described in FIG. 4F, such as metal or heavily doped polysilicon to form the gate 207. As a result of the above operations, the NOR-type flash memory cell structure shown in FIGS. 2A-B is formed.

In another embodiment, the process steps shown in FIGS. 4G-H are applied to form the cell embodiments of FRAM, RRAM, MRAM, or PCM as shown in FIGS. 2C-D by using different materials and structures for the non-volatile memory gate dielectric layers 170a/170b as a replacement for the charge-trapping layer 208. FIGS. 2C-D provide detailed descriptions for forming the non-volatile memory gate dielectric layers 170a and 170b.

FIGS. 5A-H show embodiments of brief process steps to form the floating-body cell structure shown in FIGS. 1C-D according to the invention.

Figures 5A, 5B:
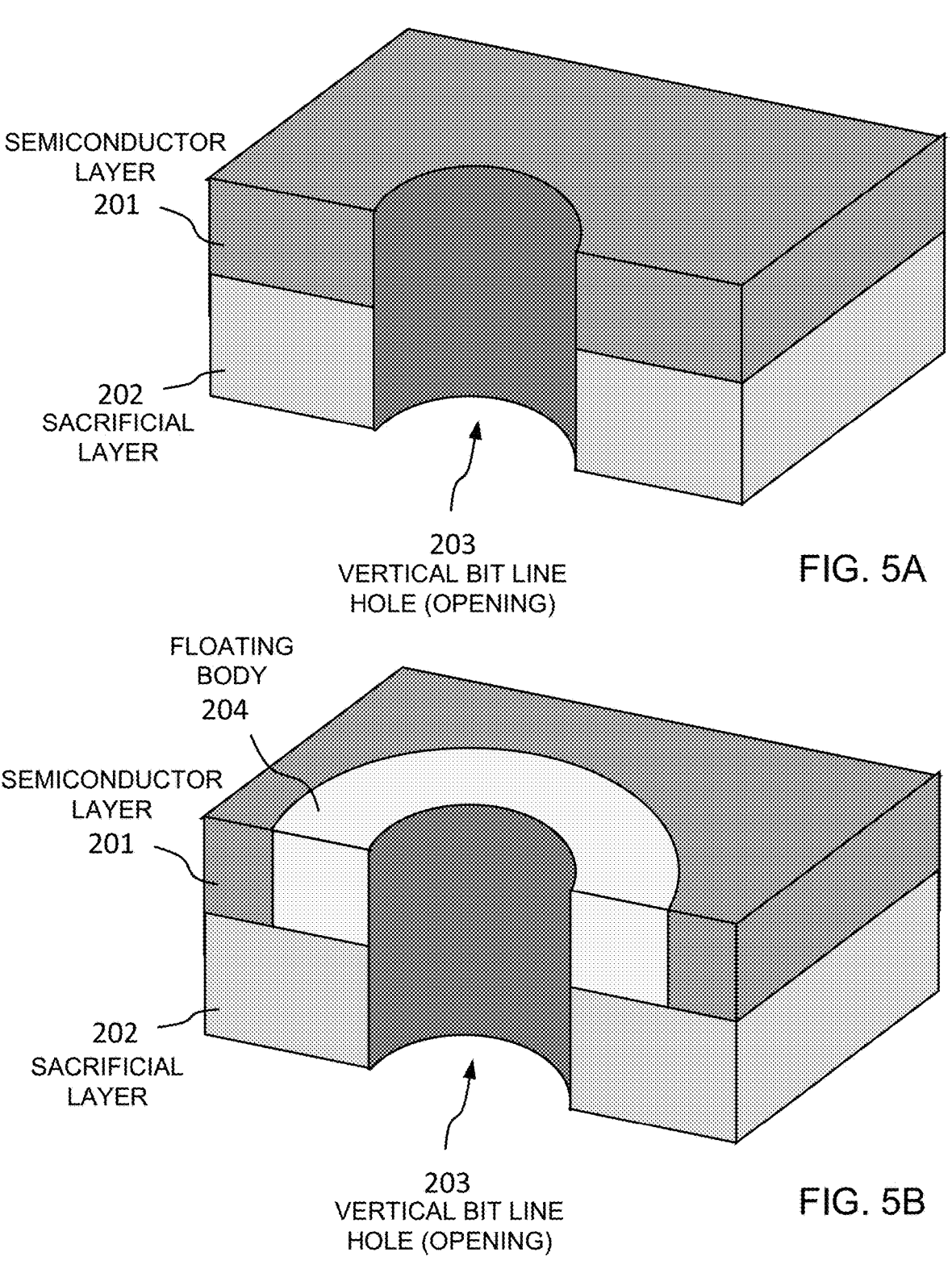
FIGS. 5A-H show embodiments of brief process steps to form the floating-body cell structure shown in FIGS. 1C-D according to the invention.

FIG. 5A shows how multiple semiconductor layers 201, such as polysilicon or silicon and multiple sacrificial layers 202, such as oxide or nitride are alternately deposited to form a stack. After that, multiple vertical bit line holes 203 are patterned by using lithography steps and using an anisotropic etching process, such as deep trench to etch through the multiple layers of the stack to form a vertical bit line hole (or opening) 203.

FIG. 5B shows how a plasma doping (PLAD) or gas-phase doping process is applied through the vertical bit line holes 203 to dope the semiconductor layers 201 with the opposite type of dopants as used in the semiconductor layers 201 to form a floating body 204. For example, if the semiconductor layers 201 has N– type of dopants, such as phosphorus, the plasma doping process uses P– type of dopants, such as boron to form a P– type floating body 204. The process steps shown in FIGS. 5A-B are as the same as those shown in FIGS. 4A-B. The reader is referred to FIGS. 4A-B for a detailed description.

Figures 5C, 5D:
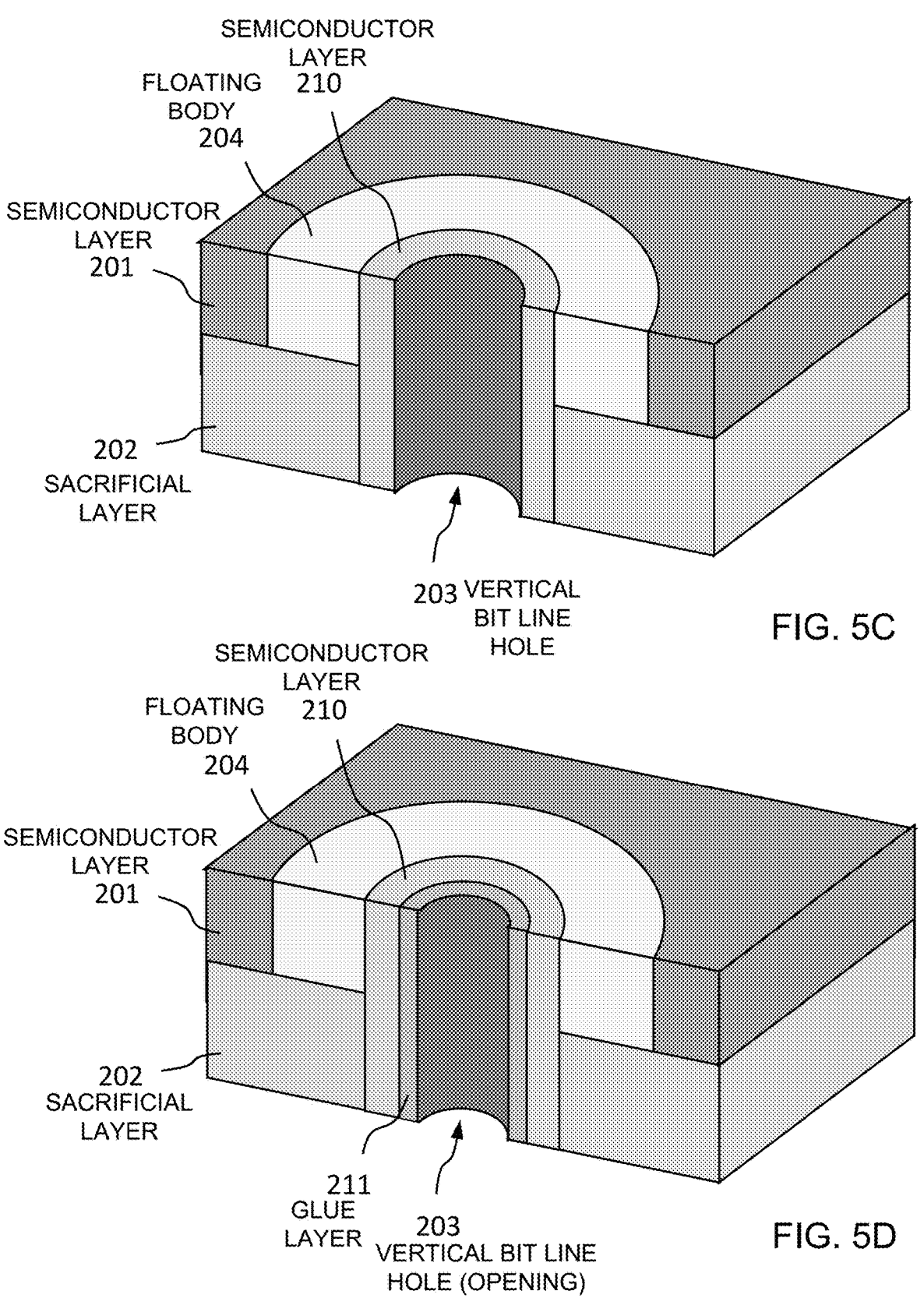

FIG. 5C shows how a semiconductor layer 210, such as polysilicon or silicon is formed on the sidewall of the vertical bit line holes 203 by using the deposition processes described in FIG. 4A, such as atomic layer deposition (ALD), plasma-enhanced atomic layer deposition (PE-ALD), or any other suitable deposition processes, or using epitaxial growth processes to grow a single-crystalline silicon layer. The semiconductor layer 210 is then doped with the same type of heavy doping as the semiconductor layers 201 by using an in-situ doping process. For NMOS cells, N– type dopants, such as phosphine (PH3) or arsine (AsH3) are added during the deposition of the semiconductor layer 210. For PMOS cells, P– type dopants, such as diborane (B2H6) are added during the deposition of the semiconductor layer 210.

FIG. 5D shows how a glue layer 211, such as titanium and titanium nitride (Ti/TiN) layer is formed on the sidewall of the semiconductor layer 210 to prevent peeling of metal bit lines that are added in a future step and thus improve the reliability. The TiN and Ti layers are formed by using chemical a vapor deposition (CVD) and an ion metal plasma (IMP) physical vapor deposition (PVD) process, respectively. As a result of the operations performed with respect to FIGS. 5C-D, the size of the vertical bit line hole 203 is reduced by the thickness of the semiconductor layer 210 and the glue layer 211. It should be noted that in this embodiment and other embodiments within this disclosure, the use of a glue layer, such as glue layer 211 is optional, and if desired, can be omitted.

Figure 5E:
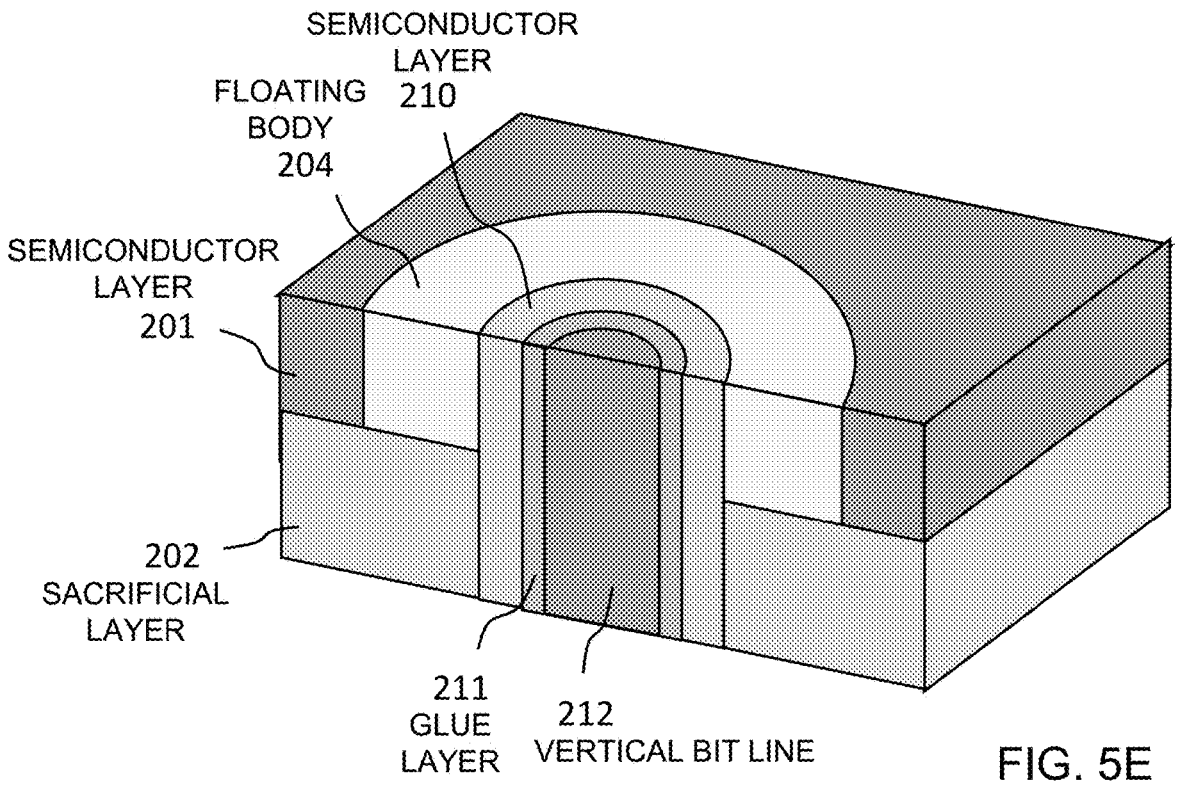

FIG. 5E shows how the vertical bit line holes 203 (that are reduced in size due to the layers 210 and 211) are filled with high melting point metal, such as tungsten (W) to form vertical bit lines 212. The tungsten is deposited by using any suitable deposition processes, such as chemical vapor deposition (CVP) reaction with tungsten hexafluoride (WF6) plus hydrogen (H2) and silane (SiH4). The metal bit lines 212 provide reduced the bit line resistance compared with other embodiments that use semiconductor bit lines, such as bit line 205 shown in FIG. 4C.

Figure 5F:
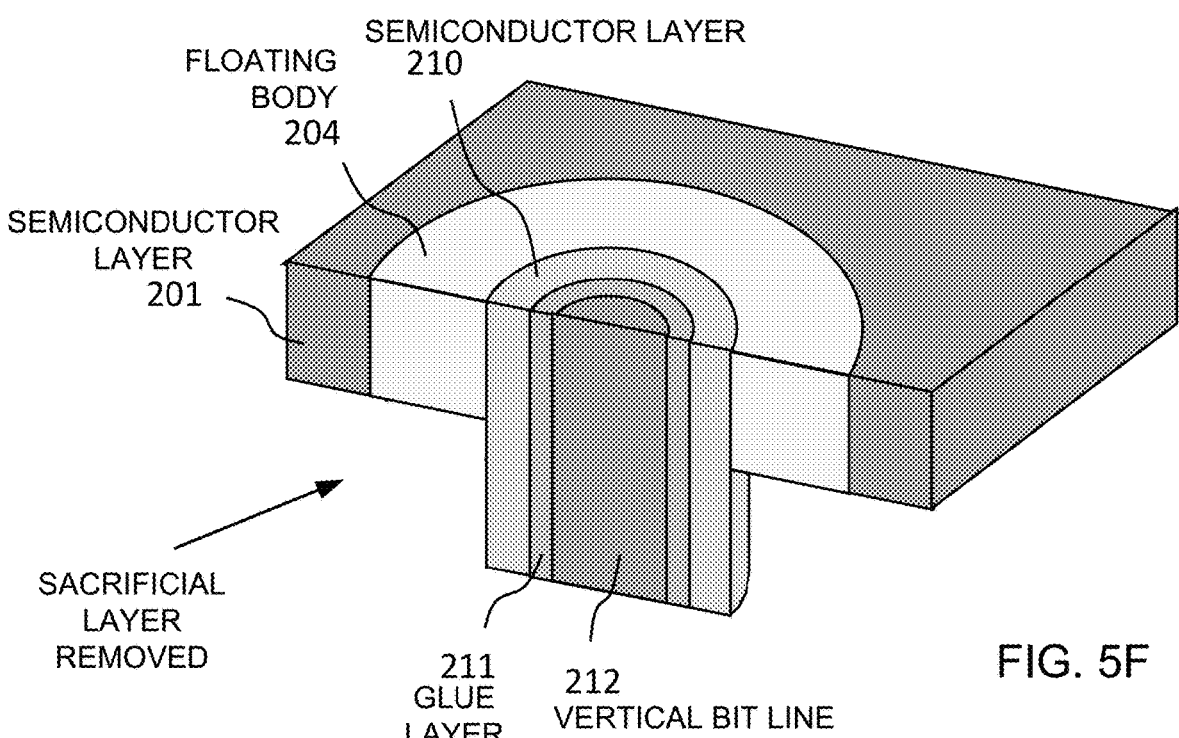

FIG. 5F shows how the sacrificial layers 202 is selectively removed by using an isotropic etching process, such as wet etching.

Figure 5G:
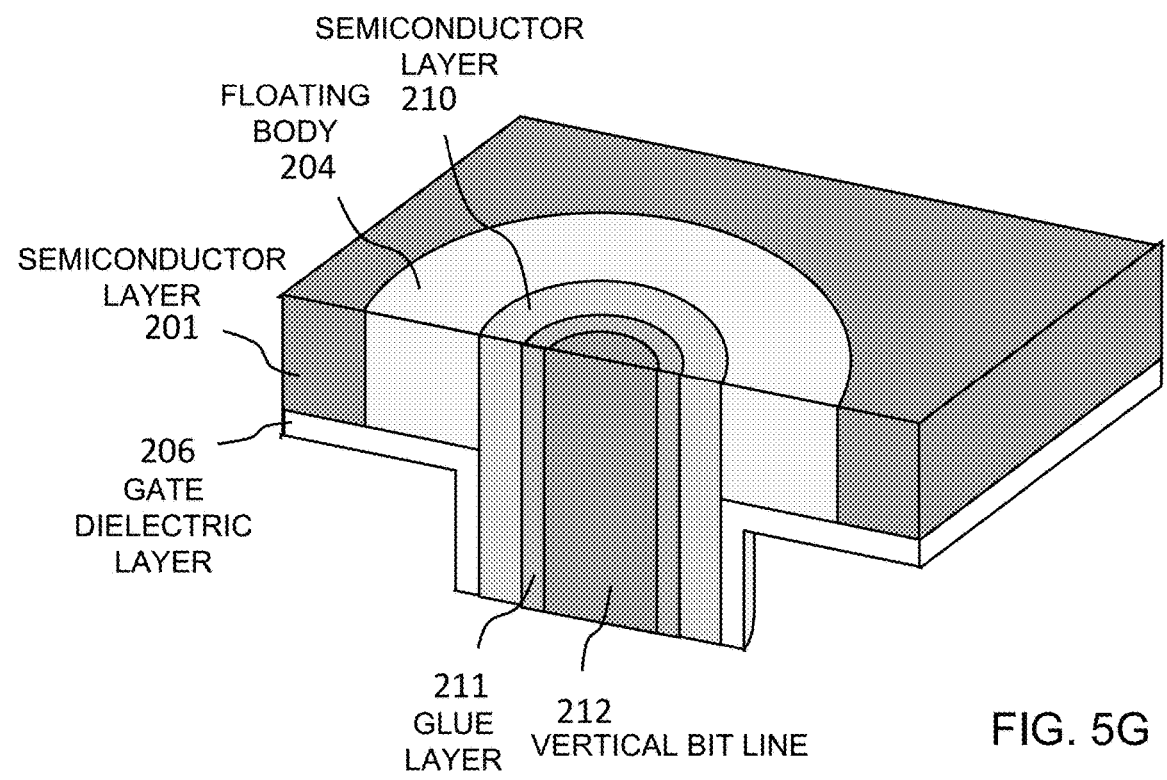

FIG. 5G shows how a gate dielectric layer 206 comprising a gate oxide (SiO2) layer or a high-K material layer, such as hafnium oxide (HfO2), zirconium oxide (ZrO2), or titanium oxide (TiO2) is formed on the exposed surfaces of the semiconductor layer 201, floating body 204, and around the semiconductor layer 210 that were previously covered by the sacrificial layer 202.

Figure 5H:
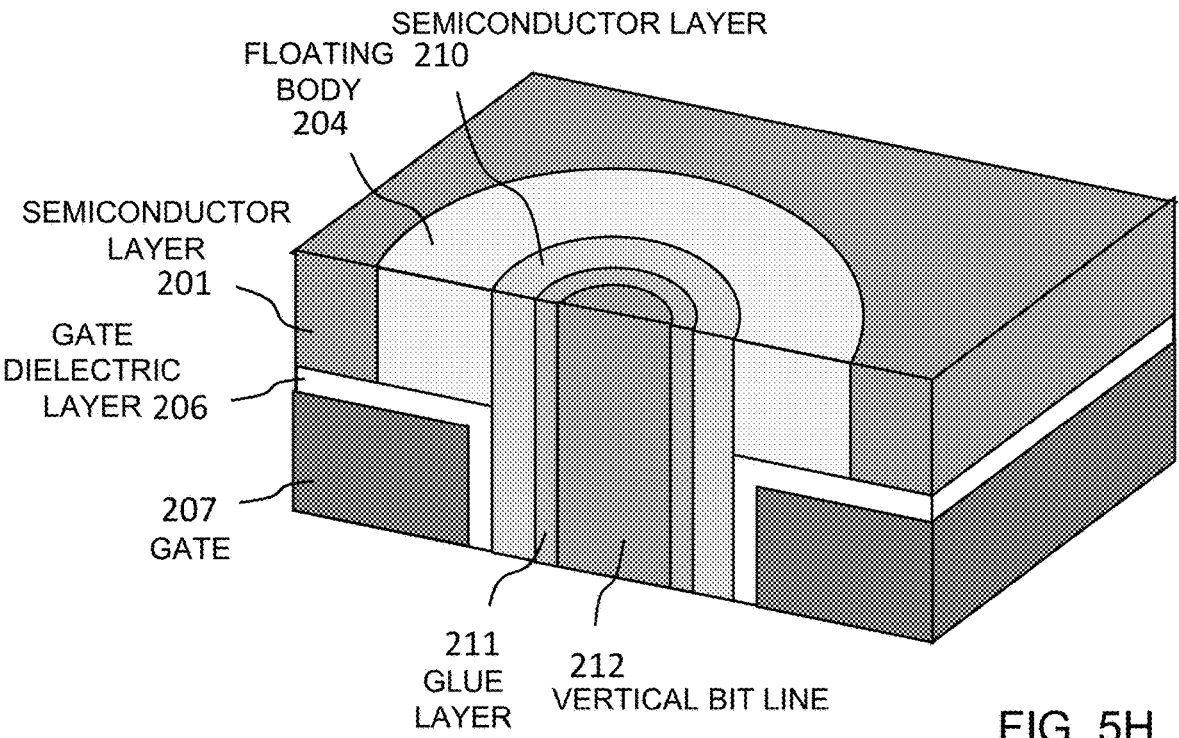

FIG. 5H shows how the spaces (or regions) that were previously occupied by the sacrificial layers 202 are filled with metal, such as tungsten (W), tantalum (Ta), titanium (Ti), niobium (Nb) for NMOS cells, or ruthenium (Ru) for PMOS cells, or the composite of metal nitride such as WN, TaN, and TiN, or heavily doped polysilicon to form gates 207 of the cell transistors. The process steps shown in FIGS. 5F-H are as the same as the step shown in FIGS. 4D-F. The reader is referred to FIGS. 4D-F for a detailed description. As a result of the above operations, the floating-body cell structure shown in FIGS. 1C-D is formed.

Figure 5I:
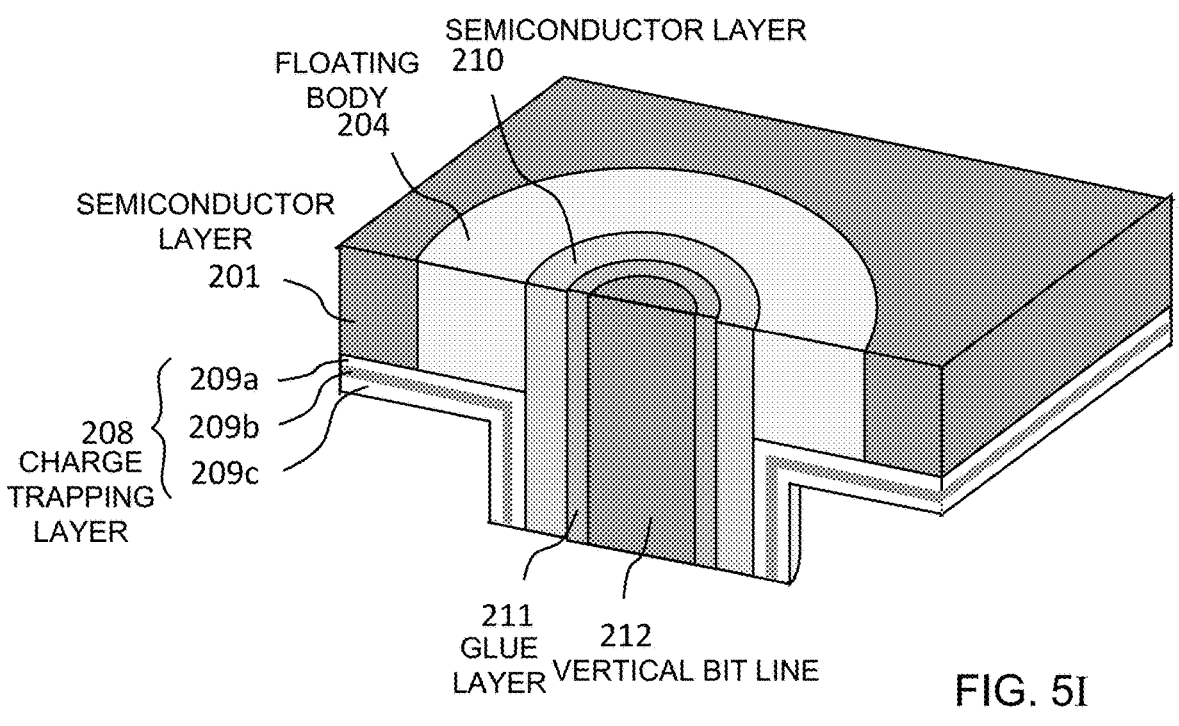
FIGS. 5I-J show another embodiment of brief process steps used to form the cell structure of a 3D NOR-type flash memory.
Figure 5J:
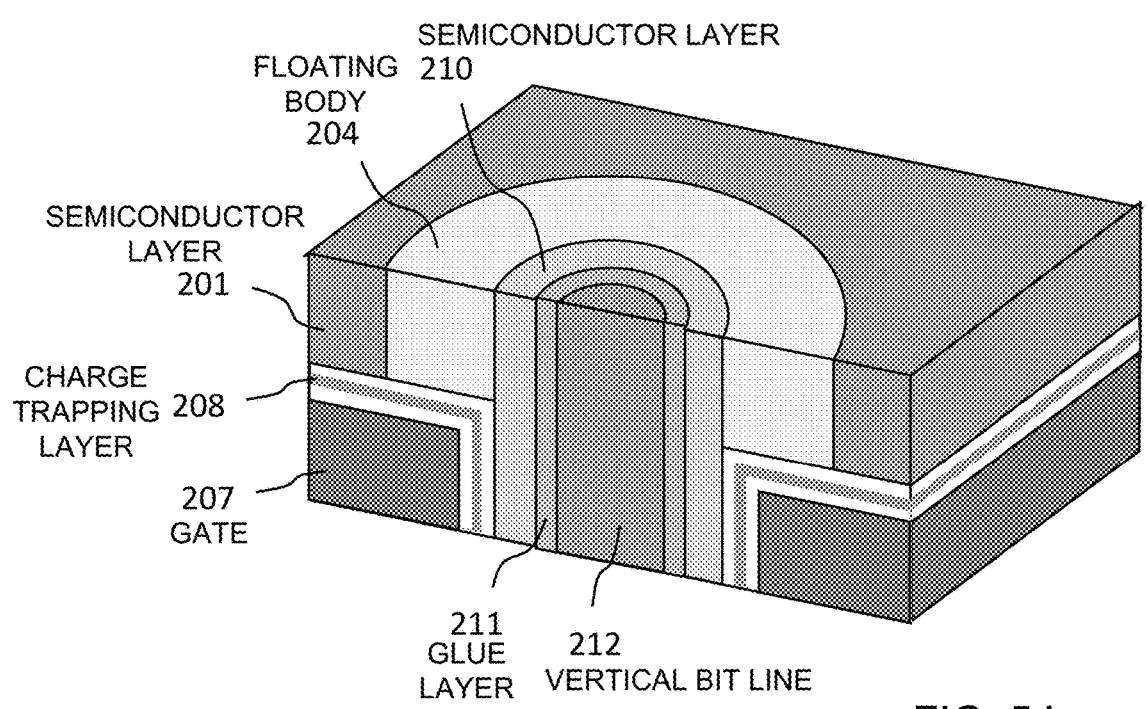

FIGS. 5I-J show another embodiment of brief process steps used to form the cell structure of a 3D NOR-type flash memory.

FIG. 5I shows a process step that is performed after the process step shown in FIG. 5F. FIG. 5I shows how a charge-trapping layer 208, such as an oxide-nitride-oxide (ONO) layer, which comprises a tunnel oxide layer 209a, a nitride layer 209b, and a blocking oxide layer 209c is formed in the region previously occupied by the sacrificial layers 202 on the exposed surfaces of the semiconductor layers 201, the floating body 204, and around the semiconductor layer 210. The charge-trapping layer 208 is formed by using atomic layer deposition (ALD), plasma-enhanced atomic layer deposition (PE-ALD), or any other suitable deposition processes to deposit the ONO layers one by one. An exemplary process and description are provided with reference to FIG. 4G.

FIG. 5J shows how the spaces (or regions) that were previously occupied by the sacrificial layers 202 are filled with the gate materials described in FIG. 4F, such as metal or heavily doped polysilicon to form the gate 207. As a result, a NOR-type flash memory cell structure is formed.

In another embodiment, the process steps shown in FIGS. 5I-J are applied to form the cell embodiments of FRAM, RRAM, MRAM, or PCM as shown in FIGS. 2C-D by using different materials and structures for a non-volatile memory gate dielectric layer to replace the charge-trapping layer 208. The reader is referred to FIGS. 2C-D for a detailed description of the non-volatile memory gate dielectric layers 170a and 170b.

Figure 6A:
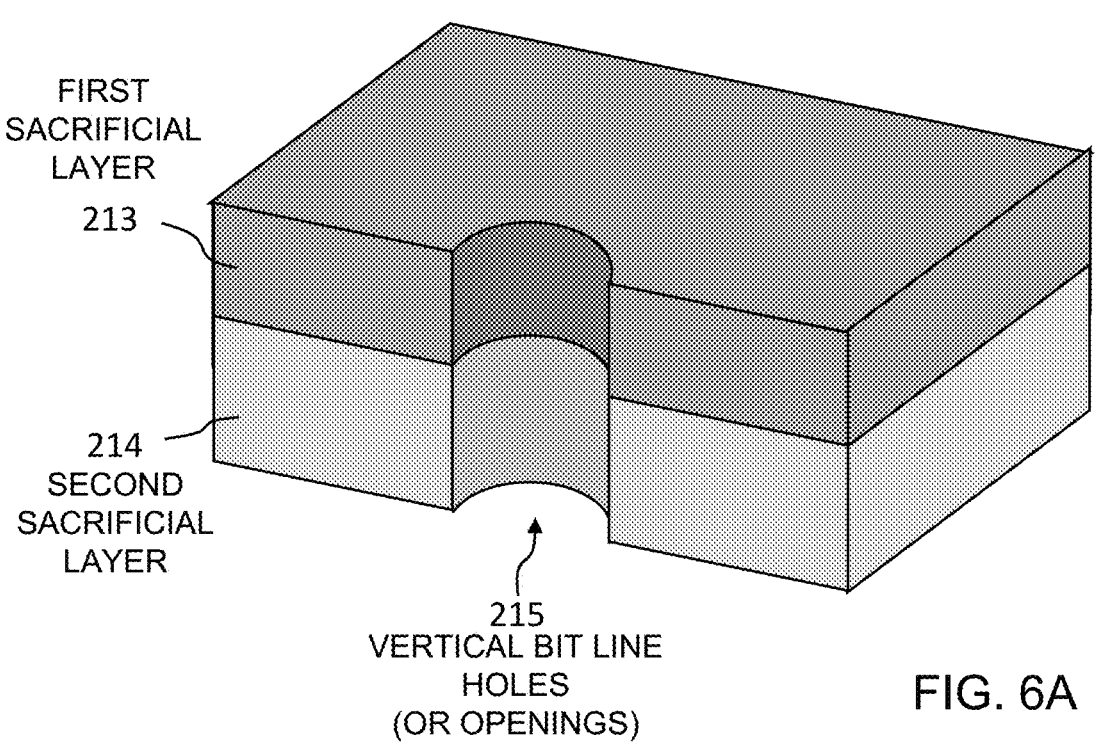
FIGS. 6A-B show another embodiment of brief process steps to form the junction-less floating-body cell structure shown in FIGS. 1I-J according to the invention.
Figure 6B:
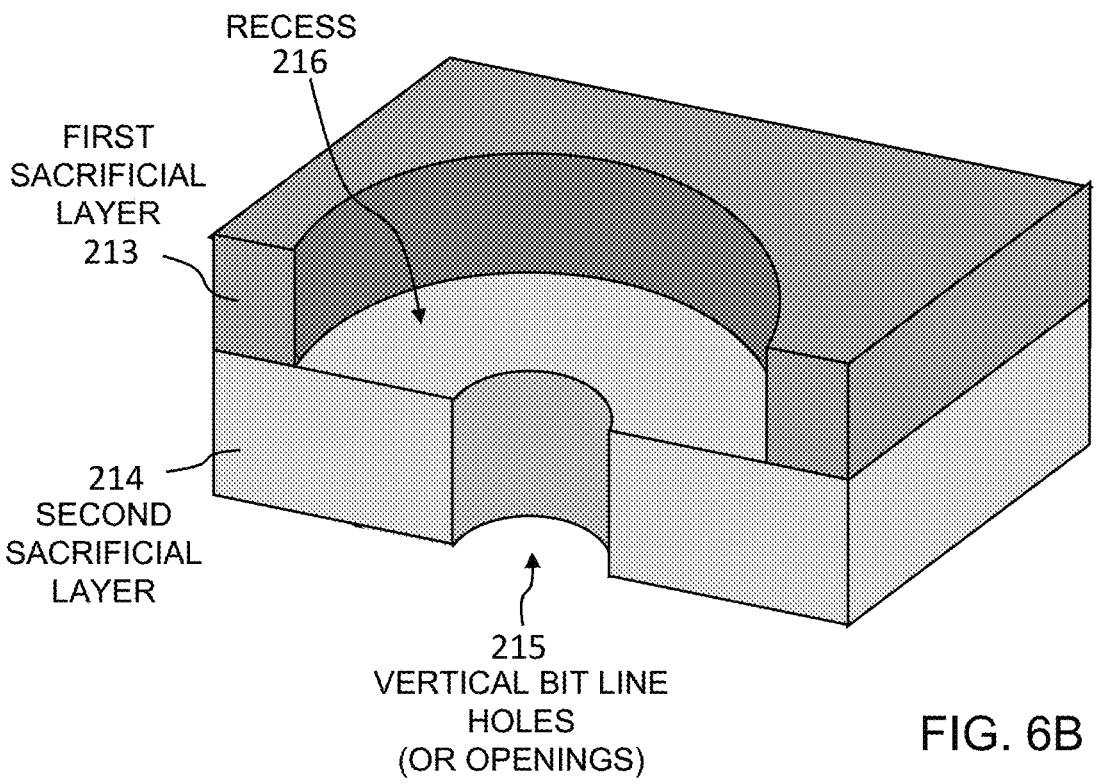

FIGS. 6A-B show another embodiment of brief process steps to form the junction-less floating-body cell structure shown in FIGS. 1I-J according to the invention.

FIG. 6A shows how multiple first sacrificial layers 213 and multiple second sacrificial layers 214 are alternately deposited to form a stack. For illustration, FIG. 6A only shows one first sacrificial layer 213 and one second sacrificial layer 214. However, a plurality of the first 213 and second 214 sacrificial layers can be alternately deposited to form the stack. The materials of the first 213 and second 214 sacrificial layers have different etching selectivity. For example, in one embodiment, the first sacrificial layer 213 is an oxide (SiO2) and the second sacrificial layer 214 is a nitride (Si3N4). After the stack is formed, multiple vertical bit line holes 215 (or openings) are formed by using photolithography steps to define a pattern, and then using an anisotropic etching process, such as deep trench etching or dry etching to etch through the multiple first sacrificial layers 213 and second sacrificial layers 214 of the stack to form the vertical bit line holes (or opening) 215.

FIG. 6B show how an isotropic etching process, such as wet etching is performed through the vertical bit line holes 215 to selectively etch the first sacrificial layer 213 to form a recess (or opening) 216 in the first sacrificial layer 213. When the first sacrificial layers 213 are formed of silicon oxide (SiO2), etching is performed using buffered hydrofluoric acid (HF) with ammonium acid (NH4F) or a mixture of hydrofluoric acid (HF) and nitric acid (HNO3).

Figure 6C:
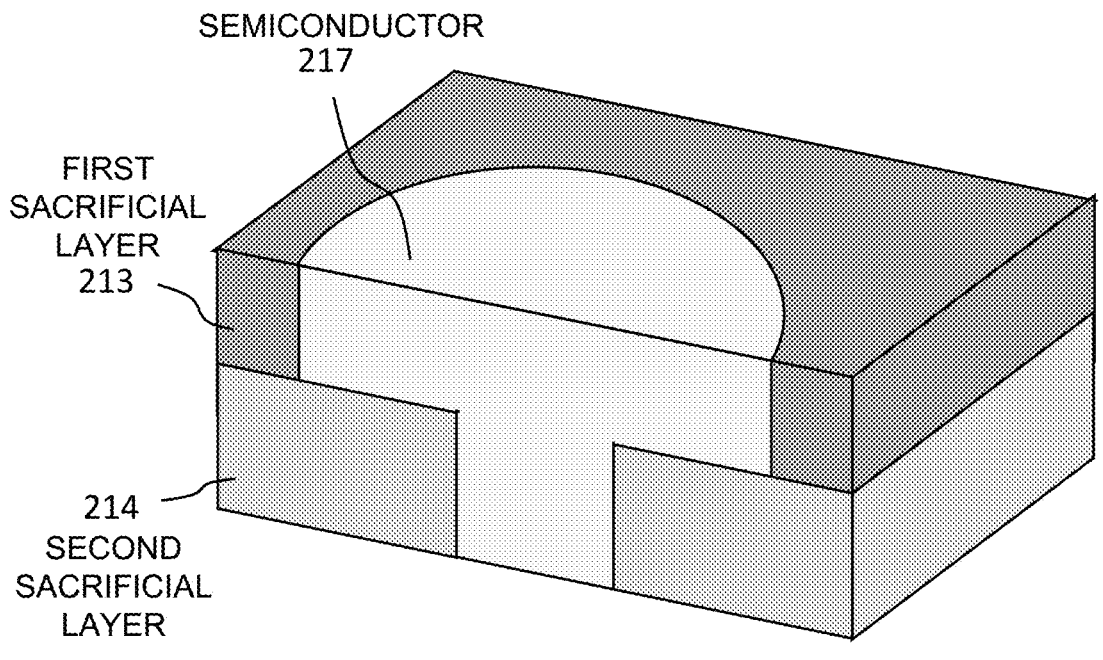
FIG. 6C shows how recesses and vertical bit line holes are filled with a semiconductor.

FIG. 6C shows how the recess 216 and the vertical bit line holes 215 are filled with semiconductor 217, such as polysilicon or silicon. In one embodiment, the polysilicon is formed by using the polysilicon deposition processes or the silicon epitaxial growth process described with reference to FIG. 4A. The reader is referred to the description of FIG. 4A for a detailed description. The semiconductor 217 is doped by using an in-situ doping process. For NMOS cells, N– type dopants, such as phosphine (PH3) or arsine (AsH3) are added during the deposition of the semiconductor 217. For PMOS cells, P– type dopants, such as diborane (B2H6) is added during the deposition process of the semiconductor 217.

Figure 6D:
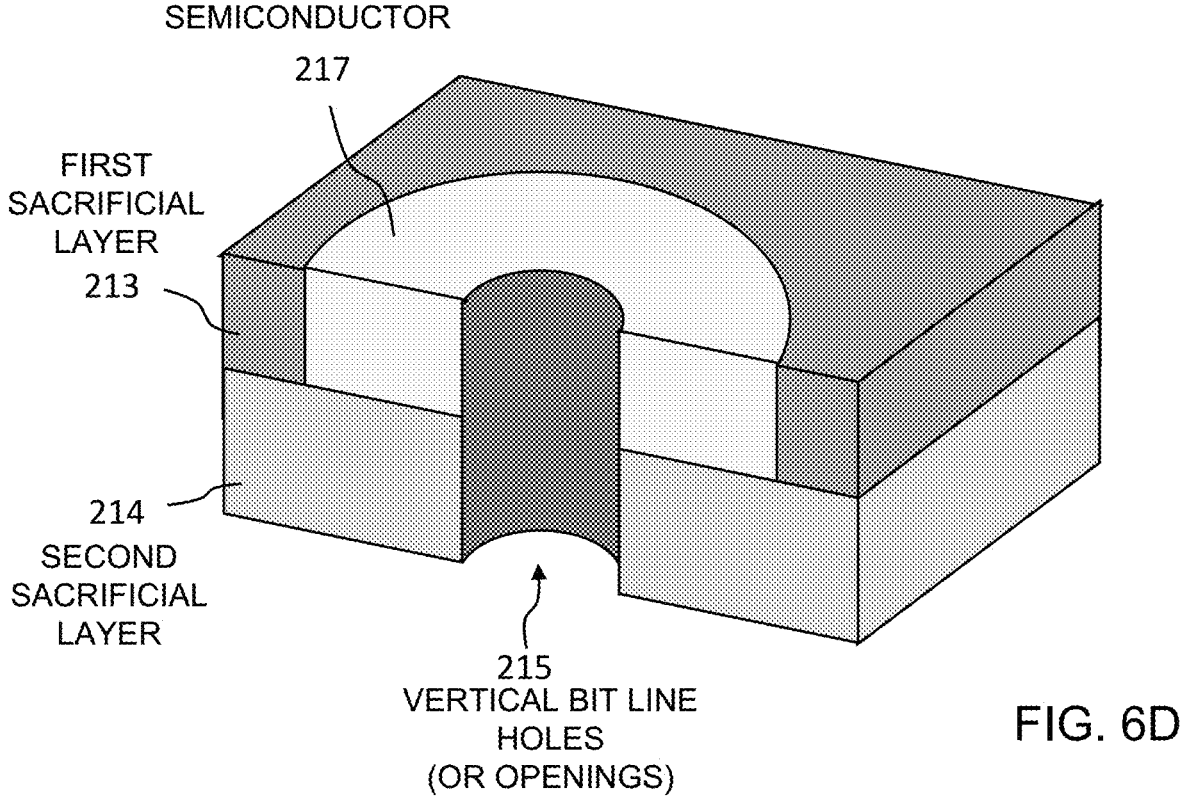
FIG. 6D shows how an anisotropic etching process is used to selectively etch a semiconductor to form the vertical bit line holes.

FIG. 6D shows how an anisotropic etching process, such as dry etching is performed using the second sacrificial layers 214 as a hard mask to selectively etch the semiconductor 217 to re-form the vertical bit line holes 215. Because this etching process is self-aligned using the second sacrificial layers 214 as a hard mask, the etching process achieves a high process yield. After the vertical bit line holes 215 are re-formed, the semiconductor 217 within the recess become the channel region of the cell transistor. In one embodiment, the re-formed bit line hole 215 is the same dimension as shown in FIG. 6A.

Figure 6E:
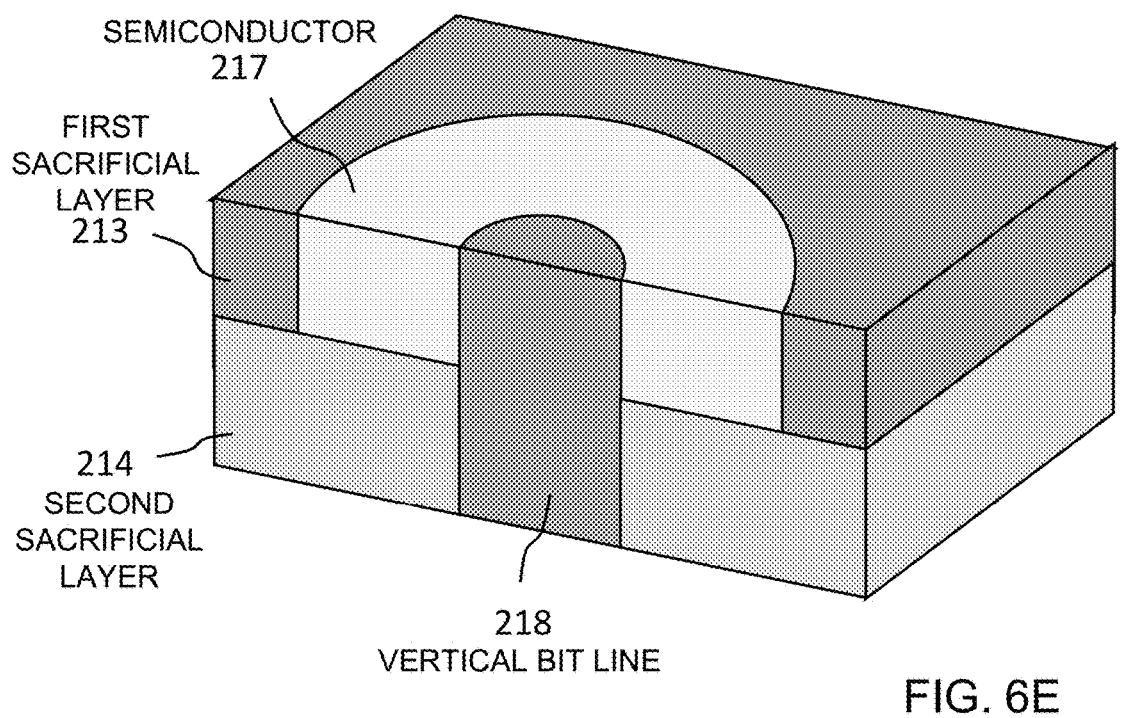
FIG. 6E shows how the vertical bit line holes are filled with high melting point metal to form the vertical bit lines.

FIG. 6E shows how the vertical bit line holes 215 are filled with a high melting point metal, such as tungsten (W) to form the vertical bit lines 218. The tungsten is deposited by using any suitable deposition processes, such as a chemical vapor deposition (CVP) reaction with tungsten hexafluoride (WF6) plus hydrogen (H2) and silane (SiH4).

Figure 6F:
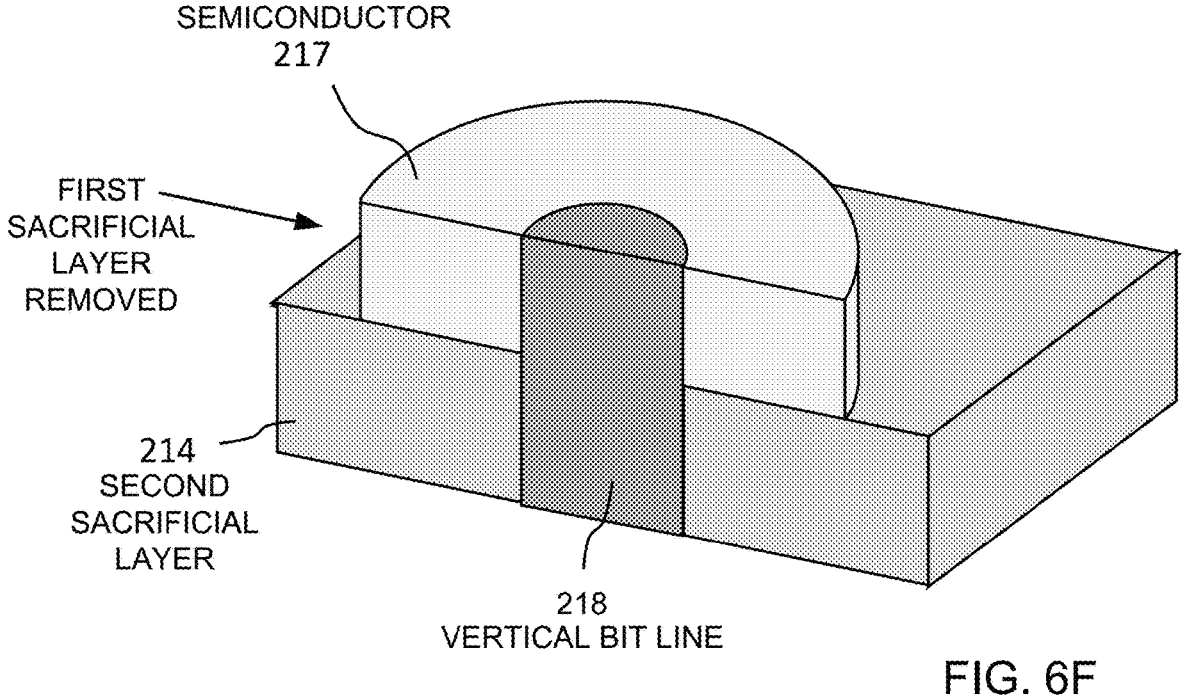
FIG. 6F shows how sacrificial layers are selectively removed by using an isotropic etching process.

FIG. 6F shows how the first sacrificial layers 213 are selectively removed by using an isotropic etching process, such as wet etching. If the first sacrificial layers 213 are formed of silicon oxide (SiO2), they are etched by using buffered hydrofluoric acid (HF) with ammonium acid (NH4F) or a mixture of hydrofluoric acid (HF) and nitric acid (HNO3).

Figure 6G:
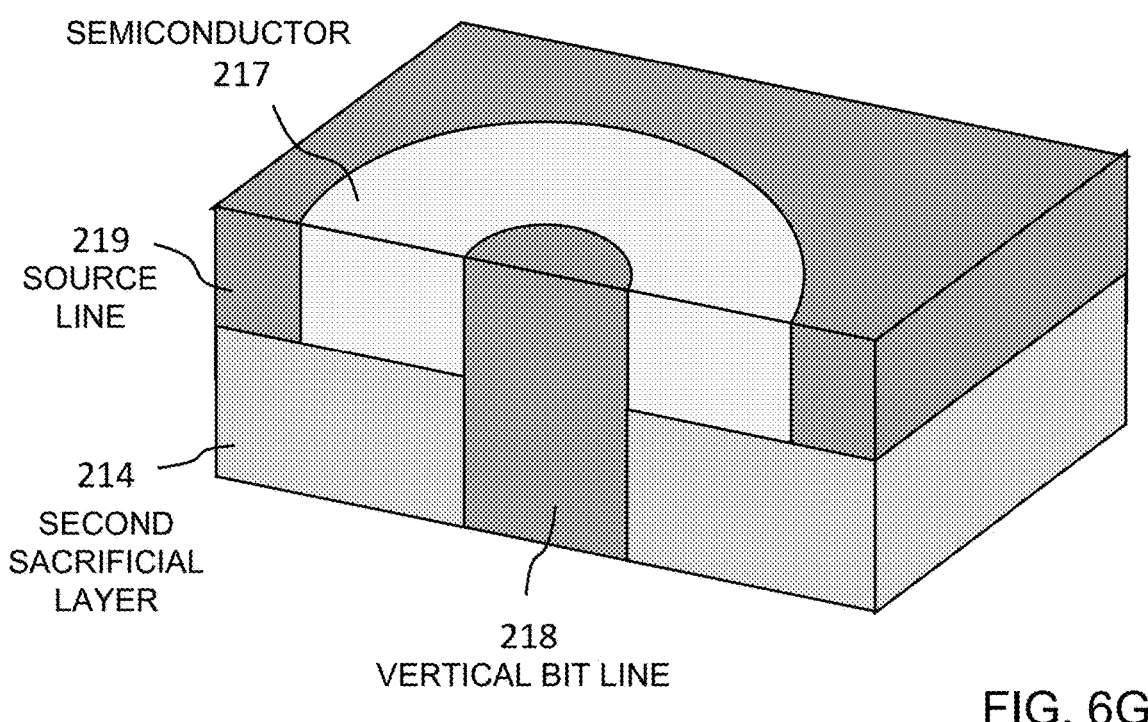
FIG. 6G shows how a high melting point metal is deposited to form the source lines.

FIG. 6G shows how a high melting point metal, such as tungsten (W) is deposited to fill the spaces that are previously occupied by the first sacrificial layers 213 to form the source line layer 219. The tungsten is deposited using any suitable deposition processes, such as a chemical vapor deposition (CVP) reaction with tungsten hexafluoride (WF6) plus hydrogen (H2) and silane (SiH4).

Figure 6H:
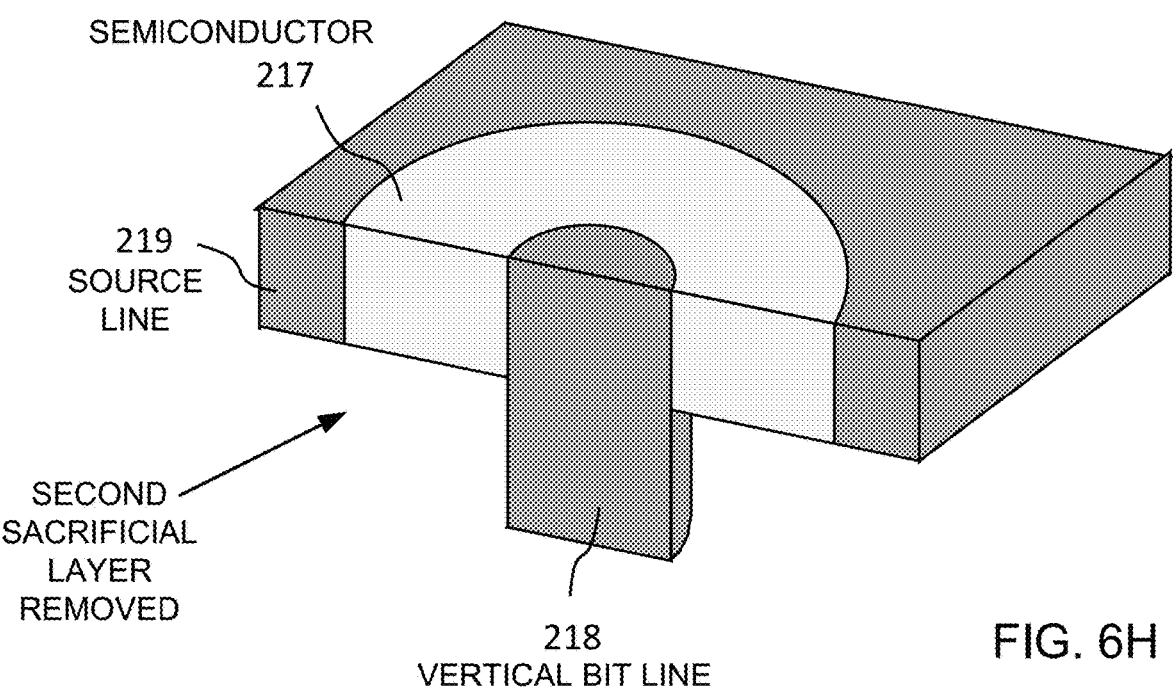
FIG. 6H show how sacrificial layers are selectively removed by using an isotropic etching process.

FIG. 6H show how the second sacrificial layers 214 are selectively removed by using an isotropic etching process, such as wet etching. If the second sacrificial layers 214 are formed of silicon nitride (Si3N4), they are etched by using concentrated hot orthophosphoric acid (H3PO4) at a temperature of 150 to 180 degrees Celsius.

Figure 6I:
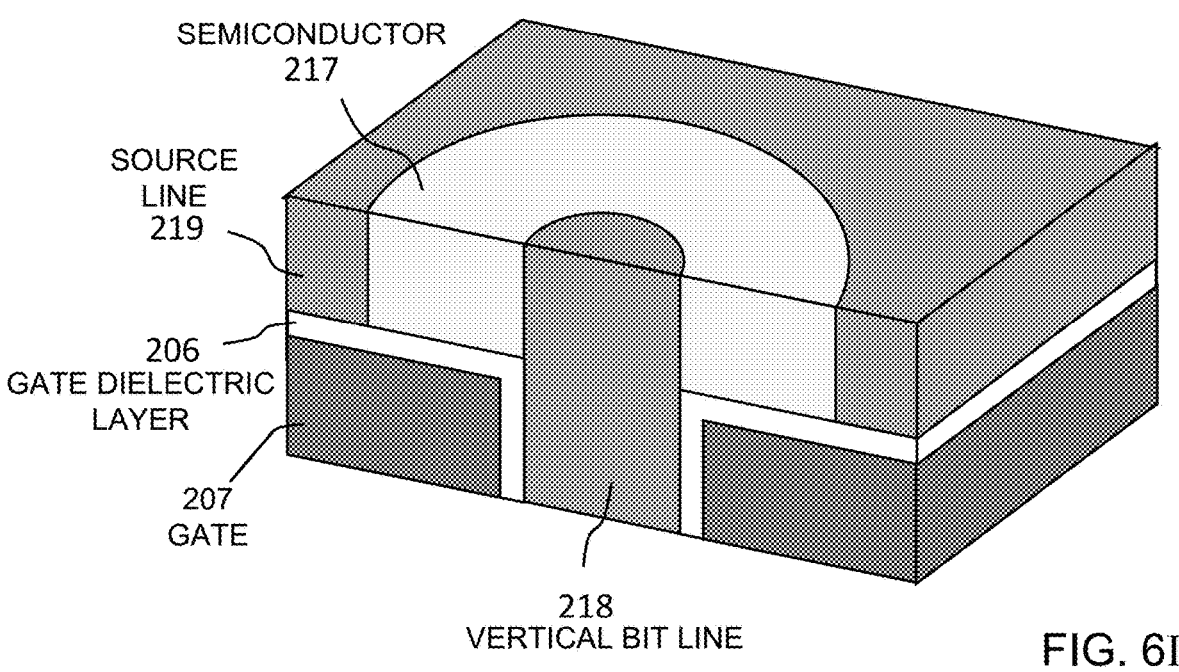
FIG. 6I show how the process steps described with reference to FIGS. 4E-F are applied to form a gate dielectric layer.

FIG. 6I show how the process steps described with reference to FIGS. 4E-F are performed to form the gate dielectric layer 206 and the gates 207. The reader is referred to the description of FIGS. 4E-F for a detailed description of the process steps. As a result, a floating-body cell structure using a junction-less transistor is formed as illustrated in FIG. 6I.

Figure 6J:
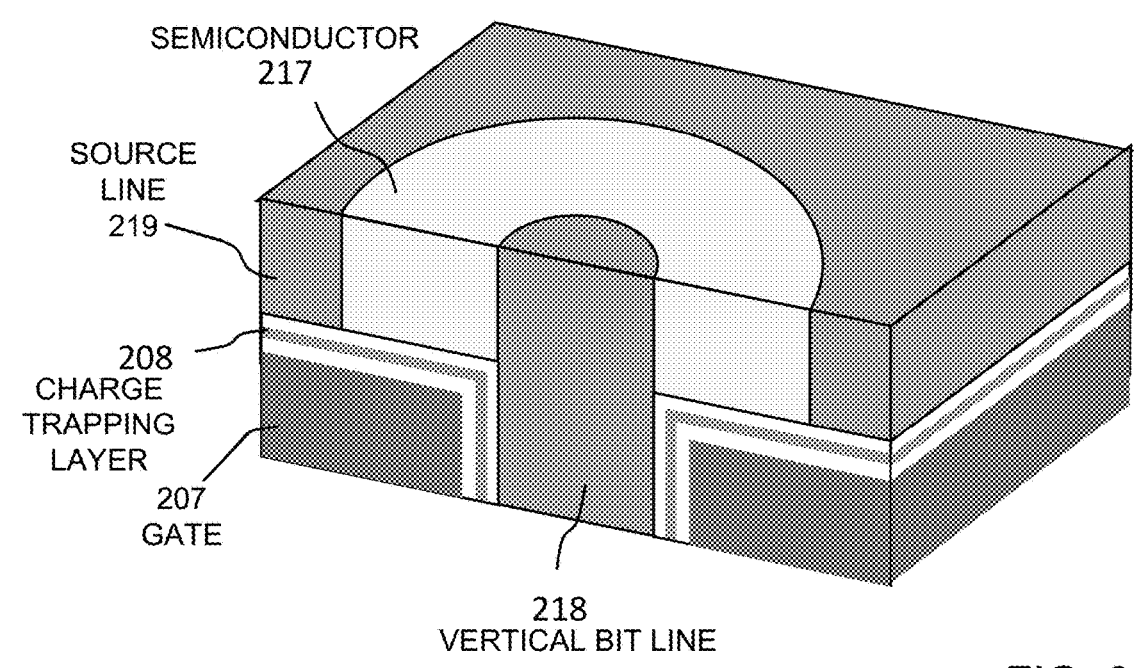
FIG. 6J shows another embodiment for forming a junction-less transistor.

FIG. 6J shows another embodiment for forming a junction-less transistor. After the process step shown in FIG. 6H, the process steps shown in FIGS. 4G-H are performed to form the charge-trapping layer 208 and the gates 207. The reader is referred to the description of FIGS. 4G-H for a detailed description of these steps. As a result, a NOR-type flash memory cell structure using a junction-less transistor is formed as illustrated in FIG. 6J.

In another embodiment, the charge-trapping layer 208 shown in FIG. 6J is replaced with a non-volatile memory gate dielectric layer formed from the materials described with reference to FIGS. 2C-D to form the cell embodiments of FRAM, RRAM, MRAM, or PCM. The reader is referred to the description of FIGS. 2C-D for the detailed descriptions of the non-volatile memory gate dielectric layers 170a and 170b.

FIGS. 7A-M shows another embodiment of brief process steps to form the cell structure shown in FIGS. 1G-H according to the invention.

Figures 7A, 7B:
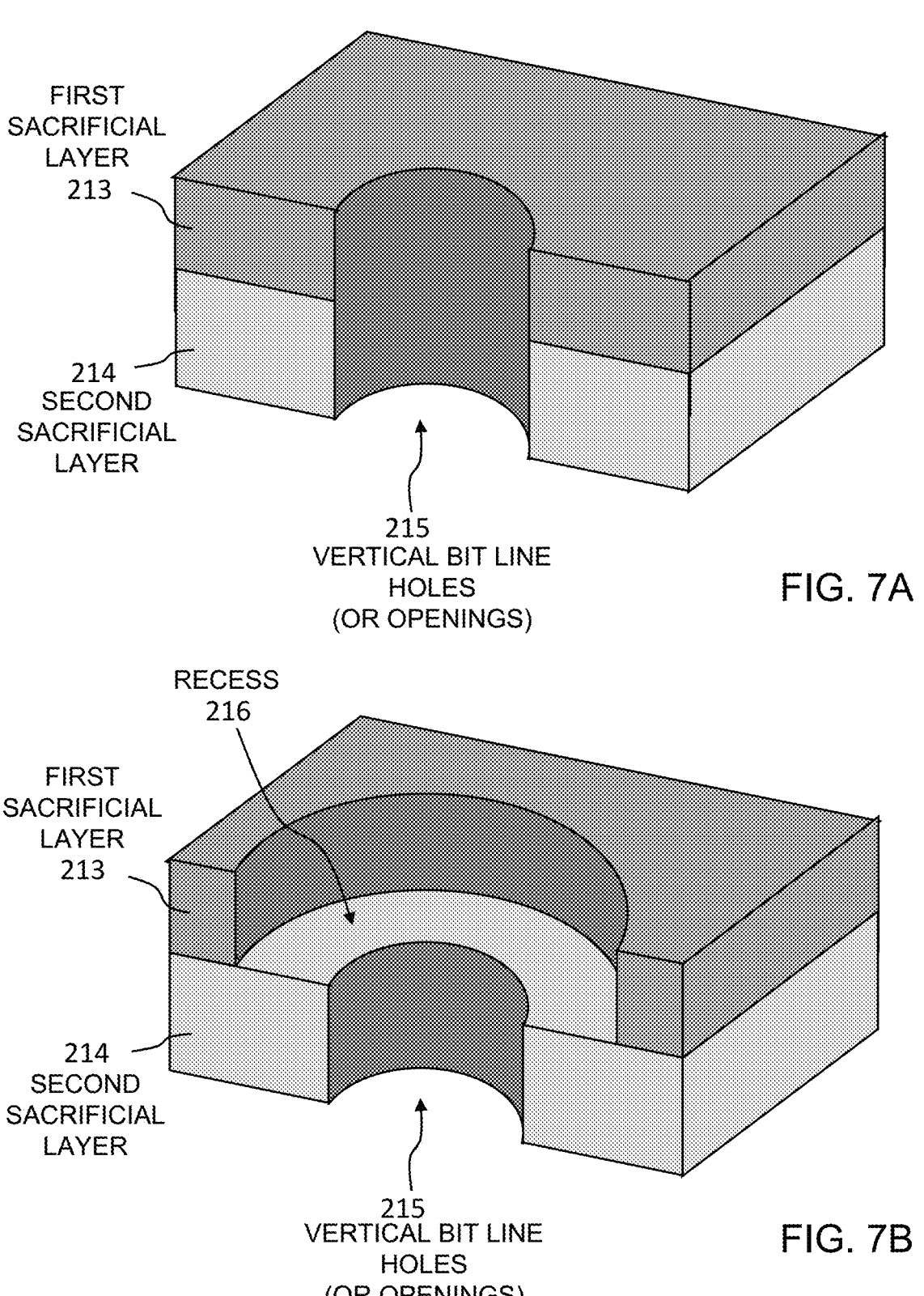
FIGS. 7A-M shows another embodiment of brief process steps to form the cell structure shown in FIGS. 1G-H according to the invention.

FIG. 7A shows how multiple first sacrificial layers 213, such as oxide (SiO2) and multiple second sacrificial layers 214, such as nitride (Si3N4) are alternately deposited to form a stack. After that, multiple vertical bit line holes 215 are patterned by using photolithography steps and formed by using an anisotropic etching process, such as deep trench etching to etch through the multiple layers of the stack. In an embodiment, a plurality of first sacrificial layers 213 and a plurality of second sacrificial layers are alternately deposited to form the stack.

FIG. 7B shows how a recess 216 are formed by using an isotropic etching process, such as wet etching to etch through the vertical bit line holes 215 to selectively etch the first sacrificial layers 213 so that the recess 216 is formed.

Figure 7C:
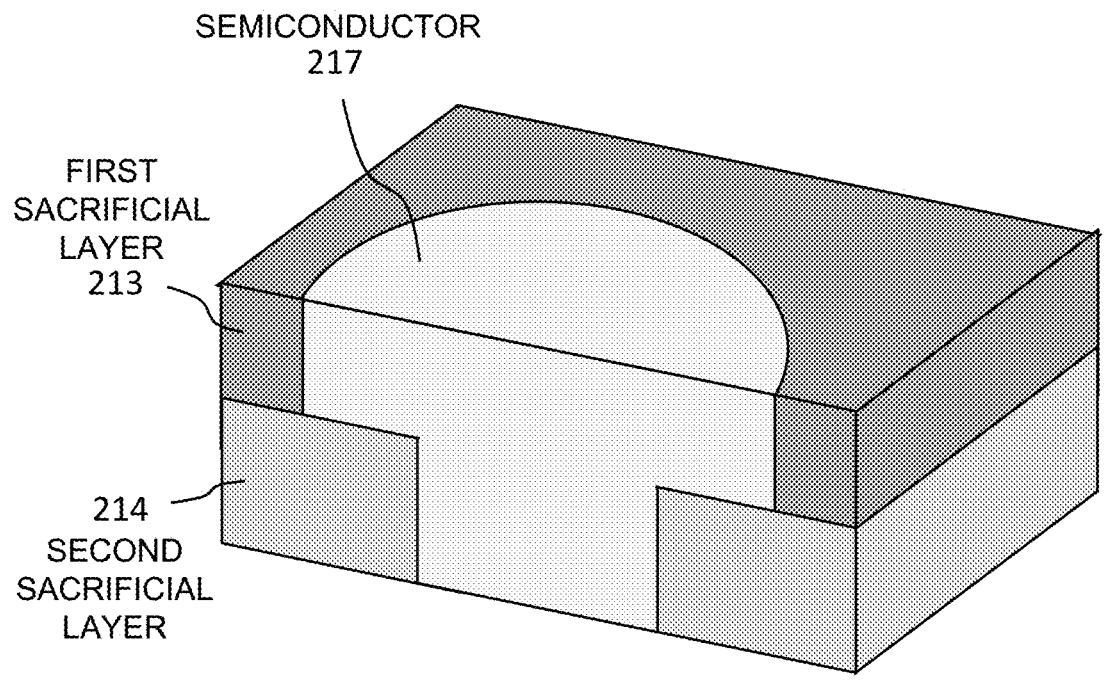

FIG. 7C show how the recess 216 and the vertical bit line hole 215 are filled with semiconductor 217 such as polysilicon or silicon. The semiconductor layer 217 is doped by using an in-situ doping process.

Figure 7D:
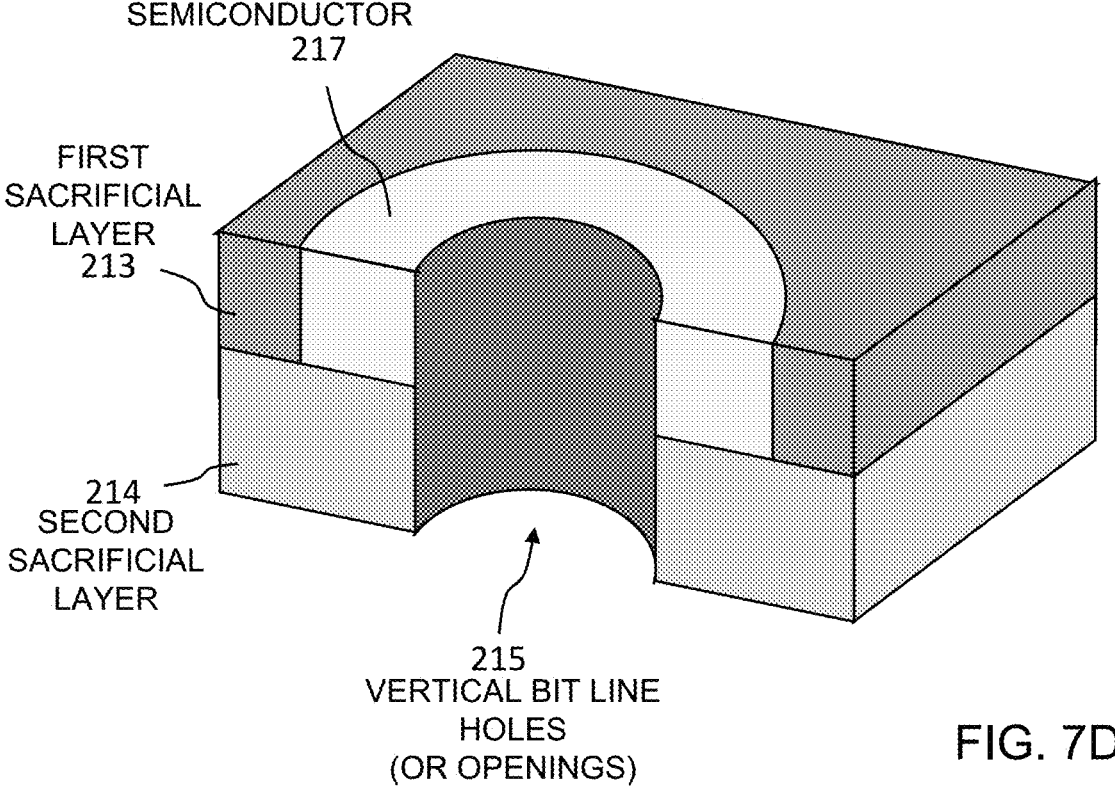

FIG. 7D shows how an anisotropic etching process, such as dry etching is performed using the second sacrificial layers 214 as a hard mask to selectively etch the semiconductor 217 to re-form the vertical bit line hole 215. In one embodiment, the re-formed bit line hole 215 has the same dimension as shown in FIG. 7A. After the vertical bit line hole 215 is re-formed, the semiconductor 217 becomes a floating body of the cell. The process steps described with reference to FIGS. 7A-D are as the same as the process steps described with reference to FIGS. 6A-D. The reader is referred to the description of FIGS. 6A-D for a detailed description of those process steps.

Figures 7E, 7F:
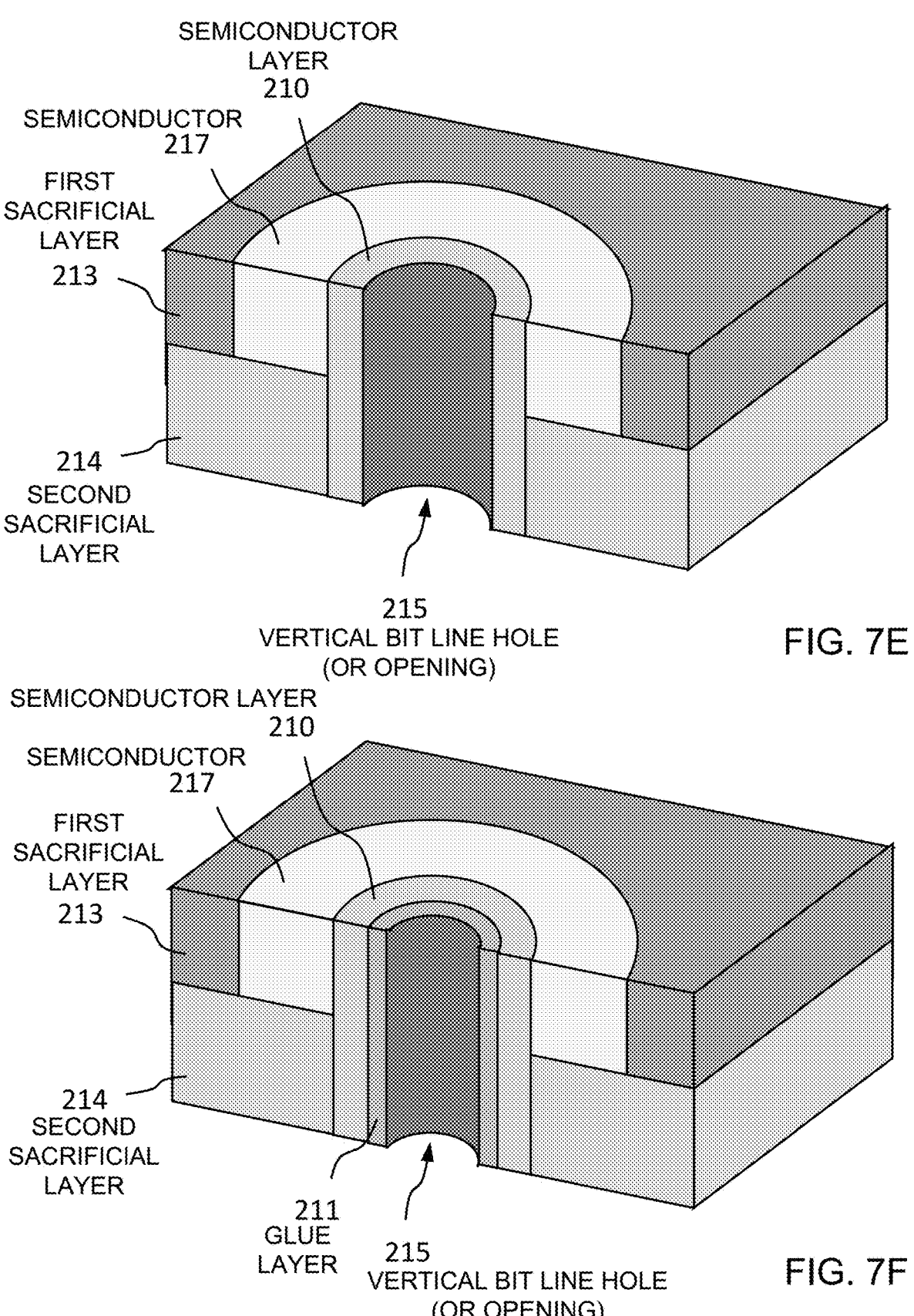

FIG. 7E shows how a semiconductor layer 210, such as polysilicon or silicon is formed on the sidewall of the semiconductor 217 through the vertical bit line holes 215. The semiconductor layer 210 is doped with the opposite type of the doping that is used for the floating body 217.

FIG. 7F shows how a glue layer 211, such as a titanium and titanium nitride (Ti/TiN) layer is formed on the sidewall of the vertical bit line holes 215.

Figure 7G:
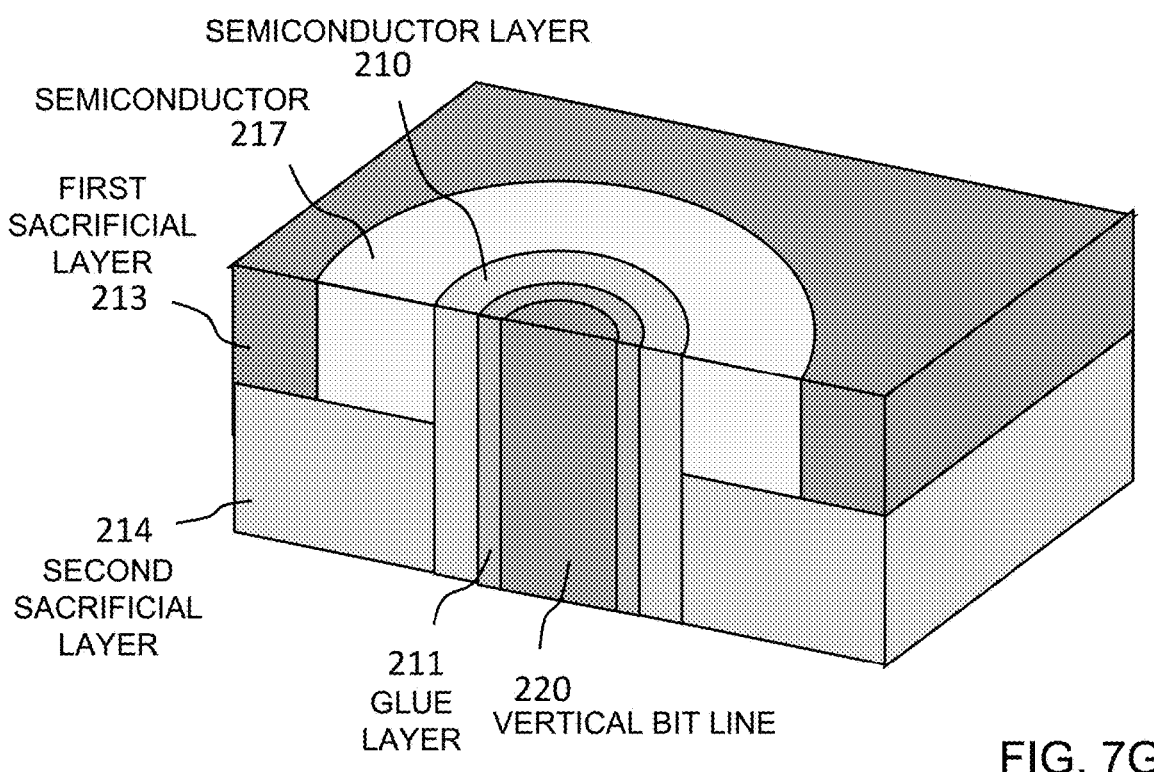

FIG. 7G show how the vertical bit line holes 215 is filled with a high melting point metal, such as tungsten (W) by using deposition processes to form a vertical bit line 220. The process steps shown in FIGS. 7E-G are as the same as FIGS. 5C-E. The reader is referred to the description of FIGS. 5C-E for the detailed description of these process steps.

Figure 7H:
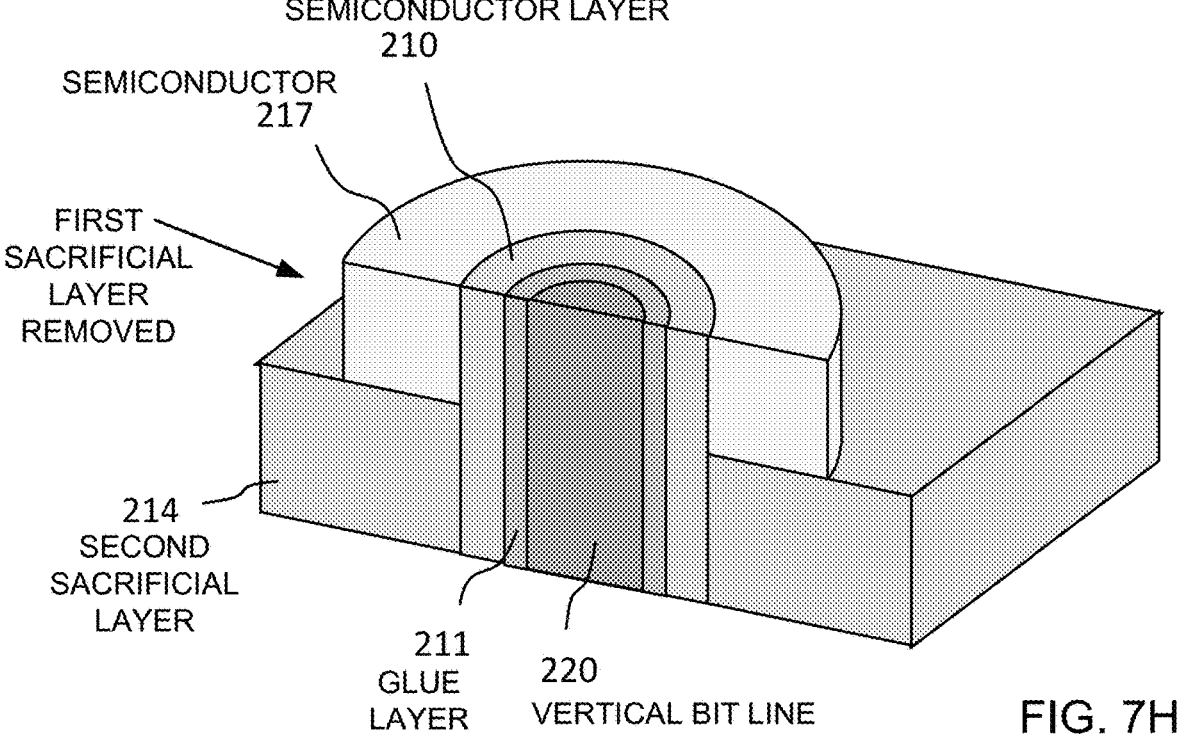

FIG. 7H shows how the first sacrificial layers 213 are selectively removed by using an isotropic etching process, such as wet etching. If the first sacrificial layers 213 are formed of silicon oxide (SiO2), they are etched by using buffered hydrofluoric acid (HF) with ammonium acid (NH4F) or a mixture of hydrofluoric acid (HF) and nitric acid (HNO3).

Figures 7I, 7J:
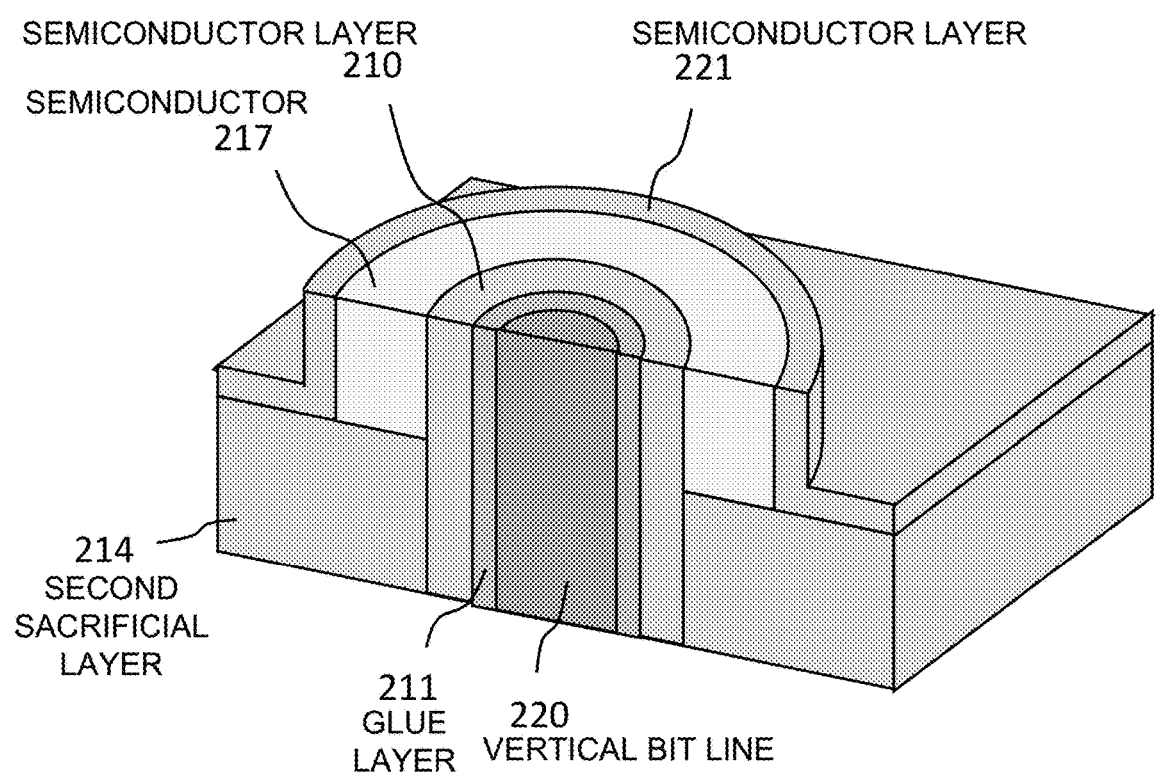

FIG. 7I shows how a semiconductor layer 221, such as polysilicon or silicon is formed on the exposed surfaces of the second sacrificial layer 214 and the semiconductor 217 in the space that was previously occupied by the first sacrificial layer 213. The semiconductor layer 221 is formed by the polysilicon deposition processes or silicon epitaxial growth process described with reference to FIG. 4A. The semiconductor layer 221 is doped using an in-situ doping process. For NMOS cells, N– type dopants, such as phosphine (PH3) or arsine (AsH3) are added during the deposition of the semiconductor layer 221. For PMOS cells, P– type dopants, such as diborane (B2H6) are added during the deposition of the semiconductor layer 221.

In another embodiment, the semiconductor layer 221 is formed by using a plasma doping (PLAD) process or any other suitable doping process to dope the opposite type of heavy dopants used for the floating body 217 into the semiconductor layer 221 so that the semiconductor layer 221 will have the reverse doping type as the floating body 217. For example, if the floating body 217 has P– type doping, the plasma doping process is used to dope N– type of heavy dopants (e.g., the opposite type of dopants of the floating body 217), such as phosphorus into the layer 221 to reverse the doping type of the layer 221 from P– type to N– type. This forms a N– type of semiconductor layer 221.

FIG. 7J shows how a high meting point metal, such as tungsten (W) or heavily doped polysilicon is deposited to fill the spaces that are previously occupied by the first sacrificial layers 213 to form the source line layer 222. The tungsten is deposited by using any suitable deposition processes, such as chemical vapor deposition (CVP) reaction with tungsten hexafluoride (WF6) plus hydrogen (H2) and silane (SiH4). Compared with other embodiments shown in FIG. 4A-F that form the silicon or polysilicon source lines 103, the metal source lines 222 reduce the source line resistance.

Figure 7K:
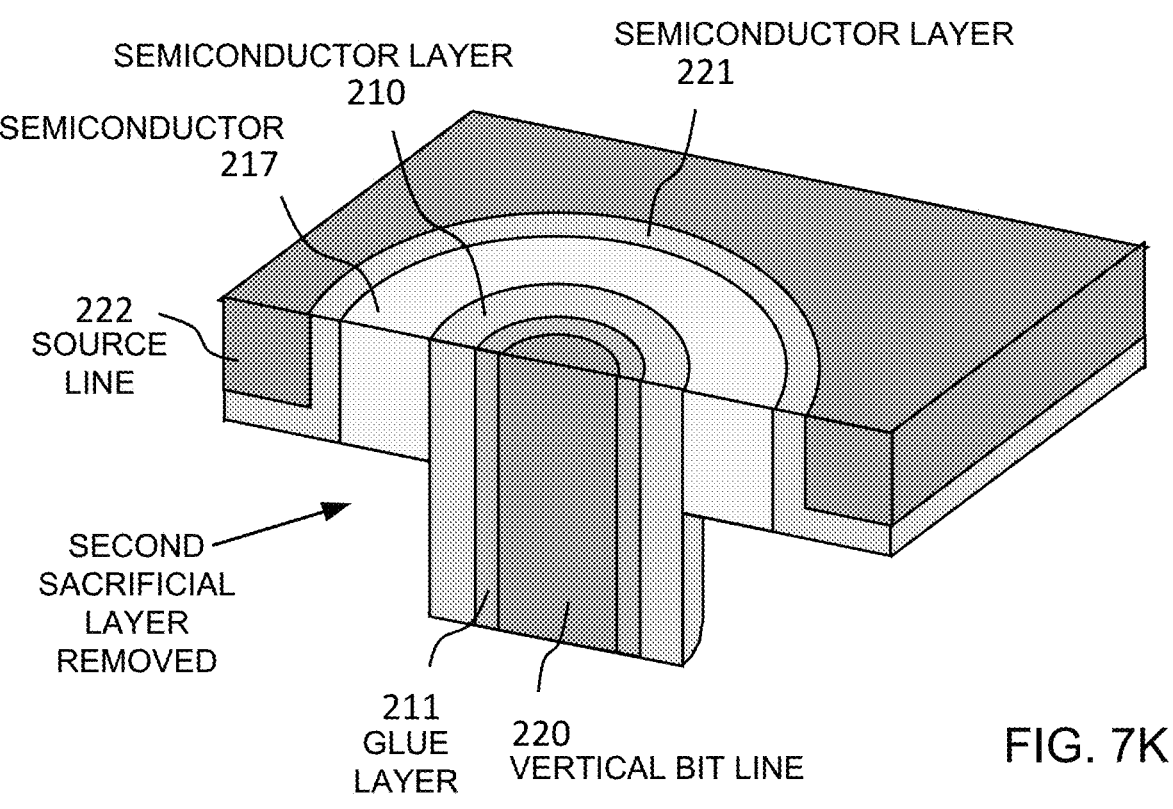

FIG. 7K shows how the second sacrificial layers 214 are selectively removed by using an isotropic etching process, such as wet etching.

Figure 7L:
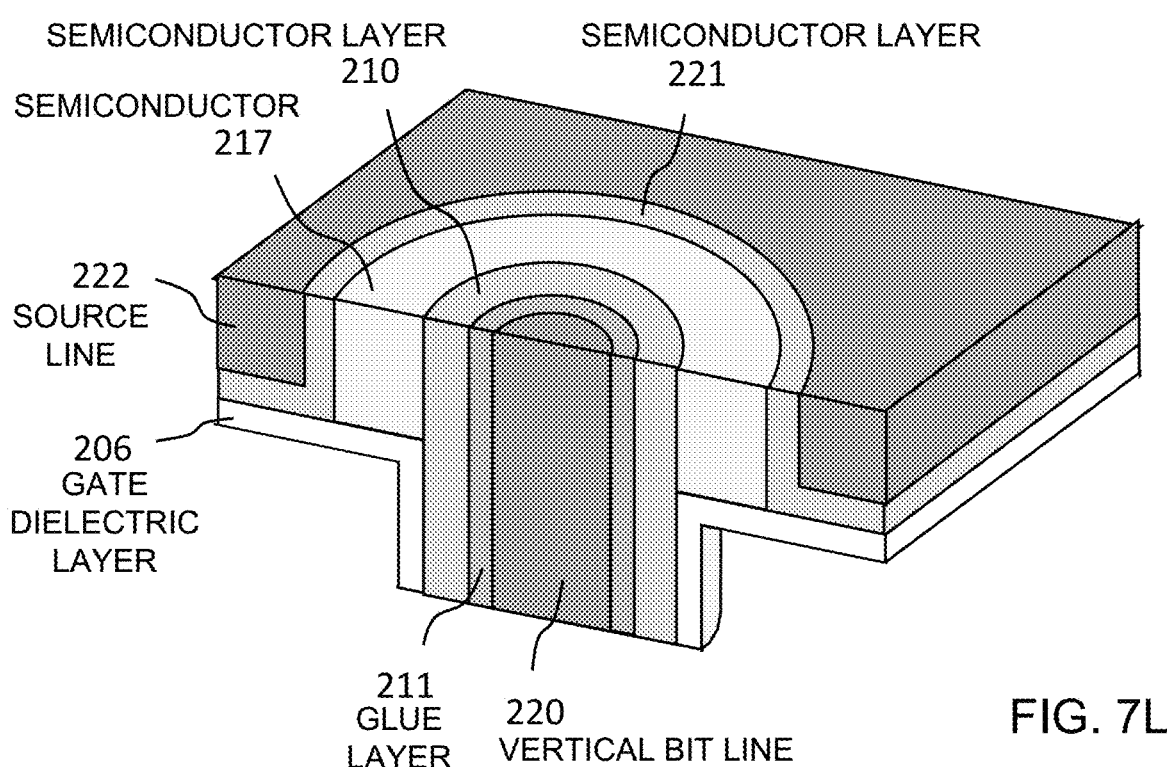

FIG. 7L shows how a gate dielectric layer 206 is formed on the exposed surfaces of the semiconductor layer 221, semiconductor 217 and around the surface the semiconductor layer 210 within the space previously occupied by the second sacrificial layer 214.

Figure 7M:
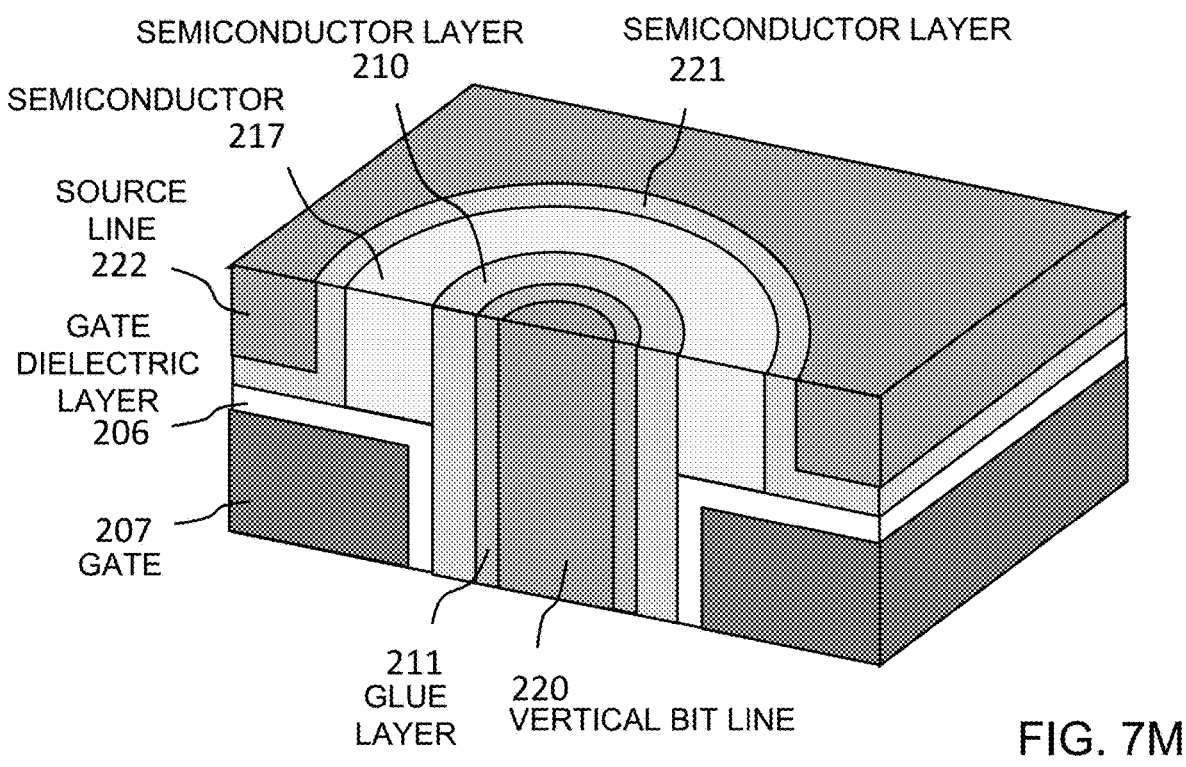

FIG. 7M shows how the spaces along the exposed surface of the gate dielectric layer 206 are filled with metal or heavily doped polysilicon to form the gates 207. The process steps shown and described with referenced to FIGS. 7K-M are as the same as those shown and described with reference to FIGS. 4D-F. The reader is referred to the description of FIGS. 4D-F for the detailed description of those process steps. As a result, the floating-body cell structure shown in FIGS. 1G-H is formed.

Figure 7N:
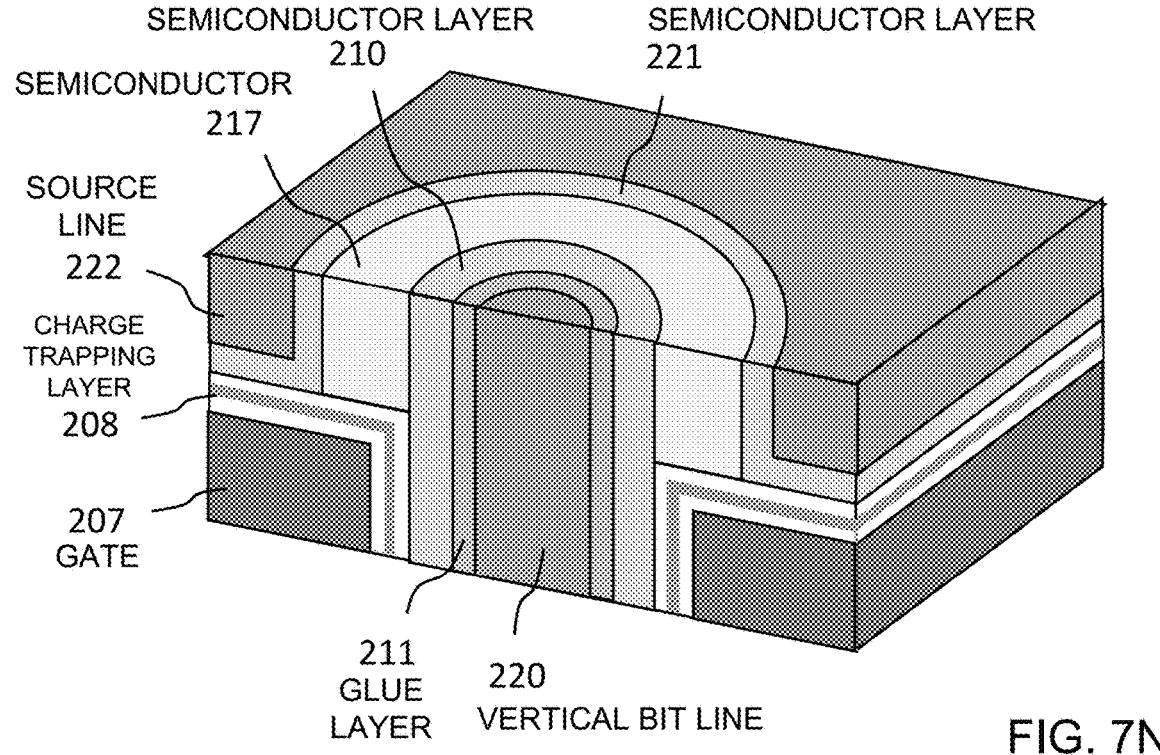
FIG. 7N shows another embodiment of process steps to form a cell structure.

FIG. 7N shows another embodiment of process steps utilized to form a cell structure. After the process step shown and described with reference to FIG. 7K are performed, the process steps shown and described with reference to FIGS. 4G-H are performed to form a charge-trapping layer 208 and gates 207 shown in FIG. 7N. The reader is referred to the description of FIGS. 4G-H for the detailed description of those process steps. As a result, a NOR-type flash memory cell structure as shown in FIG. 7N is formed.

In another embodiment, the charge-trapping layer 208 shown in FIG. 7N is replaced with a non-volatile memory gate dielectric layer formed from the materials described with reference to FIGS. 2C-D to form the cell embodiments of FRAM, RRAM, MRAM, or PCM. The reader is referred to the description of FIGS. 2C-D for the detailed descriptions for forming the non-volatile memory gate dielectric layers 170a and 170b using these materials.

FIGS. 8A-K shows another embodiment of brief process steps to form a cell structure comprising a thin-film transistor as shown in FIGS. 1K-L according to the invention.

Figure 8A:
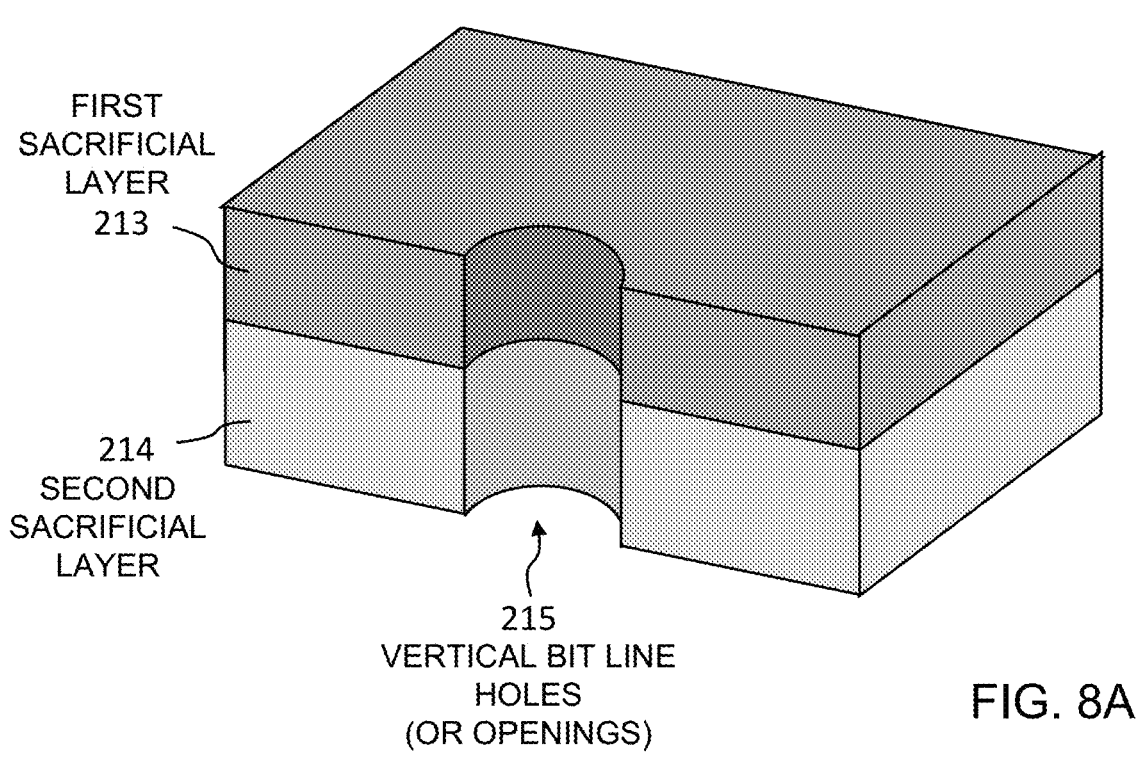
FIGS. 8A-K shows another embodiment of brief process steps to form a cell structure comprising a thin-film transistor as shown in FIGS. 1K-L according to the invention.

FIG. 8A shows how multiple first sacrificial layers 213, such as oxide (SiO2) and multiple second sacrificial layers 214, such as nitride (Si3N4) are alternately deposited to form a stack. After that, multiple vertical bit line holes 215 are patterned by using photolithography steps and then formed by using an anisotropic etching process, such as deep trench etching to etch through the multiple layers of the stack. In an embodiment, the stack comprises a plurality of alternating layers.

Figure 8B:
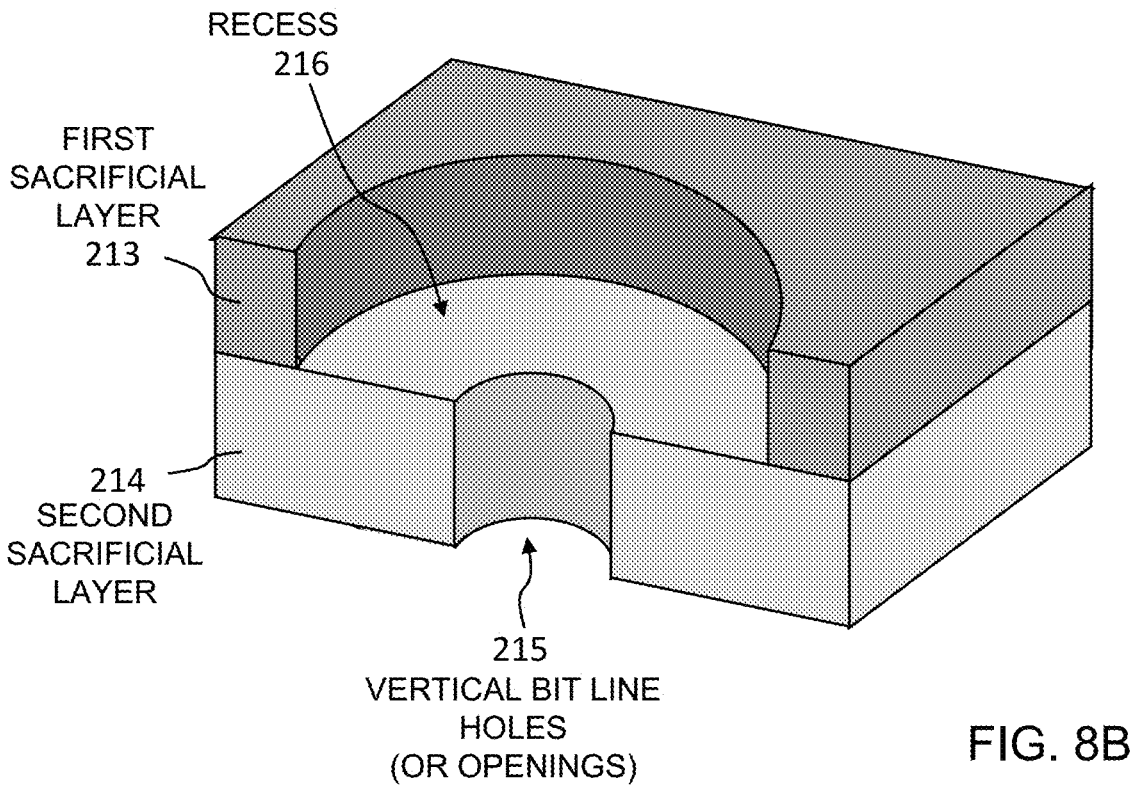

FIG. 8B shows how recess 216 are formed by using an isotropic etching process, such as wet etching to selectively etch the first sacrificial layers 213 through the vertical bit line holes 215. The process steps shown and described with reference to FIGS. 8A-B are as the same as those shown and described with reference to FIGS. 6A-B. The reader is referred to the description of FIGS. 6A-B for the detailed description of those process steps.

Figure 8C:
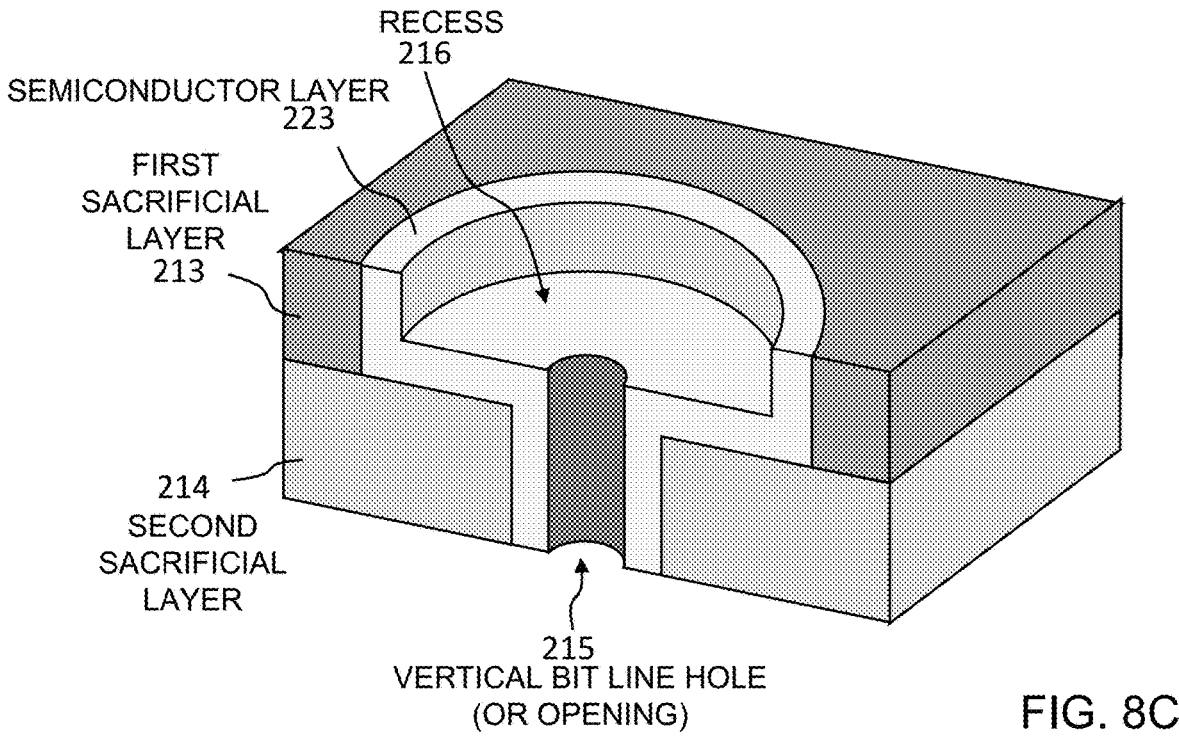

FIG. 8C shows how a semiconductor layer 223, such as polysilicon or silicon is formed on the surface of the sidewall of the recess 216 and the vertical bit line holes 215. As a result, the size of the recess 216 and the vertical bit line hole 215 are reduced. The semiconductor layer 223 is formed by using the polysilicon deposition processes or the silicon epitaxial growth process through the bit line holes 215 as described with reference to FIG. 4A. The reader is referred to the description of FIG. 4A for the detailed description of the process to form the semiconductor layer 223.

Figure 8D:
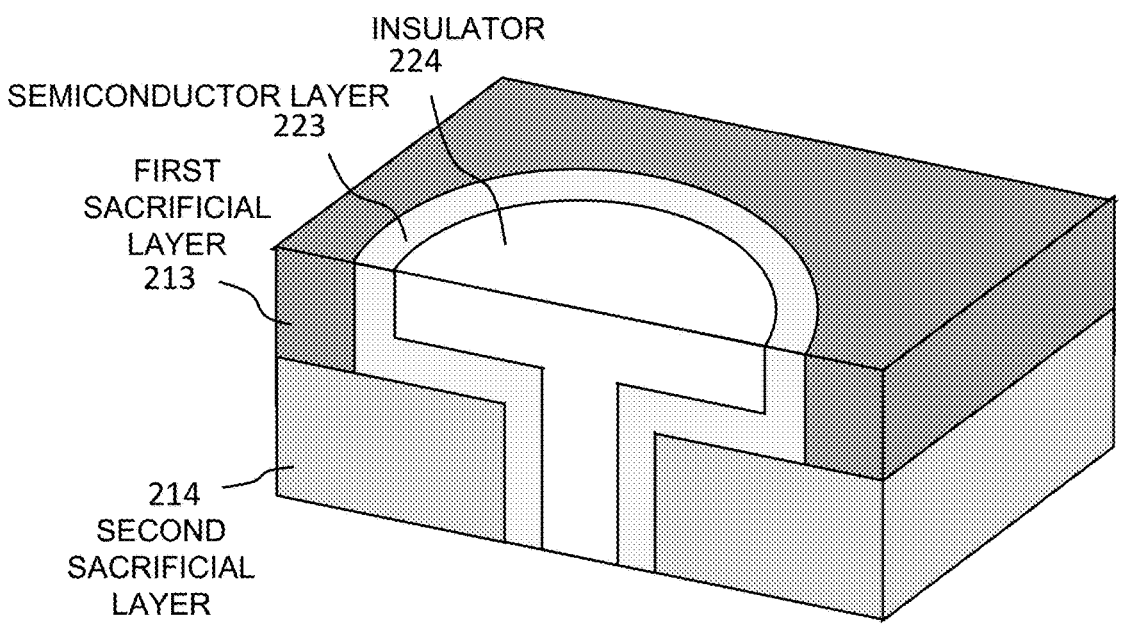

FIG. 8D shows how the recess 216 and the vertical bit line holes 215 are filled with an insulator 224, such as oxide (SiO2) or nitride (Si3N4) by using a deposition process.

Figures 8E, 8F:
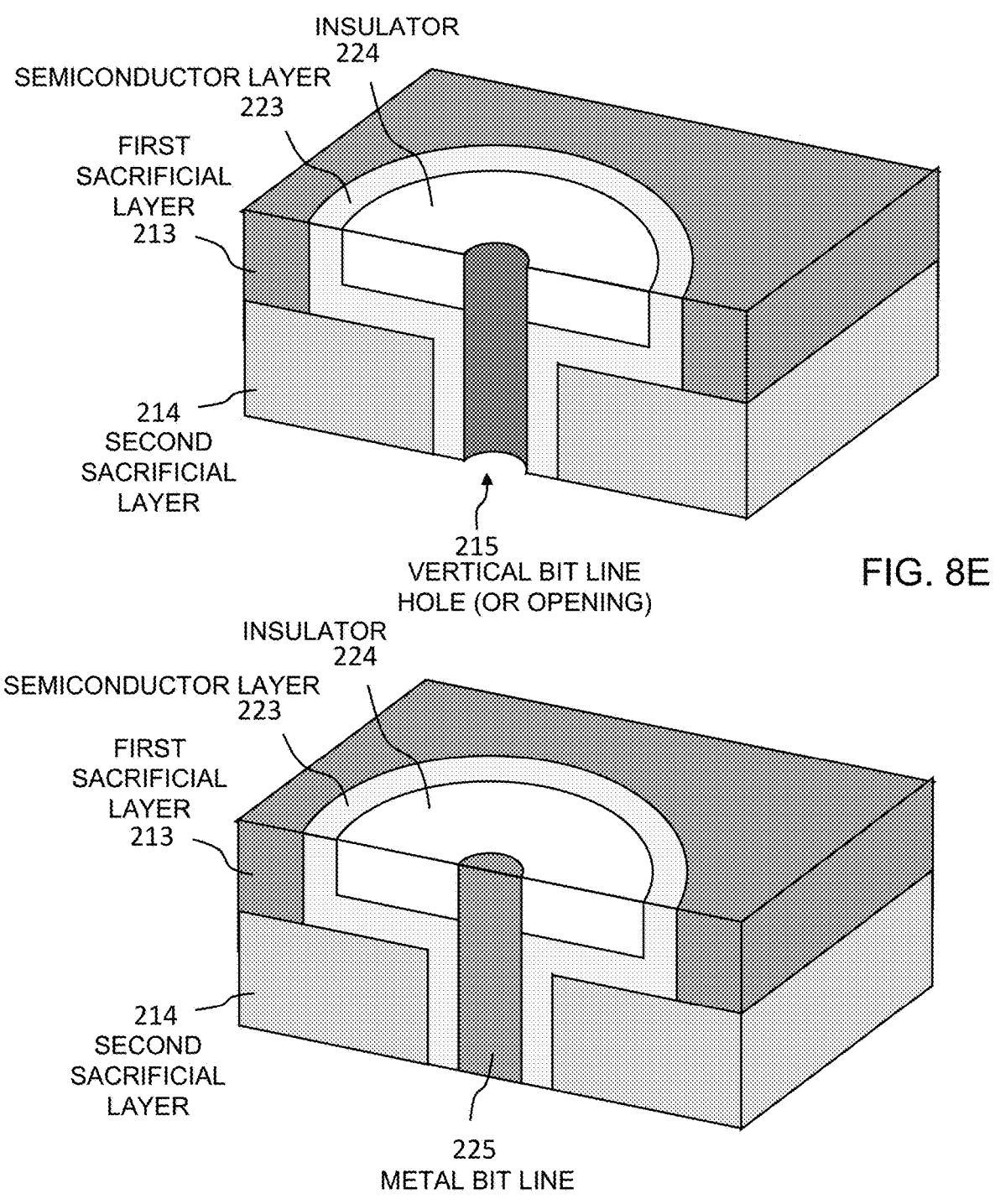

FIG. 8E shows how an anisotropic etching process, such as dry etch is performed using the second sacrificial layers 214 and the semiconductor layer 223 as hard masks to selectively etch the insulator 224 to re-form the vertical bit line hole (or opening) 215. It should be noted that the re-formed vertical bit line hole 215 shown in FIG. 8E has a smaller diameter than the vertical bit line hole 215 shown in FIG. 8A. The etching processes for oxide and nitride are described above in reference to FIG. 6B. The reader is referred to the description of FIG. 6B for the detailed description of the etching process for forming the bit line hole 215.

FIG. 8F shows how the vertical bit line hole 215 is filled with a high melting point metal, such as tungsten (W) by using deposition processes to form a metal vertical bit line 225. The tungsten is deposited by using any suitable deposition processes, such as chemical vapor deposition (CVP) reaction with tungsten hexafluoride (WF6) plus hydrogen (H2) and silane (SiH4). The metal bit lines 225 reduces the bit line resistance compared with the other embodiment using semiconductor bit line such as bit line 205 shown in FIG. 4C.

Figure 8G:
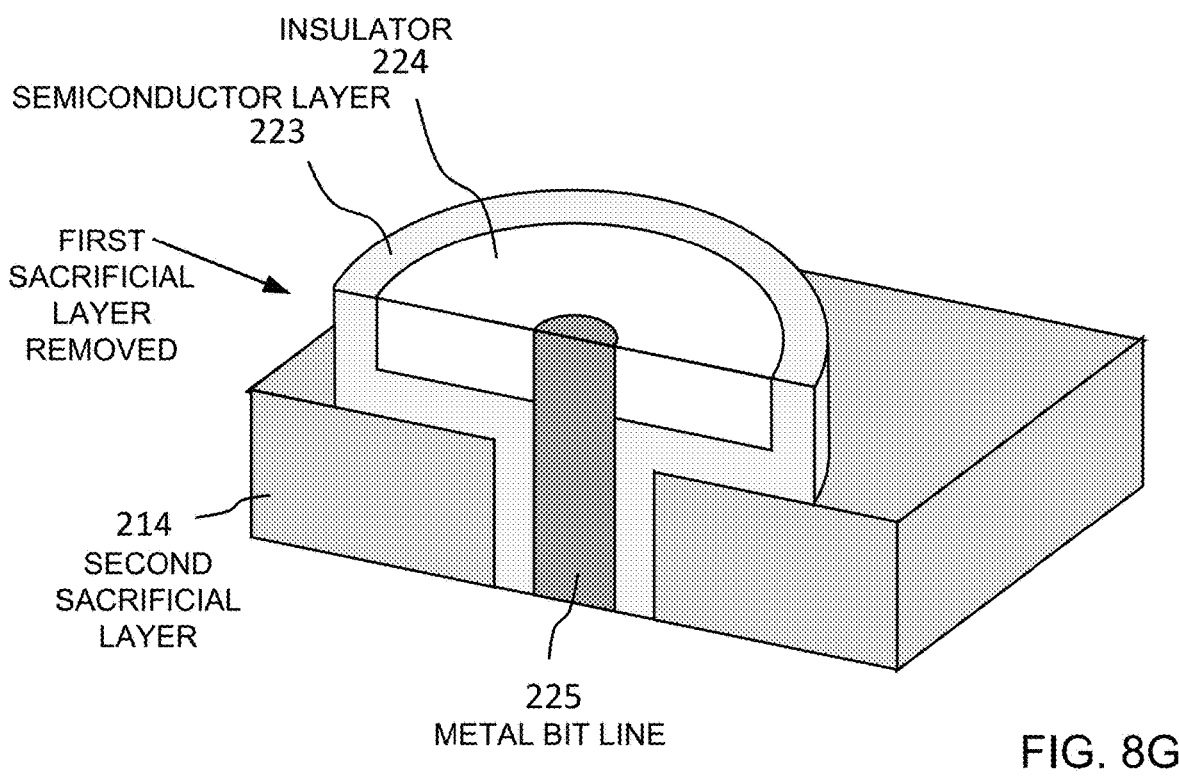

FIG. 8G shows how the first sacrificial layer 213 is selectively removed by using an isotropic etching process, such as wet etching. If the first sacrificial layer 213 is formed of silicon oxide (SiO2), it is etched by using buffered hydrofluoric acid (HF) with ammonium acid (NH4F) or a mixture of hydrofluoric acid (HF) and nitric acid (HNO3).

Figure 8H:
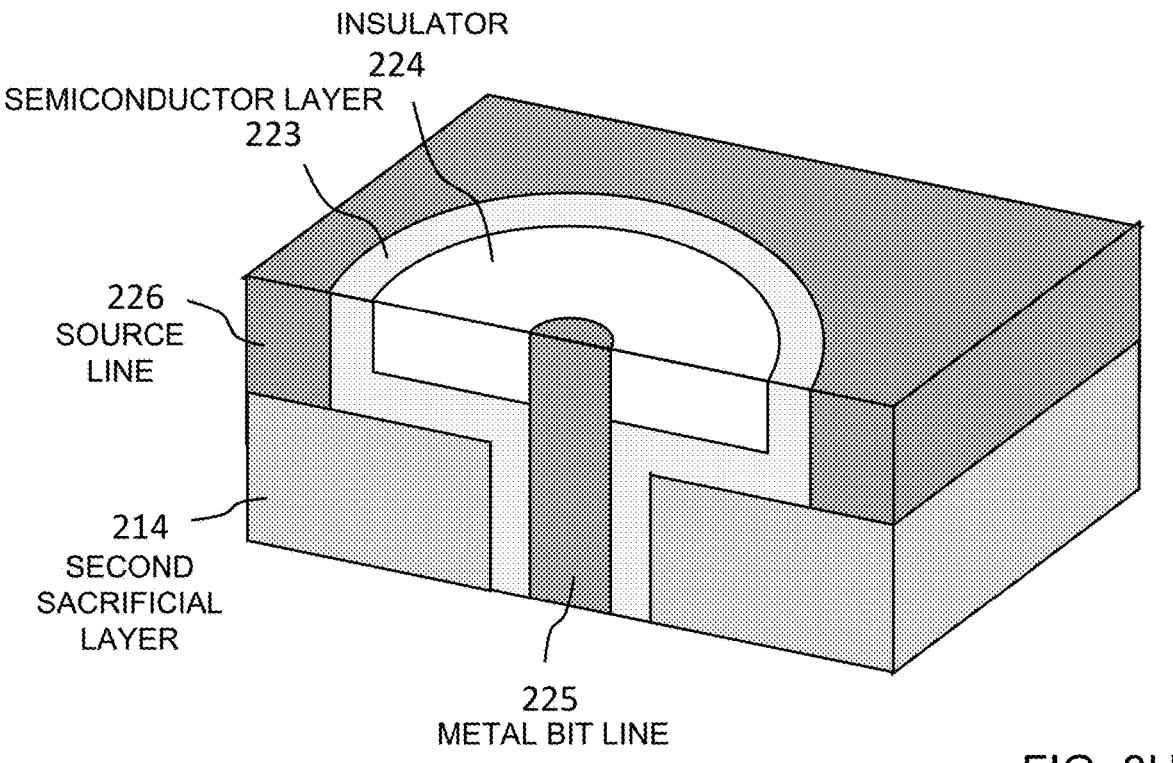

FIG. 8H shows how a high melting point metal, such as tungsten (W) or heavily doped polysilicon is deposited to fill the space that were previously occupied by the first sacrificial layer 213 to form a source lines 226. The tungsten is deposited by using any suitable deposition processes, such as chemical vapor deposition (CVP) reaction with tungsten hexafluoride (WF6) plus hydrogen (H2) and silane (SiH4).

Figure 8I:
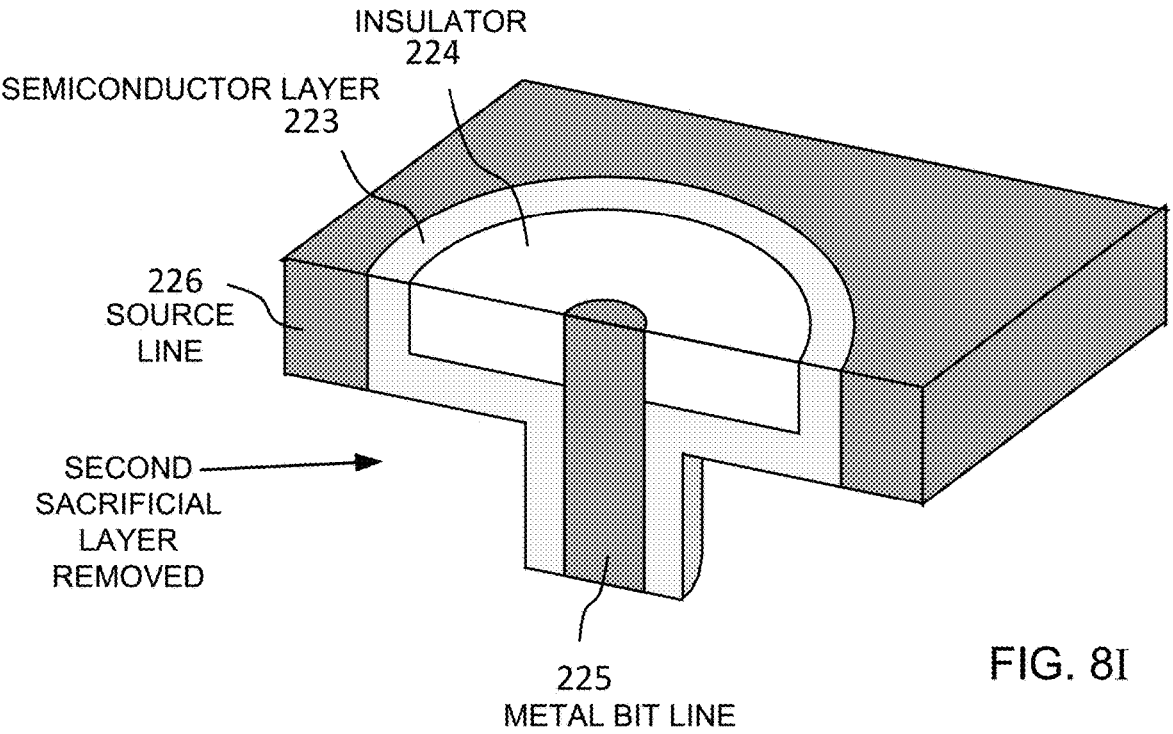

FIG. 8I shows how the second sacrificial layer 214 is selectively removed by using an isotropic etching process, such as wet etching.

Figure 8J:
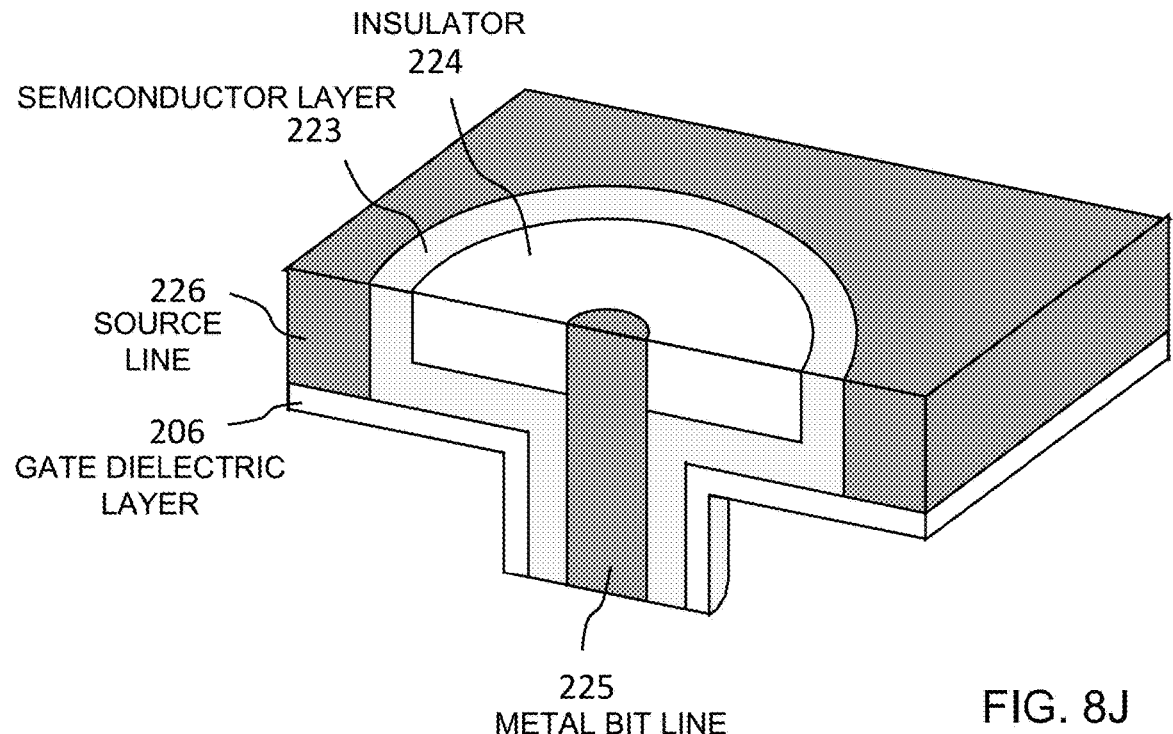

FIG. 8J show how a gate dielectric layer 206 is formed on the exposed surfaces of the source line 226 and semiconductor layer 223 and within the space that was previously occupied by the second sacrificial layer 214.

Figure 8K:
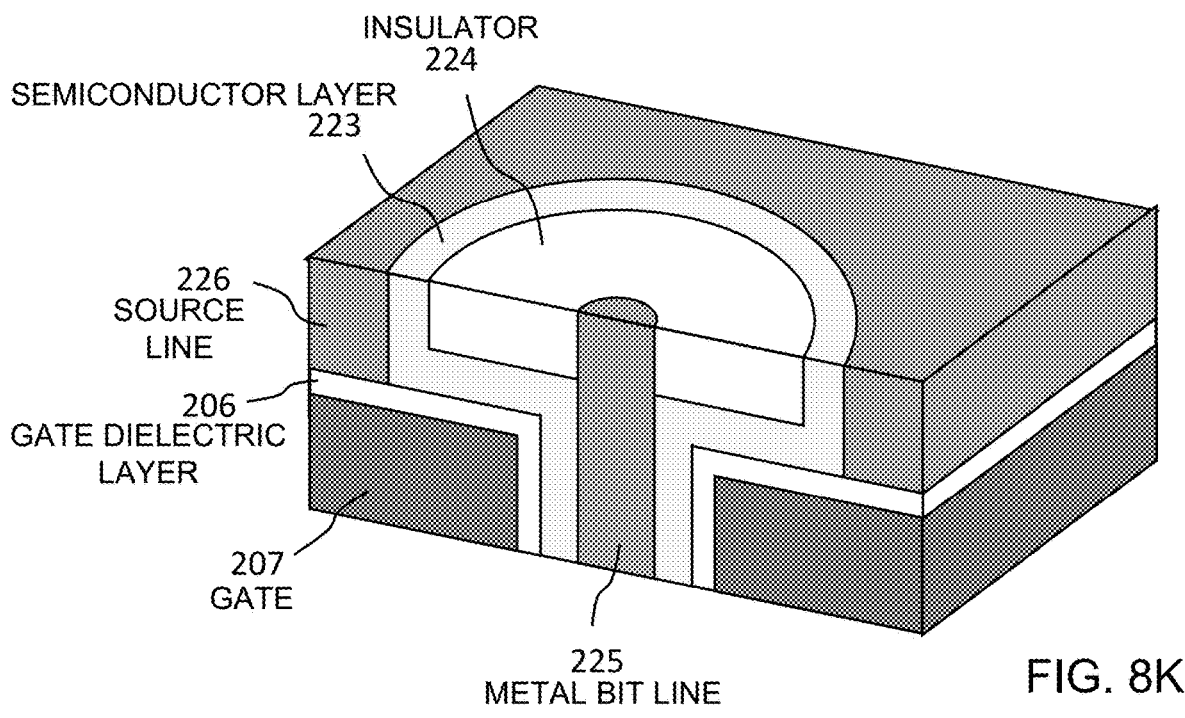

FIG. 8K shows how the space defined by the dielectric layer 206 is filled with metal or heavily doped polysilicon to form gate 207. The process steps shown in FIGS. 8I-K are as the same as the steps described with reference to FIGS. 4D-F. The reader is referred to the description of FIGS. 4D-F for the detailed description of these process steps. As a result, the floating-body cell structure using a thin-film transistor is formed as shown in FIG. 8K.

Figure 8L:
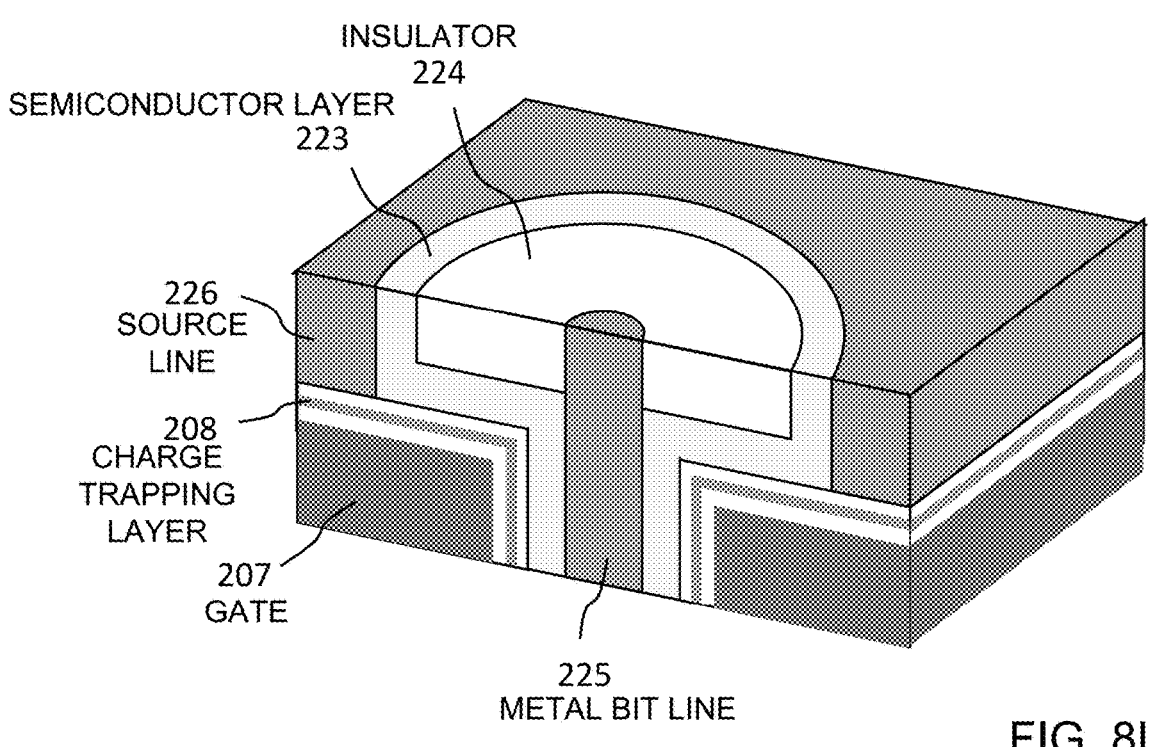
FIG. 8L shows another embodiment for forming a cell structure.

FIG. 8L shows another embodiment for forming a cell structure. After the process step shown in FIG. 8I is performed, the process steps shown in FIGS. 4G-H are performed to form a charge-trapping layer 208 and gate 207 as illustrated in FIG. 8L. The reader is referred to the description of FIGS. 4G-H for the detailed description for forming the charge-trapping layer 208 and gate 207. This embodiment forms a NOR-type flash memory cell based on a thin-film transistor as shown in FIG. 8L.

In another embodiment, the charge-trapping layer 208 shown in FIG. 8L is replaced with a non-volatile memory gate dielectric layer formed using the materials described with reference to FIGS. 2C-D to form the cell embodiments of FRAM, RRAM, MRAM, or PCM. The reader is referred to the description of FIGS. 2C-D for the detailed descriptions for forming the non-volatile memory gate dielectric layers 170a and 170b.

Figures 9A, 9B:
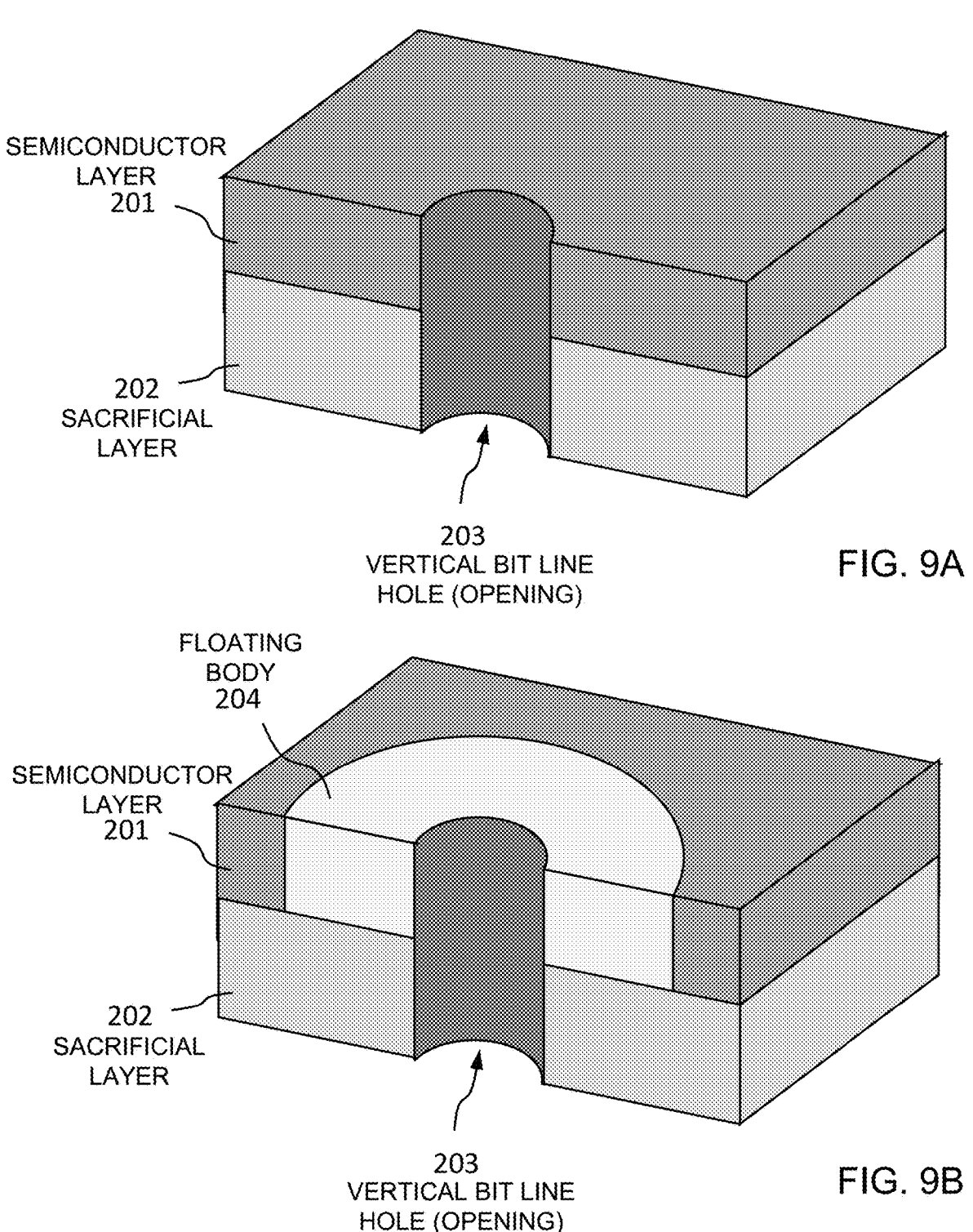
FIGS. 9A-J shows another embodiment of brief process steps to form the cell structure shown in FIGS. 1E-F according to the invention.
Figures 9C, 9D:
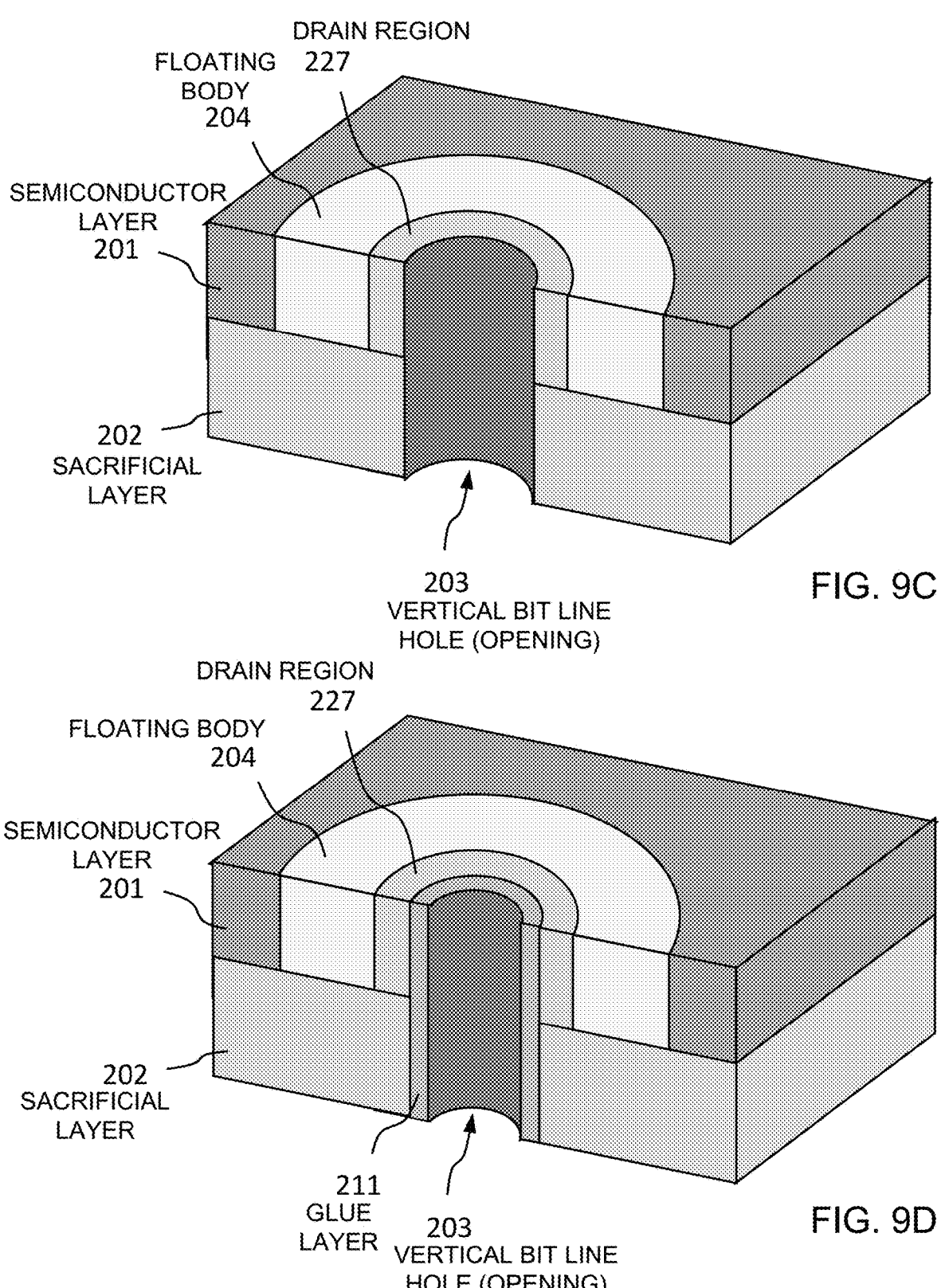
Figure 9E:
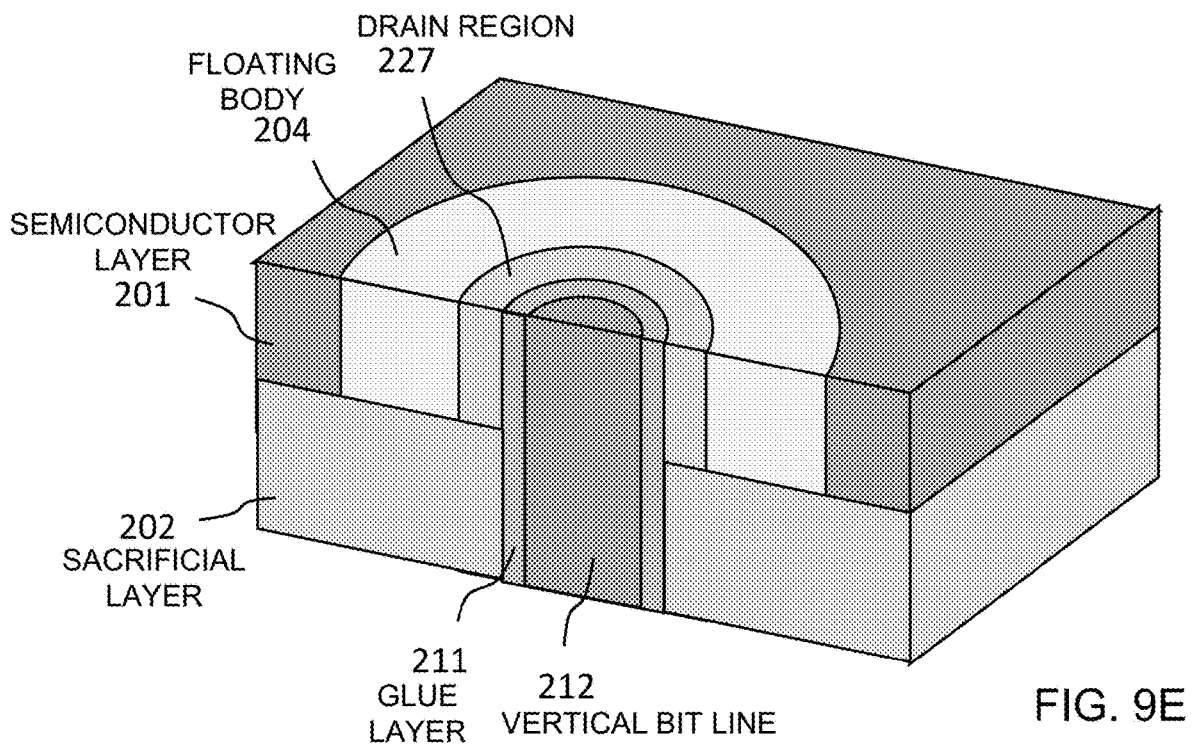
Figure 9F:
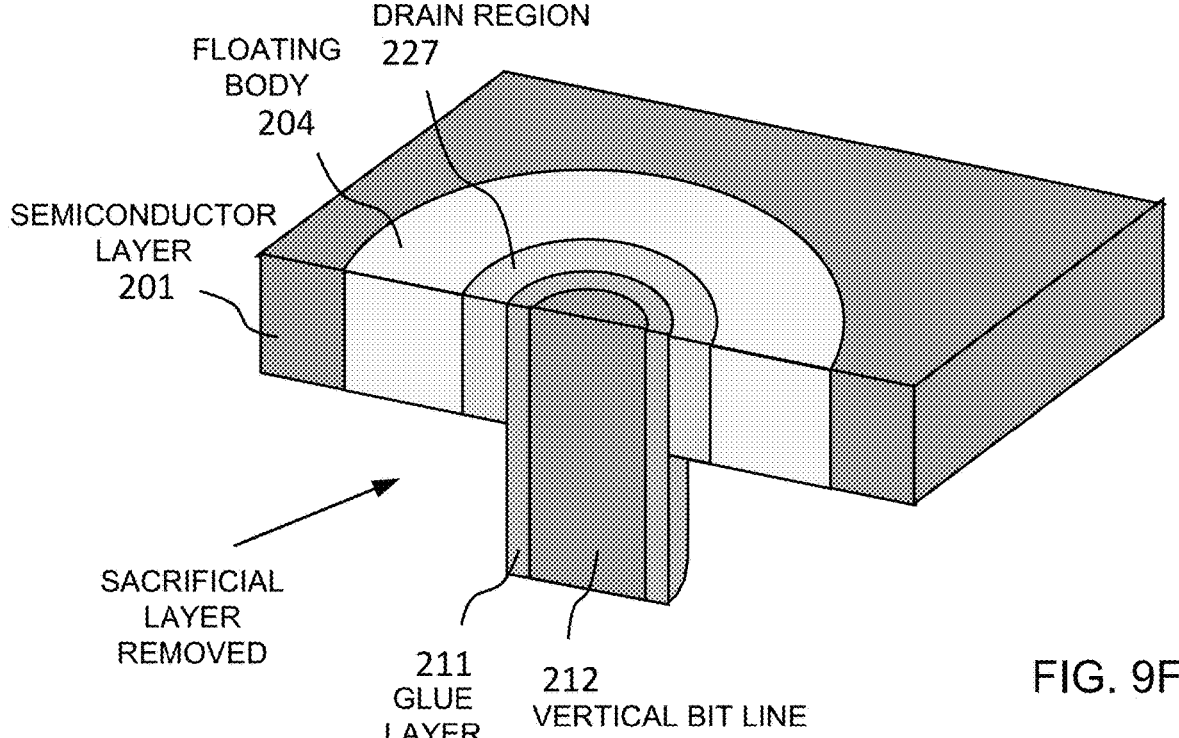
Figure 9G:
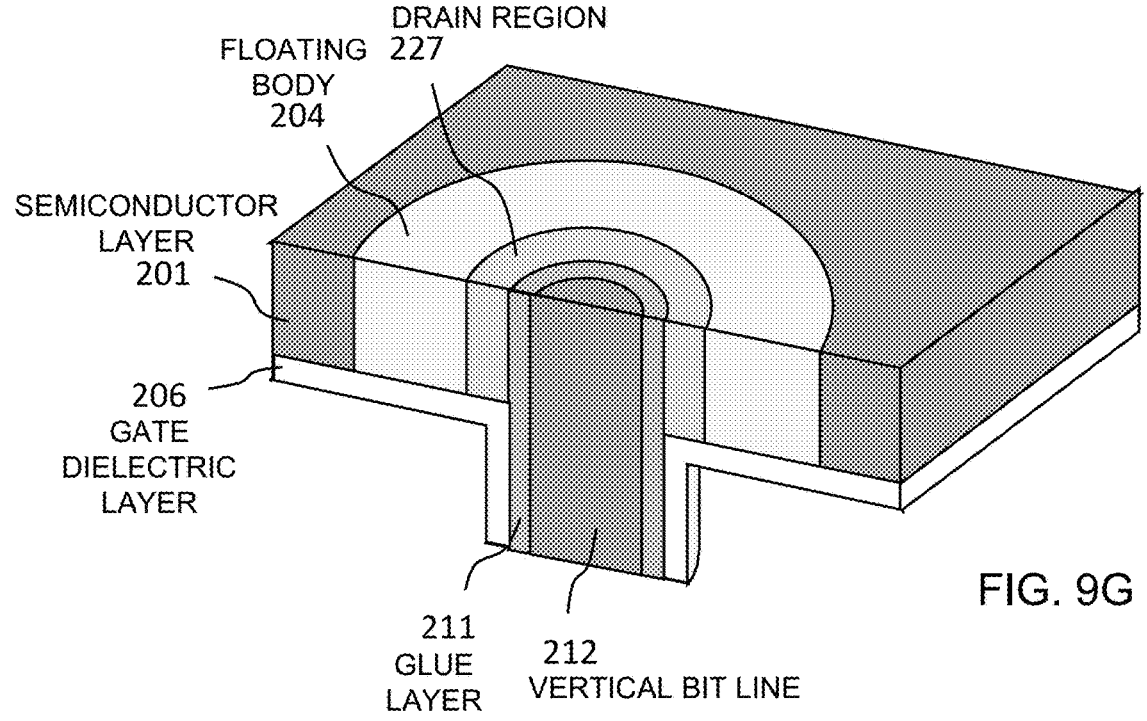
Figure 9H:
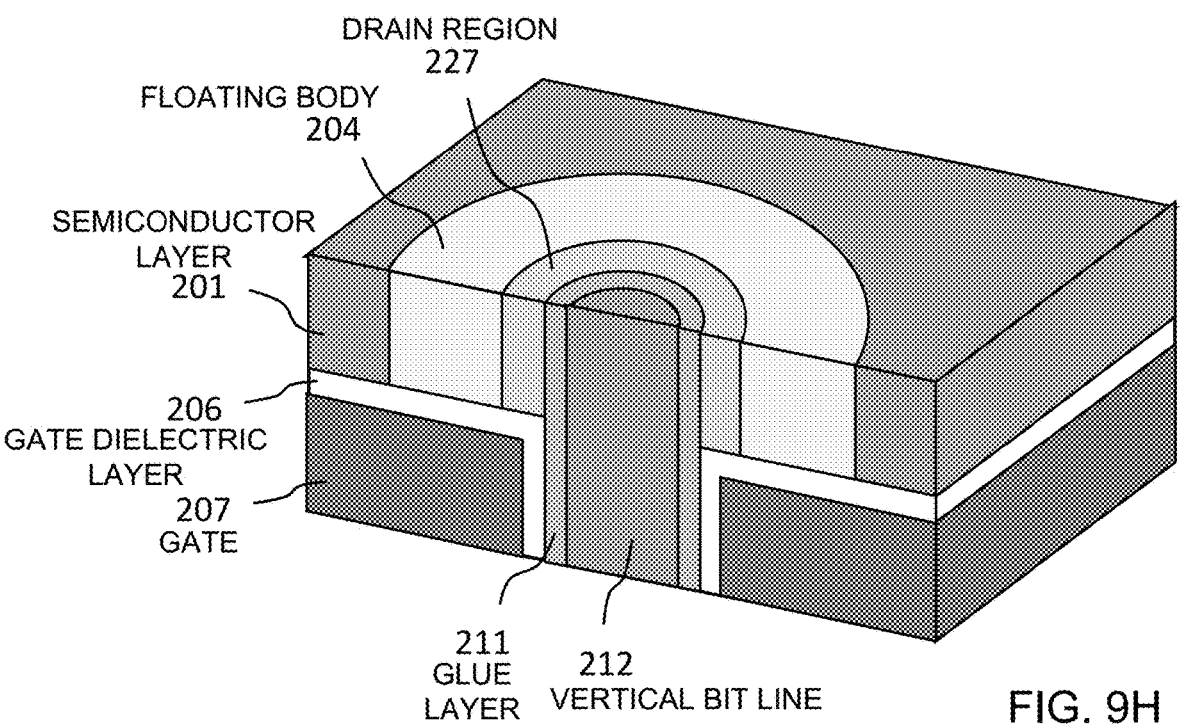
Figure 9I:
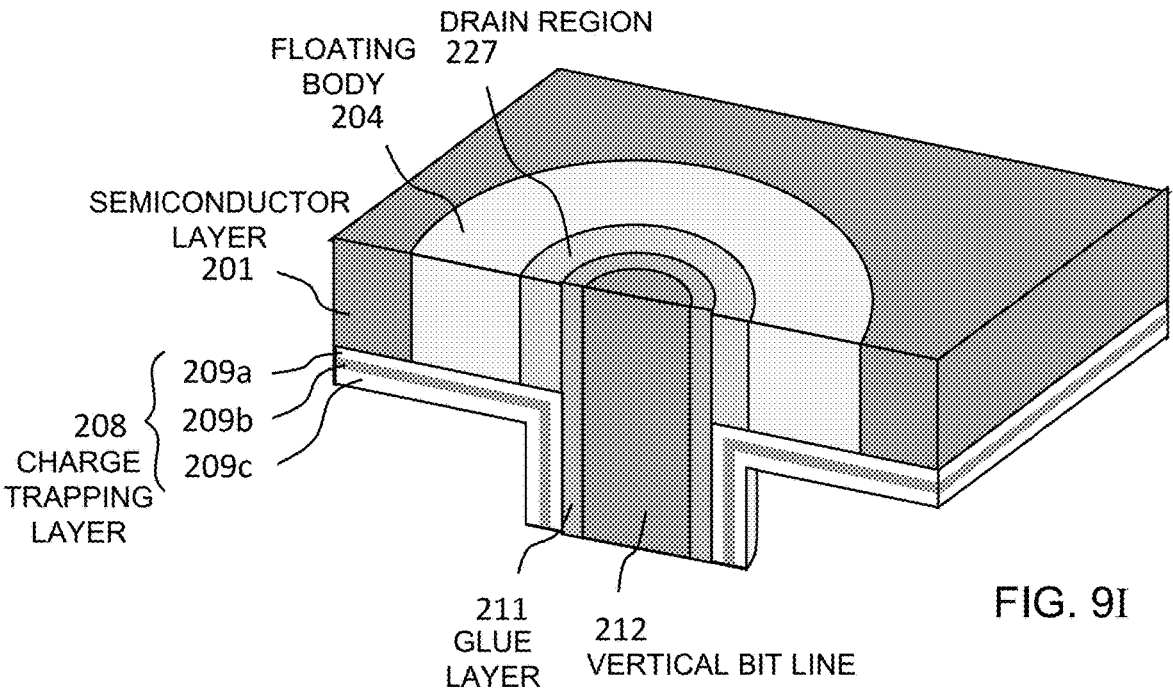

FIGS. 9A-J show another embodiment of brief process steps to form the cell structure shown in FIGS. 1E-F according to the invention. This embodiment is similar to the embodiment shown in FIGS. 5A-J except that a drain region 227 shown in FIG. 9C is formed by using a different process than the process used to form the semiconductor layer 210 shown in FIG. 5C.

FIGS. 9A-B show the formation of the semiconductor layer 201, sacrificial layer 202, vertical bit line hole 203 and floating body 204, which are formed in accordance with the process steps shown and described with reference to FIGS. 5A-B.

FIG. 9C shows how the drain region 227 is formed by using plasma doping (PLAD) or any other suitable doping processes, performed through the vertical bit line holes 203, to dope the floating body 204 with the opposite type of heavy dopants as used in the floating body 204. For NMOS cells, phosphine (PH3) or Arsine (AsH3) plasma is used to implant phosphorus or Arsenic ions into the P– type floating body 204 to reverse the doping to form an N+ drain region 227. For PMOS cells, diborane and hydrogen (B2H6/H2)

plasma are used to implant boron ions into the N– type floating body 204 to reverse the doping to form a P+ drain region 227.

FIGS. 9D-J show how various cell structures are formed using the same processes as shown and described with reference to FIGS. 5D-J. The reader is referred to the description of FIGS. 5D-J for the detailed description of the process steps performed and shown in FIGS. 9D-J.

In another embodiment, the process step shown in FIG. 9C for forming the drain region 227 can be applied to all the other embodiments shown in FIGS. 4A-8L.

Figure 9J:
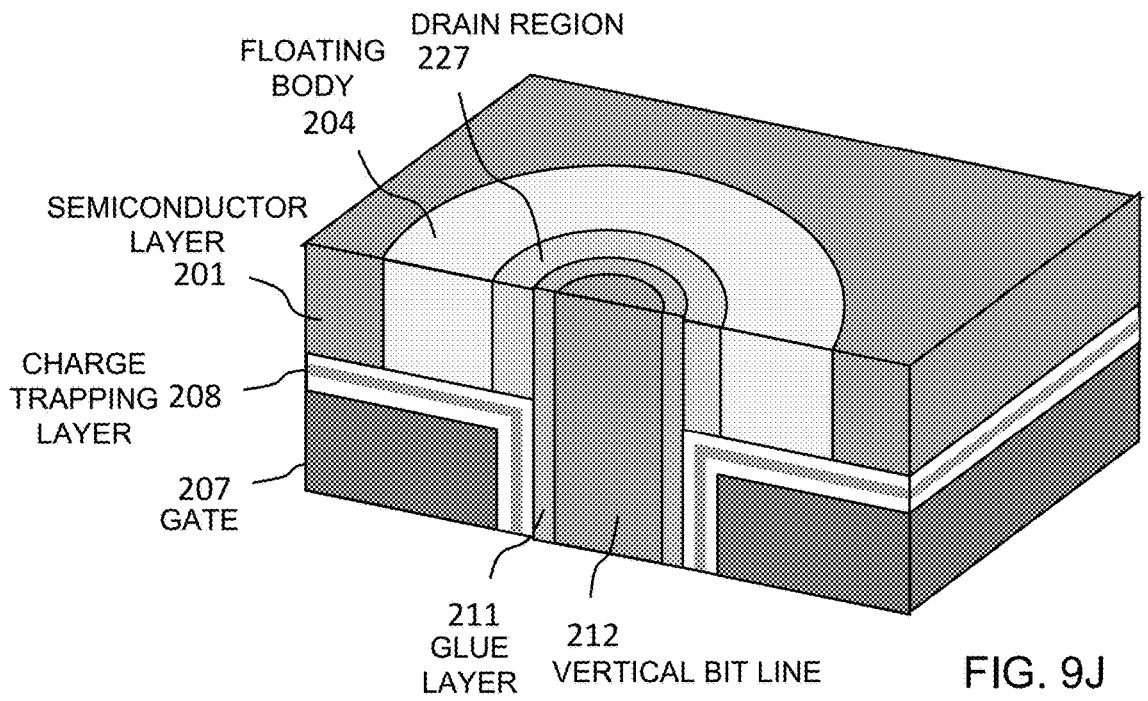

In another embodiment, the charge-trapping layer 208 shown in FIG. 9J is replaced with a non-volatile memory gate dielectric layer using the materials and process steps described in FIG. 2C-D to form the cell embodiments of FRAM, RRAM, MRAM, or PCM. The reader is referred to FIG. 2C-D for the detailed descriptions for forming the non-volatile memory gate dielectric layers 170a and 170b.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A memory cell structure, formed by a process of:

alternately depositing multiple semiconductor layers and insulating layers to form a stack;

forming a vertical bit line opening through the stack using a deep trench etching process;

isotropically doping through the vertical bit line opening to form floating-body regions in the semiconductor layers, the floating-body regions having a conductivity type opposite to that of the semiconductor layers and defining internal side surfaces that surround the vertical bit-line opening;

depositing bit line material in the vertical bit line opening such that the bit line material contacts the internal side surfaces of the floating-body regions;

removing the insulating layers to expose surfaces of the semiconductor layers, the floating-body regions, and the bit line material, wherein the floating-body regions are isolated from one another;

forming a gate dielectric layer on the exposed surfaces of the semiconductor layers, the floating-body regions, and the bit line material; and depositing gate material on the gate dielectric layer.

2. The memory cell structure of claim 1, wherein the isotropically doping process comprises one of plasma doping (PLAD), gas-phase doping, collisional plasma doping, or plasma immersion ion implantation (PIII).

3. The memory cell structure of claim 1, wherein the insulating layers comprise oxide or nitride layers.

4. The memory cell structure of claim 1, wherein the semiconductor layers comprise P-type or N-type doping.

5. The memory cell structure of claim 1, wherein the bit-line material comprises a conductor selected from metal or heavily-doped polysilicon, and the gate material comprises a conductor selected from metal or heavily-doped polysilicon.

6. The memory cell structure of claim 1, wherein the removal of the insulating layers is performed using an isotropic wet-etching process.

7. The memory cell structure of claim 1, wherein the gate-dielectric layer comprises a thin oxide layer or a high-K material layer selected from hafnium oxide ($HfO_2$), zirconium oxide ($ZrO_2$), or titanium oxide ($TiO_2$).

8. The memory cell structure of claim 1, wherein the gate-dielectric layer comprises a charge-trapping stack selected from oxide-nitride-oxide (ONO), oxide-nitride (ON), or oxide-nitride-oxide-nitride-oxide (ONONO).

9. The memory cell structure of claim 1, wherein the gate-dielectric layer comprises a material selected from:

(a) a ferroelectric layer comprising lead zirconate titanate (PZT), hafnium oxide ($HfO_2$) in orthorhombic crystal phase, or hafnium-zirconium oxide ($HfZrO_2$);

(b) an adjustable resistive layer comprising hafnium oxide ($HfO_x$), titanium oxide ($TiO_x$), or tantalum oxide ($TaO_x$);

(c) a phase-change layer comprising germanium-antimony-tellurium alloy ($Ge_2Sb_2Te_5$) or chalcogenide glass; or (d) a ferromagnetic layer comprising iron-nickel (NiFe) or iron-cobalt (CoFe) alloys.

* * * * *